(12) United States Patent
Kitagawa et al.

(10) Patent No.: US 8,879,307 B2
(45) Date of Patent: Nov. 4, 2014

(54) MAGNETORESISTIVE DEVICE AND NONVOLATILE MEMORY WITH THE SAME

(75) Inventors: Eiji Kitagawa, Yokohama (JP); Naoharu Shimomura, Tokyo (JP); Hiroaki Yoda, Seongnam-Si (KR); Junichi Ito, Yokohama (JP); Minoru Amano, Sagamihara (JP); Chikayoshi Kamata, Kawasaki (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 13/424,769

(22) Filed: Mar. 20, 2012

(65) Prior Publication Data

US 2013/0028011 A1    Jan. 31, 2013

(30) Foreign Application Priority Data

Jul. 29, 2011    (JP) ................. 2011-167157

(51) Int. Cl.
*G11C 11/00* (2006.01)
*G11C 11/16* (2006.01)
*G11C 19/08* (2006.01)

(52) U.S. Cl.
CPC .......... *G11C 11/161* (2013.01); *G11C 19/0808* (2013.01)
USPC ............... 365/158; 365/173; 365/50; 365/55; 365/66

(58) Field of Classification Search
CPC ................. G11C 11/15; G11C 11/16
USPC ...................... 365/8, 33, 50, 55, 66, 158, 173
See application file for complete search history.

(56) References Cited

U.S. PATENT DOCUMENTS 8,503,222 B2 * 8/2013 Suzuki et al. ................. 365/158
2013/0250666 A1    9/2013 Shimomura

FOREIGN PATENT DOCUMENTS

| JP | 2004-288844 | 10/2004 |
| JP | 2005-116888 | 4/2005 |
| JP | 2008-171862 | 7/2008 |
| WO | WO 2009/054180 A1 | 4/2009 |

* cited by examiner

*Primary Examiner* — Tha-O H Bui
(74) *Attorney, Agent, or Firm* — Oblon, Spivak, McClelland, Maier & Neustadt, L.L.P.

(57) ABSTRACT

A magnetoresistive device of an embodiment includes: first and second devices each including, a first magnetic layer having a changeable magnetization perpendicular to a film plane, a second magnetic layer having a fixed and perpendicular magnetization, and a nonmagnetic layer interposed between the first and second magnetic layers, the first and second devices being disposed in parallel on a first face of an interconnect layer; and a TMR device including a third magnetic layer having perpendicular magnetic anisotropy and having a changeable magnetization, a fourth magnetic layer having a fixed magnetization parallel to a film plane, and a tunnel barrier layer interposed between the third and fourth magnetic layers, the TMR device being disposed on a second face of the interconnect layer, and the third magnetic layer being magnetostatically coupled to the first magnetic layers of the first and second devices.

22 Claims, 34 Drawing Sheets

| READ TMR MAGNETIZATION DIRECTION | PERPENDICULAR | PERPENDICULAR | IN-PLANE | IN-PLANE |
|---|---|---|---|---|
| WRITE GMR MAGNETIZATION DIRECTION | PERPENDICULAR | IN-PLANE | PERPENDICULAR | IN-PLANE |
| IMPROVEMENT IN READ MR | ○ | ○ | ○ | ○ |
| DECREASE IN WRITE CURRENT | ○ | × | ○ | × |

FIG. 5

| READ TMR MAGNETIZATION DIRECTION | PERPENDICULAR | PERPENDICULAR | IN-PLANE | IN-PLANE |
|---|---|---|---|---|
| WRITE TMR MAGNETIZATION DIRECTION | PERPENDICULAR | IN-PLANE | PERPENDICULAR | IN-PLANE |
| IMPROVEMENT IN READ MR | ○ | ○ | ○ | ○ |
| DECREASE IN WRITE CURRENT | ○ | × | ○ | × |

FIG. 6

MAGNETORESISTIVE DEVICE AND NONVOLATILE MEMORY WITH THE SAME

CROSS-REFERENCE TO RELATED APPLICATION

This application is based upon and claims the benefit of priority from prior Japanese Patent Application No. 2011-167157 filed on Jul. 29, 2011 in Japan, the entire contents of which are incorporated herein by reference.

FIELD

Embodiments described herein relate generally to magnetoresistive devices and magnetic memories.

BACKGROUND

In recent years, various kinds of electronics and information technology products such as portable telephones and personal computers have rapidly permeated into everyday life. On the other hand, to solve environmental issues and energy issues, electronics products are also expected to have high energy efficiencies. The center of such electronics products is formed by semiconductor integrated circuits having logical devices and storage devices integrated on semiconductor substrates, and the improvements of the performance, functions, and integrations achieved by miniaturization of those devices have supported the growth of electronics industry for decades. However, in view of the recent progress in miniaturization affected by the rapid increase in production costs and of requests for lower power consumptions, making a new breakthrough is critical.

As a technology to make a breakthrough, "nonvolatility" is described. When the power supply to a SRAM (Static Random Access Memory) mounted as a storage device on a semiconductor integrated circuit is switched off, stored information is lost. Therefore, current needs to be flowed to maintain data. On the other hand, nonvolatility means a function not to lose information even when the power supply is switched off. If a SRAM can be equipped with a nonvolatile function, the power supply could be switched off after information storage until the next information reading. Accordingly, power consumptions would be dramatically lowered.

To lower power consumptions, there are large expectations for nonvolatile memory development, and such development is accelerated around the world. Examples of nonvolatile memories include MRAM (Magnetic Random Access Memory), FeRAM (Ferroelectric Random Access Memory), PRAM (Phase change Random Access Memory), and ReRAM (Resistive Random Access Memory). Of those nonvolatile memories, only MRAM can be rewritten an infinite number of times, and characteristically has high writing and reading speeds. Accordingly, MRAM has a potential to realize nonvolatile working memory.

Among MRAMs, attention is drawn to MTJ (Magnetic Tunnel Junction) devices utilizing the spin-injection magnetization switching method and perpendicular magnetization film, because the write current of such MTJ devices is much lower than that of existing MRAMs. However, where spin-injection MRAM that has been developed as an alternative to nonvolatile SRAM and uses perpendicular magnetization film is considered, the writing speed poses a grave problem. According to the spin-injection magnetization switching method, when the writing time is 1 to 10 nanoseconds or shorter, the writing speed exceeds the magnetization switching speed, and accordingly, the write current rapidly increases. The increase in the write current poses grave problems, causing breaking of the tunnel barrier layer of each MTJ device and hindering high-speed operations.

BRIEF DESCRIPTION OF THE DRAWINGS

FIG. 5 shows the relationships among the magnetization direction, the MR at the time of reading, and the write current of the magnetoresistive device according to the first or third embodiment;

FIG. 6 shows the relationships among the magnetization direction, the MR at the time of reading, and the write current of the magnetoresistive device according to the second or fourth embodiment;

DETAILED DESCRIPTION

Figure 1:
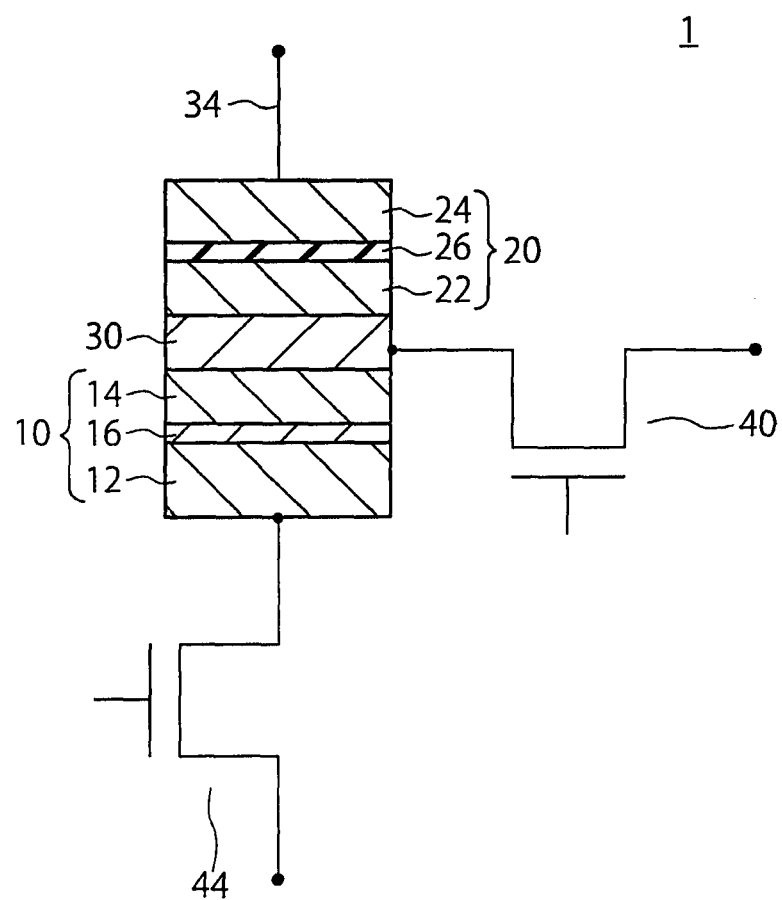
FIG. 1 is a schematic view of a magnetoresistive device according to a first embodiment.

A magnetoresistive device according to an embodiment includes: an interconnect layer having a first face and a second face opposed to the first face; first and second devices each including a first magnetic layer having a magnetization that can be changed by spin transfer torque writing and is perpendicular to a film plane, a second magnetic layer having a fixed magnetization perpendicular to a film plane, and a nonmagnetic layer interposed between the first magnetic layer and the second magnetic layer, the first and second devices being disposed in parallel on the first face of the interconnect layer, and a face of the first magnetic layer of each of the first and second devices remoter from the nonmagnetic layer facing the first face of the interconnect layer; and a TMR device including a third magnetic layer having perpendicular magnetic anisotropy and having a changeable magnetization, a fourth magnetic layer having a fixed magnetization parallel to a film plane, and a tunnel barrier layer interposed between the third magnetic layer and the fourth magnetic layer, the TMR device being disposed on the second face of the interconnect layer, a face of the third magnetic layer remoter from the tunnel barrier layer facing the second face of the interconnect layer, and the third magnetic layer being magnetostatically coupled to the first magnetic layers of the first and second devices.

The following is a description of embodiments, with reference to the accompanying drawings. In the following description, like components having like functions and structures are denoted by like reference numerals, and repeated explanation will be made only where necessary.

First Embodiment

FIG. 1 shows the basic structure of a magnetoresistive device according to a first embodiment. The magnetoresistive device 1 of the first embodiment includes a GMR (Giant Magneto Resistive) device 10, a TMR (Tunneling Magneto Resistive) device 20, a first select transistor 40, and a second select transistor 44. The GMR device 10 includes a magnetic layer (also referred to as a fixed layer) 12 having a fixed magnetization direction, a magnetic layer (also referred to as a free layer) 14 having a variable magnetization direction, and a nonmagnetic layer 16 interposed between the magnetic layer 12 and the magnetic layer 14. Here, the fixed magnetization direction means a magnetization direction that does not vary when a write current is flowed between the magnetic layer 12 and the magnetic layer 14. The variable magnetization direction means a magnetization direction that varies when a write current is flowed between the magnetic layer 12 and the magnetic layer 14.

The TMR device 20 includes a magnetic layer (also referred to as a recording layer) 22 having a variable magnetization direction, a magnetic layer (also referred to as a fixed layer) 24 having a fixed magnetization direction, and a tunnel barrier layer (also referred to as a tunnel barrier) 26 interposed between the magnetic layer 22 and the magnetic layer 24. Here, the fixed magnetization direction means a magnetization direction that does not vary when a write current is flowed between the magnetic layer 22 and the magnetic layer 24. The variable magnetization direction means a magnetization direction that varies when a write current is flowed between the magnetic layer 22 and the magnetic layer 24.

In FIG. 1, the free layer 14 of the GMR device 10 and the recording layer 22 of the TMR device 20 are positioned to face each other. A first interconnect layer 30 is interposed between the free layer 14 and the recording layer 22. The GMR device 10 and the TMR device 20 are positioned on the opposite sides of the first interconnect layer 30 from each other in FIG. 1. However, the GMR device 10 and the TMR device 20 can be positioned on the same side of the first interconnect layer 30.

The first interconnect layer 30 is connected to either the source or the drain of the first select transistor 40. The fixed layer 12 of the GMR device 10 is connected to either the source or the drain of the second select transistor 44. Further, a second interconnect 34 is connected to the fixed layer 24 of the TMR device 20.

In a modification of the first embodiment, one magnetic layer (also referred to as a recording layer) can function as both the free layer 14 of the GMR device 10 and the recording layer 22 of the TMR device 20. In this modification, the common recording layer is connected to a third interconnect layer (not shown), and either the source or the drain of the first select transistor 40 is connected to the third interconnect layer.

Writing Method

Next, a writing method in the magnetoresistive device 1 of the first embodiment having the above described structure Is described.

In a case where the magnetization directions of the fixed layer 12 and the free layer 14 of the GMR device 10 are in an antiparallel state (are the opposite from each other), writing is performed by putting both the first select transistor 40 and the second select transistor 44 into an activated state (an ON state), and flowing current from the first select transistor 40 to the first interconnect layer 30, the GMR device 10, and the second select transistor 44. In this manner, spins are injected into the free layer 14 from the fixed layer 12 via the nonmagnetic layer 16 of the GMR device 10. The magnetization direction of the spin-injected free layer 14 changes from the antiparallel state to a parallel state with respect to the magnetization direction of the fixed layer 12. Further, by using a magnetic field leaking from the free layer 14 having its magnetization direction changed, magnetostatic coupling is caused between the free layer 14 of the GMR device 10 and the recording layer 22 of the TMR device 20, to change the magnetization direction of the recording layer 22. Magnetostatic coupling occurs so that the magnetization directions of the free layer 14 of the GMR device 10 and the recording layer 22 of the TMR device 20 are put into a parallel state, and the recording layer 22 enters a first magnetized state.

In a case where the magnetization directions of the fixed layer 12 and the free layer 14 of the GMR device 10 are in a parallel state (are the same as each other), writing is performed by flowing current from the second select transistor 44 to the GMR device 10, the first interconnect layer 30, and the first select transistor 40. As a result, spins are injected into the fixed layer 12 from the free layer 14 via the nonmagnetic layer 16 of the GMR device 10. The magnetization direction of the free layer 14 is changed from the parallel state to an antiparallel state by the spins accumulated in the free layer 14. By using a magnetic field leaking from the free layer 14 having its magnetization direction changed, magnetostatic coupling is caused so that the magnetization directions of the free layer 14 of the GMR device 10 and the recording layer 22 of the TMR device 20 are put into a parallel state. Because of the magnetostatic coupling, the magnetization direction of the recording layer 22 is changed, and the recording layer 22 enters a second magnetized state. Information is written through the first magnetized state and the second magnetized state.

In a case where the magnetization direction of the fixed layer 12 of the GMR device 10 designed so that the common magnetic layer (the recording layer) functions as the free layer 14 of the GMR device 10 and the recording layer 22 of the TMR device 20 as in the modification of the first embodiment is antiparallel to the magnetization direction of the common recording layer, writing is performed by putting the first select transistor 40 and the second select transistor 44 into an activated state, and flowing current from the first select transistor 40 to the third interconnect layer, the GMR device 10, and the second select transistor 44. As a result, spins are injected into the common recording layer from the fixed layer 12 via the nonmagnetic layer 16 of the GMR device 10. The magnetization direction of the spin-injected common recording layer is changed from the antiparallel state to a parallel state with respect to the magnetization direction of the fixed layer 12, and the common recording layer enters the first magnetized state.

In a case where the magnetization directions of the fixed layer 12 of the GMR device 10 and the common magnetic layer (the recording layer) 14 are in a parallel state, on the other hand, writing is performed by flowing current from the second select transistor 44 to the GMR device 10, the third interconnect layer, and the first select transistor 40. As a result, spins are injected into the fixed layer 12 from the recording layer via the nonmagnetic layer 16 of the GMR device 10. The magnetization direction of the recording layer is changed from the parallel state to an antiparallel state by the spins accumulated in the recording layer, and the recording layer enters the second magnetized state.

As described above, by applying bidirectional current to the path connecting the first select transistor 40 and the second select transistor 44, the magnetization direction of the common recording layer is put into the first magnetized state or the second magnetized state. In this manner, writing is performed.

Reading Method

Next, a reading method in the first embodiment is described.

Reading is performed by putting either the first select transistor 40 or the second select transistor 44 into an activated state, and flowing current among the activated select transistor, the TMR device 20, and the second interconnect 34. For example, in a case where the first select transistor 40 is put into an activated state, or where reading is performed among the first interconnect layer 30, the TMR device 20, and the second interconnect 34 from the first select transistor 40, the magnetization direction of the fixed layer 12 of the GMR device 10 is preferably made antiparallel to the magnetization direction of the fixed layer 24 of the TMR device 20. By making those magnetization directions antiparallel to each other, the magnetic field leaking from the fixed layer 24 of the TMR device 20 and the magnetic field leaking from the fixed layer 12 of the GMR device 10 cancel each other at the location of the recording layer 22, and the shift magnetic field generated in the recording layer 22 by the magnetic field leaking from each fixed layer of the TMR device 20 and the GMR device 10 can be weakened. In the modification of the first embodiment, reading is performed among the third interconnect layer, the TMR device 20, and the second interconnect 34 from the first select transistor 40 in this case.

In a case where the second select transistor 44 is put into an activated state, or where reading is performed among the GMR device 10, the first interconnect layer 30, the TMR device 20, and the second interconnect 34 from the second select transistor 44, the magnetization direction of the fixed layer 12 of the GMR device 10 is preferably made parallel to the magnetization direction of the fixed layer 24 of the TMR device 20. By making the magnetization directions of the respective fixed layers of the GMR device 10 and the TMR device 20 parallel to each other, the spin torque injected (or accumulated) from the fixed layer 12 of the GMR device 10 and the spin torque accumulated (or injected) from the fixed layer 24 of the TMR device 20 cancel each other, and disturbance due to a read current can be restrained. In the modification of the first embodiment, reading is performed among the GMR device 10, the TMR device 20, and the second interconnect 34 from the second select transistor 44 in this case.

It is preferable to select a material that satisfies the relationship, $\alpha_2 > \alpha_1$, between the damping factor $\alpha_1$ of the free layer 14 of the GMR device 10 and the damping factor $\alpha_2$ of the recording layer 22 of the TMR device 20. Since spin transfer torque writing is performed on the free layer 14 of the GMR device 10, the damping factor $\alpha_1$ is preferably small to reduce the write current. Meanwhile, writing is performed on the TMR device 20 by the magnetic field leaking from the free layer 14 of the GMR device 10. To reduce writing errors caused in the recording layer 22 by the read current, the damping factor $\alpha_2$ is preferably made larger, and a material that satisfies $\alpha_2 > \alpha_1$ is preferably selected. For example, as the material of the recording layer 22, CoPt, FePt, or a material formed by combining a transition metal with a lanthanoid material, or a material containing many 5d electrons, such as SmCo, NdCo, TbCoFe, or DyCoFe, is used. In this manner, the damping factor $\alpha_2$ can be made larger. Meanwhile, as the material of the free layer 14, a material that contains a 3d to 4d transition metal such as CoPd, MnGa, MnAl, MnSb, or CoFeB, but does not contain 5d electrons and 4f electrons, is used. In this manner, the damping factor $\alpha_1$ can be made smaller.

Alternatively, where $t_1$ represents the film thickness of the free layer 14 of the GMR device 10 and $t_2$ represents the film thickness of the recording layer 22 of the TMR device 20, the relationship, $t_2 > t_1$, can be satisfied.

In a case where a common magnetic layer (a recording layer) functions as the free layer 14 of the GMR device 10 and the recording layer 22 of the TMR device 20 as in the modification of the first embodiment, the electric resistance $R_1$ of the GMR device 10 and the electric resistance $R_2$ of the TMR device 20 to be used for reading are made to satisfy the condition, $R_1 < R_2$. With this arrangement, the amount of current at the time of writing can be increased, and high-speed writing can be performed.

In the first embodiment and its modification, a GMR device is used for writing. Since the resistance of a GMR device is low, the voltage to be applied at the time of information writing can be lowered, and writing can be performed with a lower power consumption. Further, if the write current is increased to perform high-speed writing in a TMR device, the tunnel barrier layer is broken. Therefore, there is an upper limit put on the write current. On the other hand, a GMR device has a sufficiently low resistance, and accordingly, can increase the write current and enable high-speed writing. A GMR device can also reduce writing errors caused in the recording layer by the read current.

As described above, according to the first embodiment and its modification, writing can be performed with a large amount of current, and high-speed operations can be performed.

Second Embodiment

Figure 2:
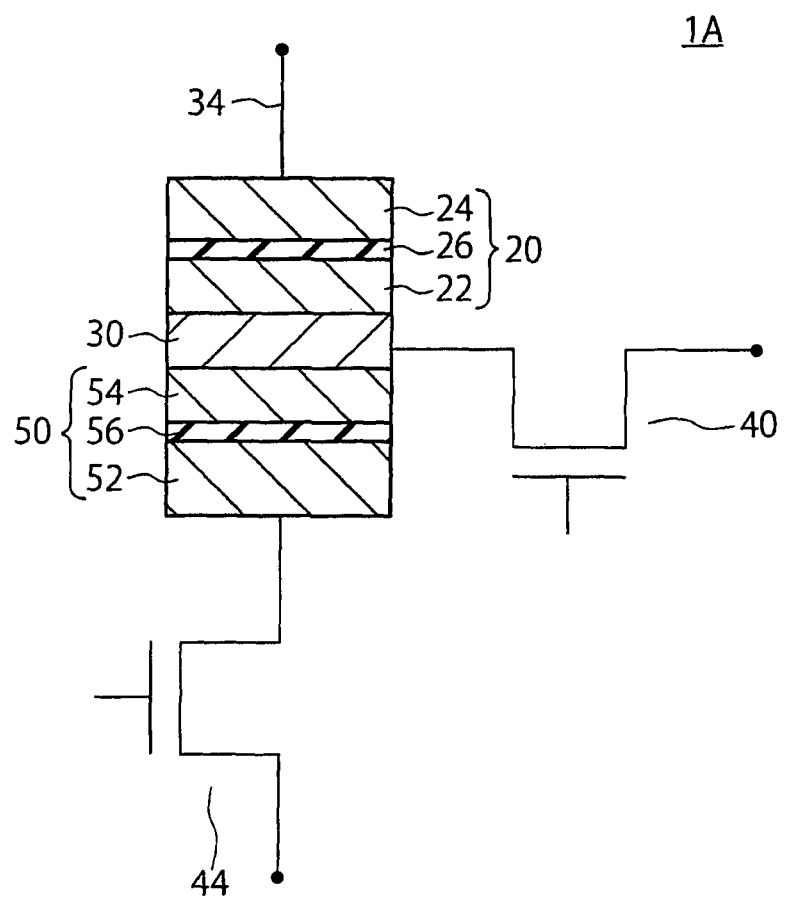
FIG. 2 is a schematic view of a magnetoresistive device according to a second embodiment.

Referring to FIG. 2, a magnetoresistive device according to a second embodiment is described. FIG. 2 is a schematic view of the magnetoresistive device 1A of the second embodiment. The magnetoresistive device 1A of the second embodiment is the same as that of the first embodiment illustrated in FIG. 1, except that the GMR device 10 is replaced with a TMR device 50. This TMR device 50 includes a magnetic layer (also referred to as a fixed layer) 52 having a fixed magnetization direction, a magnetic layer (also referred to as a free layer) 54 having a variable magnetization direction, and a tunnel barrier layer 56 interposed between the magnetic layer 52 and the magnetic layer 54.

In the second embodiment, the magnetization direction of the free layer 54 in the TMR device 50 is changed by spin transfer torque writing, and magnetostatic coupling to the magnetization of the free layer 54 is caused. In a case where the magnetization of the recording layer 22 of the TMR device 20 is changed, a magnetic material that satisfies $\alpha_2 > \alpha_1$ is selected as the material of each of the free layer 54 and the recording layer 22, where $\alpha_1$ represents the damping factor of the free magnetization layer 54 of the TMR device 50 and $\alpha_2$ represents the damping factor of the recording layer 22 of the TMR device 20. With this arrangement, writing errors caused in the recording layer by the read current can be reduced as in the first embodiment.

In a modification of the second embodiment, the free layer 54 of the TMR device 50 and the recording layer 22 of the TMR device 20 can be formed with a common magnetic layer (a recording layer).

In the second embodiment and the modification of the second embodiment, the electric resistance $R_1$ of the TMR device 50 to be used for writing and the electric resistance $R_2$ of the TMR device 20 to be used for reading are made to satisfy the condition, $R_1 < R_2$. With this arrangement, the amount of current at the time of writing can be increased, and high-speed writing can be performed.

As described above, according to the second embodiment and its modification, writing can be performed with a large amount of current, and high-speed operations can be performed, as in the first embodiment and its modification.

Third Embodiment

Figure 3:
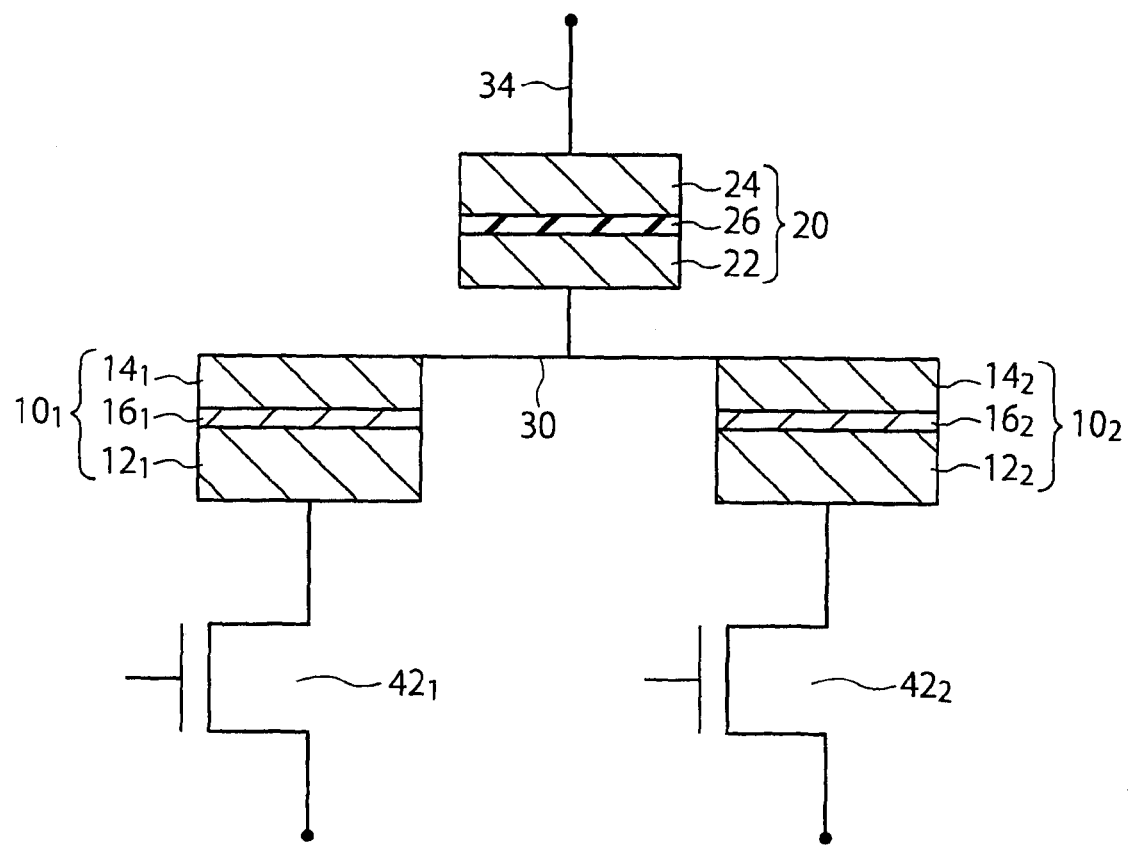
FIG. 3 is a schematic view of a magnetoresistive device according to a third embodiment.

Referring to FIG. 3, a magnetoresistive device according to a third embodiment is described. FIG. 3 is a schematic view of the magnetoresistive device 1B of the third embodiment. The magnetoresistive device 1B includes two GMR devices $10_1$ and $10_2$, a TMR device 20, a first interconnect 30, a second interconnect 34, and first and second select transistors $42_1$ and $42_2$. Each GMR device $10_i$ (i=1, 2) includes a magnetic layer (a fixed layer) $12_i$ having a fixed magnetization, a magnetic layer (a free layer) $14_i$ having a variable magnetization, and a nonmagnetic layer $16_i$ interposed between the magnetic layer $12_i$ and the magnetic layer $14_i$. The free layer $14_1$ of the GMR device $10_1$ and the free layer $14_2$ of the GMR device $10_2$ are connected by the first interconnect 30. The fixed layer $12_i$ of each GMR device $10_i$ (i=1, 2) is connected to either the source or the drain of the select transistor $42_i$.

Meanwhile, the TMR device 20 includes a magnetic layer (also referred to as a recording layer) 22 having a variable magnetization direction, a magnetic layer (also referred to as a fixed layer) 24 having a fixed magnetization direction, and a tunnel barrier layer (also referred to as a tunnel barrier) 26 interposed between the magnetic layer 22 and the magnetic layer 24. The recording layer 22 is connected to the first interconnect 30, and the fixed layer 24 is connected to the second interconnect 34.

Writing Method

Next, a writing method in the magnetoresistive device 1B of the third embodiment having the above described structure is described.

Both the first select transistor $42_1$ and the second select transistor $42_2$ are put into an activated state, and current is flowed from the second select transistor $42_2$ to the GMR device $10_2$, the first interconnect 30, the GMR device $10_1$, and the first select transistor $42_1$. By this current, spins are injected from the fixed layer $12_1$ to the free layer $14_1$ via the nonmagnetic layer $16_1$ in the GMR device $10_1$. As a result, the magnetization direction of the free layer $14_1$ is changed so as to be substantially parallel to the magnetization direction of the fixed layer $12_1$. On the other hand, spins are injected from the free layer $14_2$ to the fixed layer $12_2$ via the nonmagnetic layer $16_2$ in the GMR device $10_2$. By the spins accumulated in the free layer $14_2$, the magnetization direction of the free layer $14_2$ is changed so as to be antiparallel to the magnetization direction of the fixed layer $12_2$. Where the magnetization directions of the fixed layer $12_1$ of the GMR device $10_1$ and the fixed layer $12_2$ of the GMR device $10_2$ are in a parallel state, the magnetization directions of the free layer $14_1$ and the free layer $14_2$ are antiparallel to each other. Magnetostatic coupling is caused for the magnetic fields leaking from the free layer $14_1$ and the free layer $14_2$, and a first magnetized state is formed to change the magnetization direction of the recording layer 22 of the TMR device 20.

On the other hand, by flowing current from the first select transistor $42_1$ to the GMR device $10_1$, the first interconnect 30, the GMR device $10_2$, and the second select transistor $42_2$, the magnetization direction of the free layer $14_2$ is at substantially 180 degrees (or is antiparallel) with respect to the magnetization direction of the recording layer 22 of the TMR device 20. In this manner, a second magnetized state can be formed. By reading whether the recording layer 22 is in the first magnetized state or whether the recording layer 22 is in the second magnetized state with the use of the TMR device 20, information "1" or information "0" can be obtained.

Reading Method

Reading is performed by putting either the first select transistor $42_1$ or the second select transistor $42_2$ into an activated state, and flowing current to the electrical circuit formed with the activated select transistor, the GMR device corresponding to the activated select transistor, the first interconnect 30, the TMR device 20, and the second interconnect 34. For example, if the activated select transistor is the first select transistor $42_1$, reading is performed by flowing current to the electrical circuit formed with the first select transistor $42_1$, the GMR device $10_1$, the first interconnect 30, the TMR device 20, and the second interconnect 34.

It is preferable to select a material that satisfies the relationship, $\alpha_2 > \alpha_1$, between the damping factor $\alpha_2$ of the recording layer 22 of the TMR device 20 and the damping factor $\alpha_1$ of each of the free layers $14_1$ and $14_2$ of the GMR devices $10_1$ and $10_2$. Since spin transfer torque writing is performed on the free layers $14_1$ and $14_2$ of the GMR devices $10_1$ and $10_2$, the damping factor $\alpha_1$ is preferably small to reduce the write current. Meanwhile, writing is performed on the TMR device 20 by the magnetic fields leaking from the free layers $14_1$ and $14_2$. To reduce writing errors caused in the recording layer 22 by the read current, the damping factor $\alpha_2$ of the recording layer 22 is preferably made larger, and a material that satisfies the condition, $\alpha_2 > \alpha_1$, is preferably selected. For example, as the material of the recording layer 22, CoPt, FePt, or a material formed by combining a transition metal with a lanthanoid material, or a material containing many 5d electrons, such as SmCo, NdCo, TbCoFe, or DyCoFe, is used. In this manner, the damping factor $\alpha_2$ can be made larger. Meanwhile, as the material of the free layers $14_1$ and $14_2$, a material that contains a 3d to 4d transition metal such as CoPd, MnGa, MnAl, MnSb, or CoFeB, but does not contain 5d electrons and 4f electrons, is used. In this manner, the damping factor $\alpha_1$ can be made smaller.

In a modification of the third embodiment, the free layers $14_1$ and $14_2$ of the GMR devices $10_1$ and $10_2$, and the recording layer 22 of the TMR device 20 can be formed with a common magnetic layer (a recording layer). In this case, the first interconnect 30 becomes unnecessary. In the third embodiment and the modification of the third embodiment, the electric resistance $R_1$ of each of the GMR devices $10_1$ and $10_2$ for performing writing, and the electric resistance $R_2$ of the TMR device 20 for performing reading are made to satisfy the condition, $R_1 < R_2$. With this arrangement, the amount of current at the time of writing can be increased, and high-speed writing can be performed.

In the third embodiment and its modification, the resistance of each GMR device is low, and accordingly the voltage to be applied at the time of information writing can be lowered. Thus, writing can be performed with a lower power consumption. In this manner, breaking of the tunnel barrier layer due to an increase caused in the write current by high-speed writing can be prevented. Also, writing errors caused in the recording layer by the read current can be reduced.

As described above, according to the third embodiment and its modification, writing can be performed with a large amount of current, and high-speed operations can be performed.

Fourth Embodiment

Figure 4:
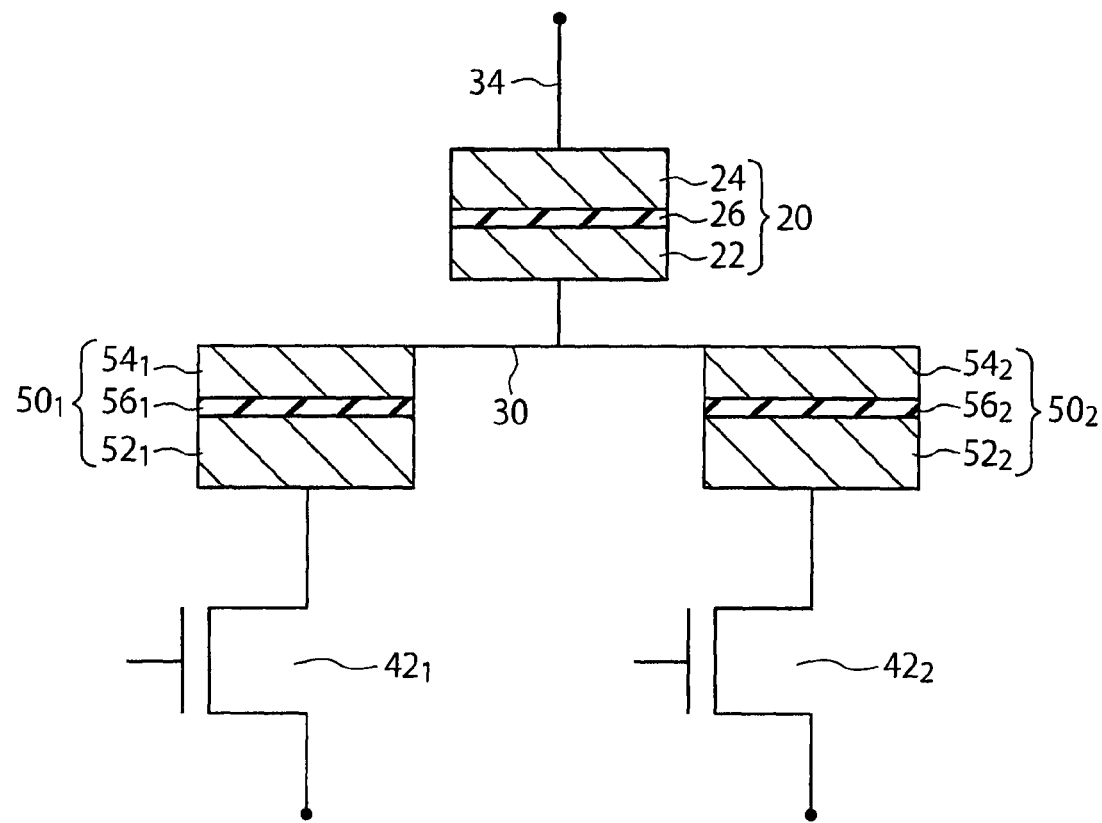
FIG. 4 is a schematic view of a magnetoresistive device according to a fourth embodiment.

Referring to FIG. 4, a magnetoresistive device according to a fourth embodiment is described. FIG. 4 is a schematic view of the magnetoresistive device 1C of the fourth embodiment. This magnetoresistive device 1C is the same as the magnetoresistive device 1B of the third embodiment, except that the GMR devices $10_1$ and $10_2$ are replaced with TMR devices $50_1$ and $50_2$. Each TMR device $50_i$ (i=1, 2) includes a magnetic layer (a fixed layer) $52_i$ having a fixed magnetization, a magnetic layer (a free layer) $54_i$ having a variable magnetization, and a tunnel barrier layer $56_i$ interposed between the magnetic layer $52_i$ and the magnetic layer $54_i$. The free layer $54_1$ of the TMR device $50_1$ and the free layer $54_2$ of the TMR device $50_2$ are connected by the first interconnect 30. The fixed layer $52_i$ of each TMR device $50_i$ (i=1, 2) is connected to either the source or the drain of the select transistor $42_i$.

In the magnetoresistive device 1C of the fourth embodiment having the above described structure, the respective magnetization directions of the free layers $54_1$ and $54_2$ of the TMR devices $50_1$ and $50_2$ are changed by spin transfer torque writing, and the magnetization of the recording layer 22 of the TMR device 20 magnetostatically coupled to the magnetizations of the free layers $54_1$ and $54_2$ are change. In the fourth embodiment, the free layers $54_1$ and $54_2$ each having a damping factor $\alpha_1$, and the recording layer 22 having a damping factor $\alpha_2$ are used. Further, a magnetic material that satisfies the condition, $\alpha_2 > \alpha_1$, is selected as the material of each of the recording layer 22 and the free layers $54_1$ and $54_2$. Accordingly, writing errors caused in the recording layer by the read current can be reduced, as in the third embodiment.

In a modification of the fourth embodiment, the free layers $54_1$ and $54_2$ of the TMR devices $50_1$ and $50_2$, and the recording layer 22 of the TMR device 20 can be formed with a common magnetic layer (a recording layer). In the fourth embodiment and the modification of the fourth embodiment, the electric resistance $R_1$ of each of the TMR devices $50_1$ and $50_2$, and the electric resistance $R_2$ of the TMR device 20 are made to satisfy the condition, $R_1<R_2$. With this arrangement, the amount of current at the time of writing can be increased, and high-speed writing can be performed.

As described above, according to the fourth embodiment and its modification, writing can be performed with a large amount of current, and high-speed operations can be performed, as in the third embodiment and its modification.

In the above description, the magnetized states (the magnetization directions) of the magnetic layers of the GMR devices and the TMR device are not explained. In view of this, FIG. 5 shows whether there is a decrease in the write current, and whether there is an improvement in MR at the time of reading in each of the cases where the magnetized states (the magnetization directions) of the magnetic layers of the GMR device(s) and the TMR device are changed in the first or third embodiment. In FIG. 5, symbol "o" means that a reduction or improvement is possible, and symbol "x" means that a reduction and an improvement are not possible. As can be seen from FIG. 5, where the magnetization directions of the magnetic layers of the TMR device are perpendicular to the film plane while the magnetization directions of the magnetic layers of the GMR device are perpendicular to the film plane, the write current can be reduced, and the MR (the resistance difference) at the time of reading can be improved. In this specification, the "film plane" means the upper face of a magnetic layer. Where the magnetization directions of the magnetic layers of the TMR device are perpendicular to the film plane while the magnetization directions of the magnetic layers of the GMR device are parallel to the film plane (or are the in-plane direction), the MR at the time of reading can be improved. Where the magnetization directions of the magnetic layers of the TMR device are parallel to the film plane while the magnetization directions of the magnetic layers of the GMR device are perpendicular to the film plane, the write current can be reduced, and the MR at the time of reading can be improved. Where the magnetization directions of the magnetic layers of the TMR device are parallel to the film plane while the magnetic directions of the magnetic layers of the GMR device are parallel to the film plane, the MR at the time of reading can be improved. In view of the above, in realizing writing at a low current, it is preferable to use perpendicular magnetization films as the magnetic layers of the GMR device. Meanwhile, the same read resistance difference can be achieved, regardless of whether the magnetization directions of the magnetic layers of the TMR device are in-plane directions or are perpendicular to the film plane.

FIG. 6 shows whether there is a decrease in the write current, and whether there is an improvement in MR at the time of reading in each of the cases where the magnetized states (the magnetization directions) of the magnetic layers of the read and write TMR devices are changed in the second or fourth embodiment. In FIG. 6, symbol "o" means that a reduction or improvement is possible, and symbol "x" means that a reduction and an improvement are not possible. As can be seen from FIG. 6, in realizing writing at a low current, it is preferable to use perpendicular magnetization films as the magnetic layers of the write TMR device. Meanwhile, the same read resistance difference can be achieved, regardless of whether the magnetization direction of the read TMR device are in-plane directions or are perpendicular to the film plane. The electric resistance $R_1$ of the write TMR device and the electric resistance $R_2$ of the read TMR device satisfies $R_1<R_2$. With this arrangement, the amount of current at the time of writing can be increased, and high-speed writing can be performed.

Example 1

Referring now to FIGS. 7(a) and 7(b), a magnetoresistive device according to Example 1 is described. This magnetoresistive device of Example 1 is the magnetoresistive device 1 of the first embodiment. FIGS. 7(a) and 7(b) are diagrams showing the magnetization direction, write current, and read current in each magnetic layer in cases where the magnetoresistive device 1 of Example 1 is in a high-resistance state and a low-resistance state, respectively. The solid lines indicate the write current, the dashed lines indicate the read current, and the arrows indicate the magnetization directions. In a case where the magnetoresistive device is in a high-resistance state, the magnetization directions of the recording layer 22 and the fixed layer 24 of the TMR device 20 are in an anti-parallel state. In a case where the magnetoresistive device is in a low-resistance state, the magnetization directions of the recording layer 22 and the fixed layer 24 of the TMR device 20 are in a parallel state. It should be noted that, in FIGS. 7(a) and 7(b), the first and second select transistors 40 and 44 shown in FIG. 1 are not shown.

As shown in FIG. 5, the magnetization directions of the magnetic layers 12 and 14 of the GMR device 10 are preferably perpendicular to the film plane, and the magnetization directions of the magnetic layers 22 and 24 of the TMR device 20 can be the perpendicular directions or in-plane directions. However, in a structure where the free layer 14 of the GMR device 10 and the recording layer 22 of the TMR device 20 are provided independently of each other, and the magnetization direction of the recording layer of the TMR device 20 varies with the magnetic field leaking from the free layer 14 of the GMR device 10 as in Example 1, the magnetization directions of the magnetic layers 22 and 24 of the TMR device 20 are preferably perpendicular to the film plane so as to efficiently achieve magnetostatic coupling. To perform writing to form a high-resistance state and perform reading in a high-resistance state, current is flowed in the directions indicated by the solid line and the dashed line of FIG. 7(a), respectively. That is, to perform writing to form a high-resistance state, current is flowed from the first interconnect layer 30 to the GMR device 10. To perform reading in a high-resistance state, current is flowed between the TMR device 20 and the first interconnect layer 30. The current flowed in the case of reading can flow in either of the directions.

On the other hand, to perform writing to form a low-resistance state and perform reading in a low-resistance state, current is flowed in the directions indicated by the solid line and the dashed line of FIG. 7(b), respectively. That is, to perform writing to form a low-resistance state, current is flowed from the GMR device 10 to the first interconnect layer 30. To perform reading in a low-resistance state, current is flowed between the TMR device 20 and the first interconnect layer 30. The current flowed in the case of reading can flow in either of the directions.

Where the magnetization direction of the magnetic layer 14 of the GMR device 10 is perpendicular to the film plane while the magnetization direction of the magnetic layer 22 of the TMR device 20 is perpendicular to the film plane, and the magnetic layers are magnetostatically coupled to each other, the write current can be advantageously made lower than that in the comparative example described below. In the comparative example where the magnetization directions of the two magnetic layers are in in-plane directions and the magnetic layers are magentostatically coupled to each other, or where the magnetization directions of the magnetic layers are anti-parallel to each other, the magnetization of one of the magnetic layers is changed by the write current, and the magnetization of the other one of the magnetic layers is changed by magnetostatic coupling, for example. When the magnetization of a magnetic layer having its magnetization direction in an in-plane direction (hereinafter referred to as an in-plane magnetic layer) is changed in spin transfer torque writing, the magnetization of the in-plane magnetic layer is rotated from the in-plane direction to the direction perpendicular to the film plane. Therefore, in a case where the magnetizations of the in-plane magnetic layers are changed by magnetostatic coupling as in the comparative example, the magnetization direction of one of the magnetic layers is rotated clockwise, and the magnetization direction of the other one of the magnetic layers is rotated counterclockwise, as the two magnetic layers are magnetostatically coupled to each other. Accordingly, in the reversing process, the same poles of the magnetizations of the two magnetic layers overlap. As a result, the magnetization reversals are hindered, and the write current increases.

In a case where the magnetization directions of the two magnetic layers are perpendicular to the film plane and the two magnetic layers are magnetostatically coupled to each other, on the other hand, the magnetic poles of those magnetizations do not overlap, and accordingly, an increase in magnetization reversal energy can be restrained in the magnetization reversing process. Thus, the write current can be made lower than that in the comparative example. This applies to the examples described below.

Example 2

Figure 8:
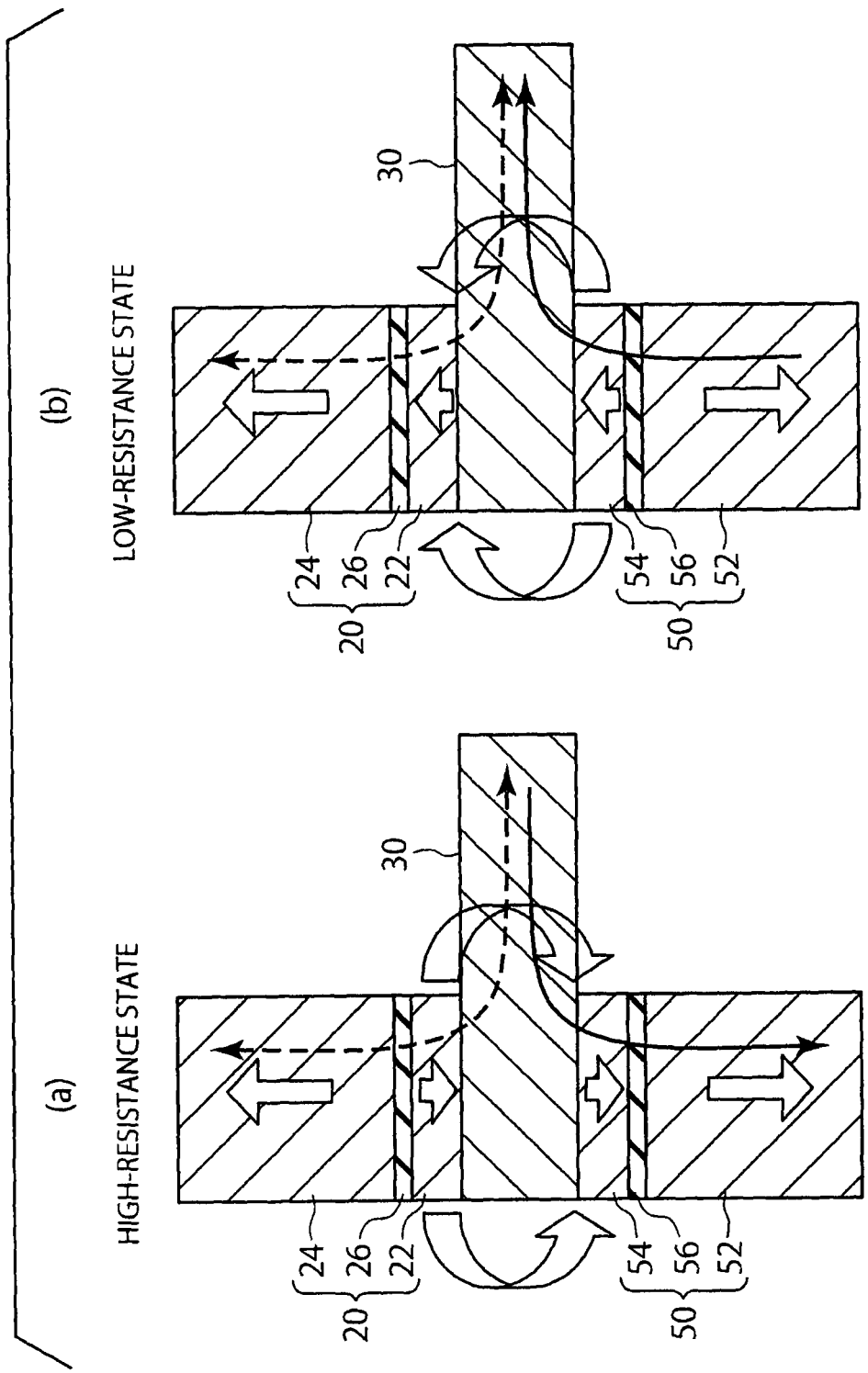
FIGS. 8($a$) and 8($b$) are diagrams showing a high-resistance state and a low-resistance state of a magnetoresistive device of Example 2.

Referring now to FIGS. 8(a) and 8(b), a magnetoresistive device according to Example 2 is described. The magnetoresistive device of Example 2 is the magnetoresistive device 1A of the second embodiment. FIGS. 8(a) and 8(b) are diagrams showing the magnetization direction, write current, and read current in each magnetic layer in cases where the magnetoresistive device 1A of Example 2 is in a high-resistance state and a low-resistance state, respectively. The solid lines indicate the write current, the dashed lines indicate the read current, and the arrows indicate the magnetization directions. It should be noted that, in FIGS. 8(a) and 8(b), the first and second select transistors 40 and 44 shown in FIG. 2 are not shown.

As in Example 1, the magnetization directions of the magnetic layers 52 and 54 of the TMR device 50 are preferably perpendicular to the film plane, and the magnetization directions of the magnetic layers 22 and 24 of the TMR device 20 can be the perpendicular directions or in-plane directions. However, in a structure where the magnetization direction of the recording layer of the TMR device 20 varies with the magnetic field leaking from the free layer 54 of the TMR device 50, the magnetization directions of the magnetic layers 22 and 24 of the TMR device 20 are preferably perpendicular to the film plane so as to efficiently achieve magnetostatic coupling. To perform writing to form a high-resistance state and perform reading in a high-resistance state, current is flowed in the directions indicated by the solid line and the dashed line of FIG. 8(a), respectively. That is, to perform writing to form a high-resistance state, current is flowed from the first interconnect layer 30 to the TMR device 50. To perform reading in a high-resistance state, current is flowed between the TMR device 20 and the first interconnect layer 30. The current flowed in the case of reading can flow in either of the directions.

On the other hand, to perform writing to form a low-resistance state and perform reading in a low-resistance state, current is flowed in the directions indicated by the solid line and the dashed line of FIG. 8(b), respectively. That is, to perform writing to form a low-resistance state, current is flowed from the TMR device 50 to the first interconnect layer 30. To perform reading in a low-resistance state, current is flowed between the TMR device 20 and the first interconnect layer 30. The current flowed in the case of reading can flow in either of the directions.

Example 3

Figure 9:
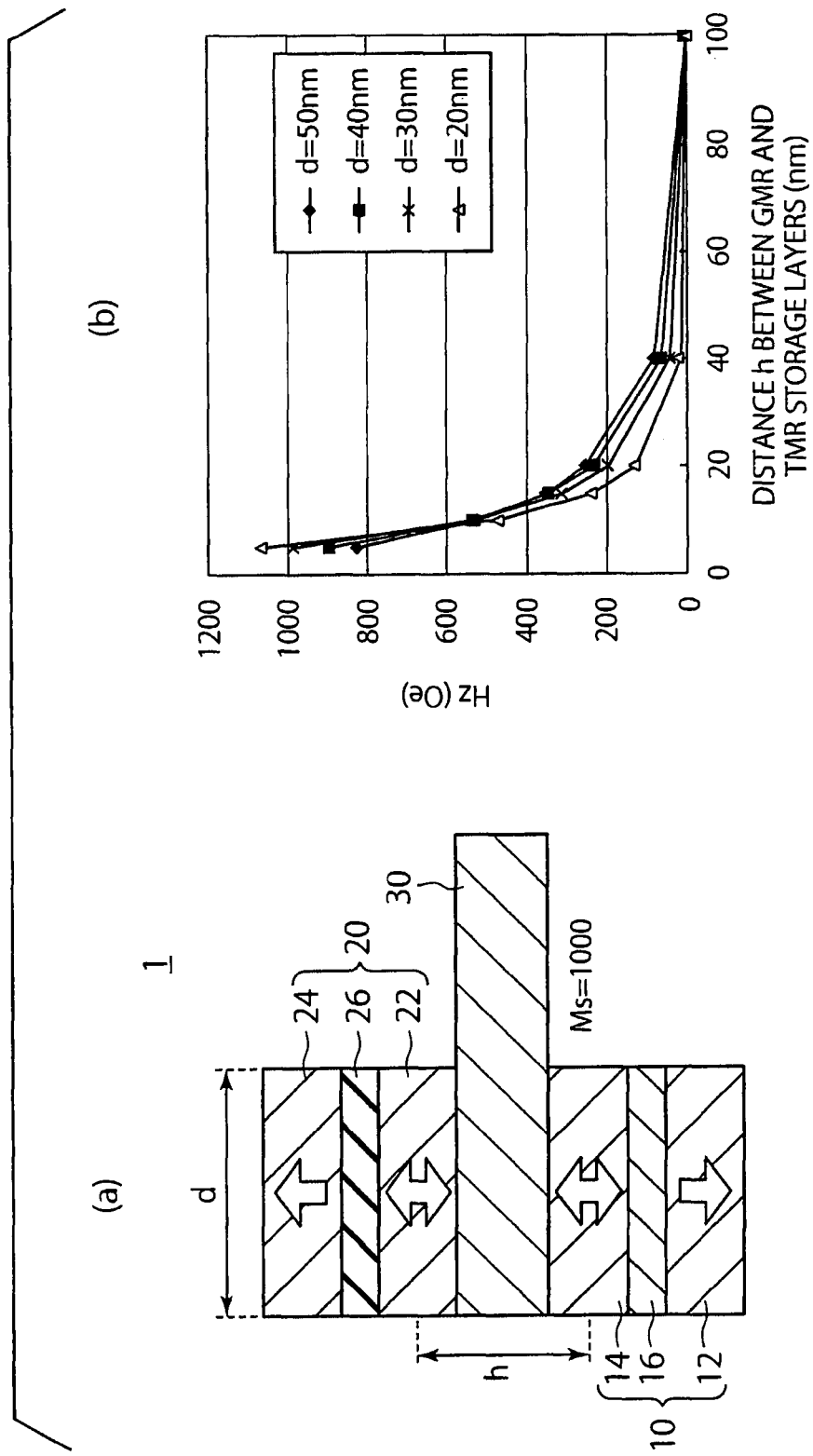
FIGS. 9($a$) and 9($b$) are diagrams for explaining a magnetoresistive device of Example 3.

Referring now to FIGS. 9(a) and 9(b), a magnetoresistive device according to Example 3 is described. The magnetoresistive device of Example 3 is the magnetoresistive device 1 of the first embodiment. The free layer 14 of the GMR device 10 is a CoFeB/CoPd layer having a saturation magnetization of 1000 emu/cc, for example. FIG. 9(b) shows the relationship between a distance h and the magnetic field Hz applied to the recording layer 22 by the magnetic field leaking from the free layer 14, where the distance h is the distance from the center of the free layer 14 of the GMR device 10 in the film thickness direction to the center of the recording layer 22 of the TMR device 20 in the film thickness direction. In Example 3, the diameter of the GMR device 10 and the diameter of the TMR device 20 are the same, and the relationship between the distance h and the magnetic field Hz is shown in FIG. 9(b), with the diameter d being the parameter. As can be seen from FIG. 9(b), by shortening the distance h, or by thinning the interconnect layer 30 provided between the TMR device 20 and the GMR device 10 and shortening the distance h between the free layer 14 and the recording layer 22, the magnetic field to be applied to the recording layer 22 becomes larger, and a magnetization reversal in the recording layer 22 becomes easier.

Where the distance h between the GMR device 10 and the TMR device 20 becomes larger or smaller than approximately 10 nm, the size of the leak magnetic field with respect to the device size is changed. Where the distance h is 10 nm or shorter, the leak magnetic field becomes larger as the device size becomes smaller. Where the distance h is 10 nm or longer, a larger leak magnetic field can be obtained as the device size becomes larger. Since spin transfer torque writing is performed on the GMR device 10, the write current needs to be reduced, and reduction of the spin torques in the free layer 14 can be restrained by reducing the film thickness of the free layer 14. In this manner, spin torques can be efficiently achieved, and the write current can be reduced. Meanwhile, writing is performed on the TMR device 20 with a leak magnetic field, and therefore, the magnetization switching magnetic field is preferably small. In FIGS. 9(a) and 9(b), the first and second select transistors 40 and 44 shown in FIG. 1 are not shown.

To use the magnetoresistive device of Example 1 or 3 as a storage device in a nonvolatile memory, the recording layer 22 needs to have thermal disturbance tolerance. Therefore, $KuV/(k_BT)$ needs to be 60 or higher, where Ku represents the magnetic anisotropy energy density, V represents the volume of the recording layer 22, $k_B$ represents the Boltzmann constant, and T represents the absolute temperature. For example, where the device size d is 30 nm, a CoFeB/CoPt layer having a saturation magnetization of 1000 emu/cc is used as the recording layer 22, the thickness of the interconnect layer 30 interposed between the TMR device 20 and the GMR device 10 is 10 nm, and the total film thickness of the CoFeB/CoPt layer serving as the recording layer 22 is 3.4 nm. With this arrangement, a magnetic field of approximately 400 Oe is applied to the recording layer 22, and the changed magnetic field of the CoFeB/CoPt layer is 300 Oe. In this manner, a nonvolatile magnetoresistive device can be manufactured. The changed magnetic field of the CoFeB/CoPt layer can be designed by setting the film thickness ratio between the CoFeB film and the CoPt film. The changed magnetic field is made smaller by increasing the film thickness of the CoFeB film, and is made larger by reducing the thickness of the CoFeB film.

Example 4

Figure 10:
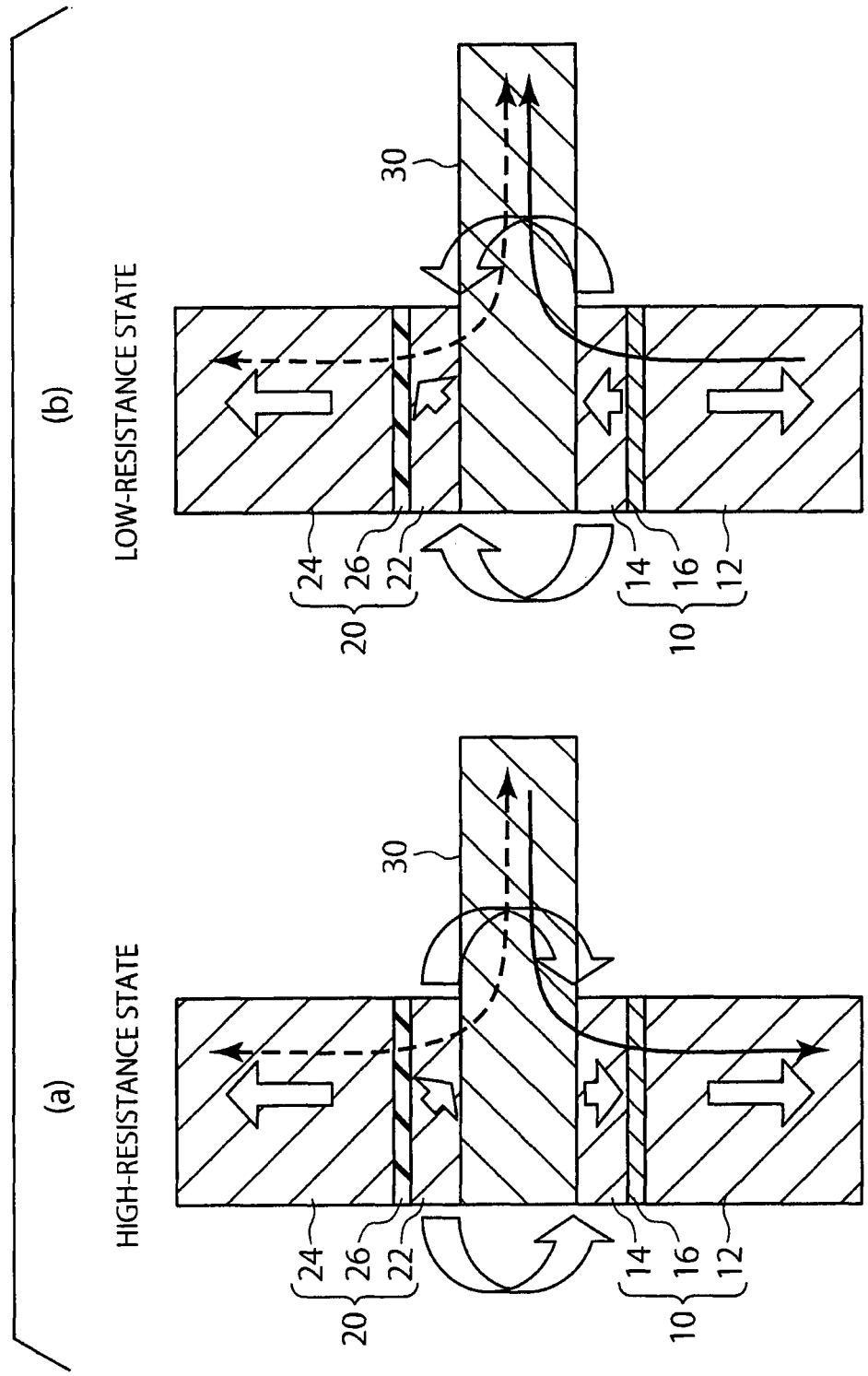
FIGS. 10($a$) and 10($b$) are diagrams showing a high-resistance state and a low-resistance state of a magnetoresistive device of Example 4.

Referring now to FIGS. 10(*a*) and 10(*b*), a magnetoresistive device according to Example 4 is described. The magnetoresistive device of Example 4 is the magnetoresistive device 1 of the first embodiment. FIGS. 10(*a*) and 10(*b*) are diagrams showing the magnetization direction, write current, and read current in each magnetic layer in cases where the magnetoresistive device 1 of Example 4 is in a high-resistance state and a low-resistance state, respectively. The solid lines indicate the write current, the dashed lines indicate the read current, and the arrows indicate the magnetization directions. In Example 4, the magnetization direction of the recording layer 22 of the TMR device 20 is not parallel or antiparallel to the magnetization direction of the fixed layer 24, but is oriented in an oblique direction, as shown in FIGS. 10(*a*) and 10(*b*). That is, the recording layer 22 has a magnetization component parallel to the film plane. It should be noted that, in FIGS. 10(*a*) and 10(*b*), the first and second select transistors 40 and 44 shown in FIG. 1 are not shown.

In Example 4, when the magnetization of the free layer 14 is changed by spin transfer torque writing and the state of the magnetic field to be applied to the recording layer 22 is changed, the magnetization direction of the recording layer 22 is changed. If the magnitude of the magnetic field to be applied to the recording layer 22 is equal to or smaller than the magnetization switching magnetic field, the magnetization of the recording layer 22 does not become parallel or antiparallel to the fixed layer 24, but the resistance change due to the magnetization change can be read from the current flowing in the TMR device 20. Accordingly, the information "1" and "0" can be obtained. In Example 4, the magnetic field leaking from the free layer 14 can be reduced, and the saturation magnetization Ms of the free layer 14 can be reduced. The reduction in the saturation magnetization Ms increases the magnetization switching speed, and high-speed writing can be performed.

Example 5

Figure 11:
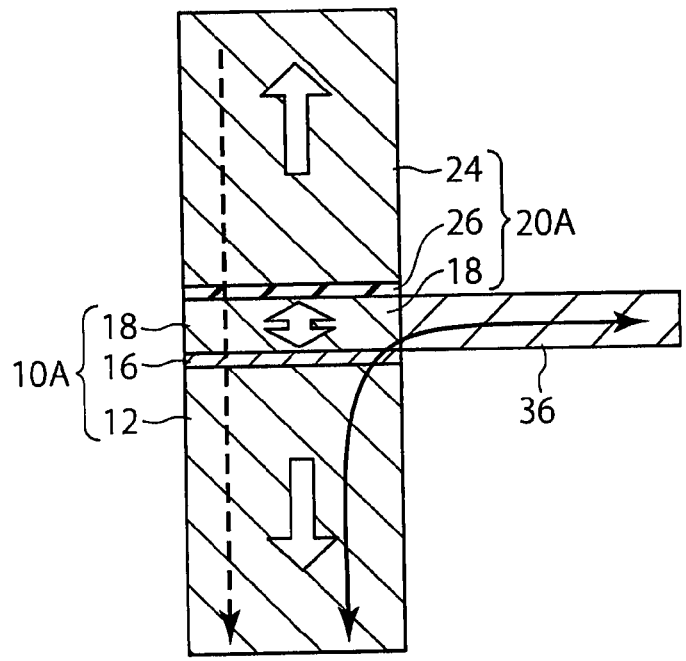
FIG. 11 is a cross-sectional view of a magnetoresistive device of Example 5.

FIG. 11 shows a magnetoresistive device according to Example 5. The magnetoresistive device of Example 5 is the magnetoresistive device according to the modification of the first embodiment. The free layer of a GMR device 10A and the recording layer of a TMR device 20A is formed with a common magnetic layer (a recording layer) 18. That is, the GMR device 10A includes the fixed layer 12, the nonmagnetic layer 16, and the recording layer 18. The TMR device 20A includes the recording layer 18, the tunnel barrier layer 26, and the fixed layer 24. In this structure, one end of a third interconnect layer 36 having substantially the same film thickness as the recording layer 18 is connected to a side face of the common recording layer 18. Although not shown in FIG. 11, the first select transistor 40 shown in FIG. 1 is connected to the other end of the third interconnect layer 36. The second select transistor 44 (not shown) is connected to the fixed layer 12 of the GMR device 10A. In FIG. 11, the solid line indicates the write current, the dashed line indicates the read current, and the arrows indicate the magnetization directions.

In the magnetoresistive device of Example 5, the write current indicated by the solid line and the read current indicated by the dashed line pass through the interconnect layer 36. If the thickness of the interconnect layer 36 is increased, and the interconnect layer 36 is connected to a side portion of the nonmagnetic layer 16 of the GMR device 10A or the tunnel barrier layer 26 of the TMR device 20A, electrons carrying spin information in the nonmagnetic layer 16 are not transferred to the recording layer 18 or the fixed layer 12 but partially flow into the interconnect layer 36 in the GMR device 10A. Accordingly, the write current increases. In the TMR device 20A, degradation of the breakdown voltage or current leakage occurs between the interconnect layer 36 and the fixed layer 24. In the former case, the device breaks down. In the latter case, the read output is degraded. Therefore, the interconnect layer 36 and the recording layer 18 preferably have the same film thicknesses, and preferably have no magnetism. If the interconnect layer 36 has magnetism, the volume of the recording layer 18 increases, resulting in an increase in the write current. Also, the thickness of the recording layer 18 is small. Therefore, if the interconnect layer 36 is made longer, the resistance becomes dramatically higher. In a case where the film thickness of the metal interconnect layer 36 is approximately 2 nm, the resistance is presumably several tens to several hundreds of $\Omega/\square$. Where the resistance of the TMR device 20A is presumably several k$\Omega$, the aspect ratio in the plane of the interconnect layer 36 is preferably 2 or lower, to secure a sufficient margin in the variation of the read current.

In Example 5, the recording layer 18 of the GMR device 10A and the TMR device 20A is the common magnetic layer. Therefore, the magnetization directions are preferably perpendicular to the film plane, to reduce the write current. Writing is performed by flowing current in two directions, as indicated by the solid line. Reading is performed by flowing current in the direction indicated by the dashed line. Alternatively, the read current can be flowed in the opposite direction from the direction indicated by the dashed line.

In Example 5, to reduce the shift magnetic field in the recording layer 18 from the fixed layer 12 and the fixed layer 24, the magnetization directions of the fixed layer 12 of the GMR device 10A and the fixed layer 24 of the TMR device 20A are designed to be the opposite directions from each other, so that the leak magnetic field applied to the recording layer 18 from the fixed layer 12 and the leak magnetic field applied to the recording layer 18 from the fixed layer 24 cancel each other. It is preferable to take advantage of this effect.

Example 6

Figure 12:
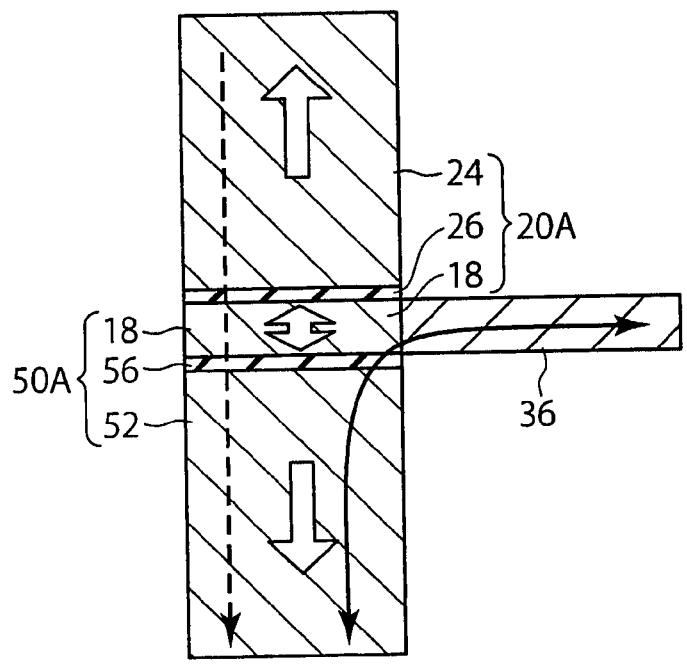
FIG. 12 is a cross-sectional view of a magnetoresistive device of Example 6.

FIG. 12 shows a magnetoresistive device according to Example 6. The magnetoresistive device of Example 6 is the magnetoresistive device according to the modification of the second embodiment. The free layer of a TMR device 50A and the recording layer of the TMR device 20A are formed with the common magnetic layer (the recording layer) 18. That is, the TMR device 50A includes the fixed layer 52, the tunnel barrier layer 56, and the recording layer 18. The TMR device 20A includes the recording layer 18, the tunnel barrier layer 26, and the fixed layer 24. In this structure, one end of a nonmagnetic third interconnect layer 36 having substantially the same film thickness as the recording layer 18 is connected to a side face of the common recording layer 18. Although not shown in FIG. 12, the first select transistor 40 shown in FIG. 1 is connected to the other end of the third interconnect layer 36. The second select transistor 44 (not shown) is connected to the fixed layer 52 of the TMR device 50A. In FIG. 12, the solid line indicates the write current, the dashed line indicates the read current, and the arrows indicate the magnetization directions.

In the magnetoresistive device of Example 6, the write current indicated by the solid line and the read current indicated by the dashed line pass through the interconnect layer 36.

In Example 6, the recording layer 18 of the TMR device 50A and the TMR device 20A is the common magnetic layer. Therefore, the magnetization directions are preferably perpendicular to the film plane, to reduce the write current. Writing is performed by flowing current in two directions, as indicated by the solid line. Reading is performed by flowing current in the direction indicated by the dashed line. Alternatively, the read current can be flowed in the opposite direction from the direction indicated by the dashed line.

In Example 6, to reduce the shift magnetic field in the recording layer 18 from the fixed layer 52 and the fixed layer 24, the magnetization directions of the fixed layer 52 of the TMR device 10A and the fixed layer 24 of the TMR device 20A are designed to be the opposite directions from each other, so that the leak magnetic field applied to the recording layer 18 from the fixed layer 52 and the leak magnetic field applied to the recording layer 18 from the fixed layer 24 cancel each other. It is preferable to take advantage of this effect.

Example 7

Figure 13:
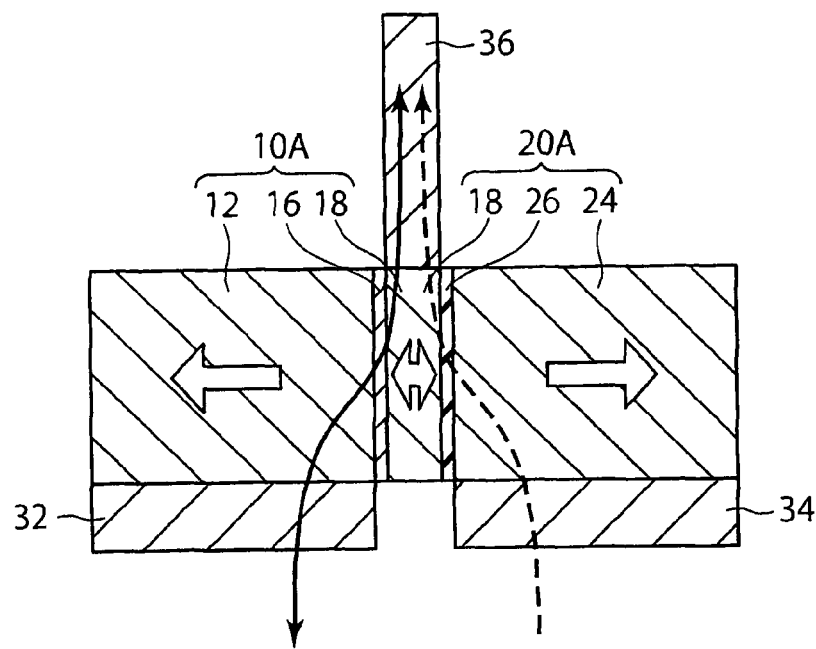
FIG. 13 is a cross-sectional view of a magnetoresistive device of Example 7.

FIG. 13 shows a magnetoresistive device according to Example 7. The magnetoresistive device of Example 7 is the same as the magnetoresistive device of Example 5 illustrated in FIG. 11, except that an interconnect layer 32 having one end connected to a side portion (the lower face in FIG. 13) of the fixed layer 12 of the GMR device 10A and having the other end connected to the second select transistor 44 (not shown) is provided, and that the interconnect layer 34 (not shown, but see FIG. 1) connected to a side portion (the lower face in FIG. 13) of the fixed layer 24 of the TMR device 20A is provided. In FIG. 13, the solid line indicates the write current, the dashed line indicates the read current, and the arrows indicate the magnetization directions. Alternatively, the read current can be flowed in the opposite direction from the direction indicated by the dashed line.

Example 8

Figure 14:
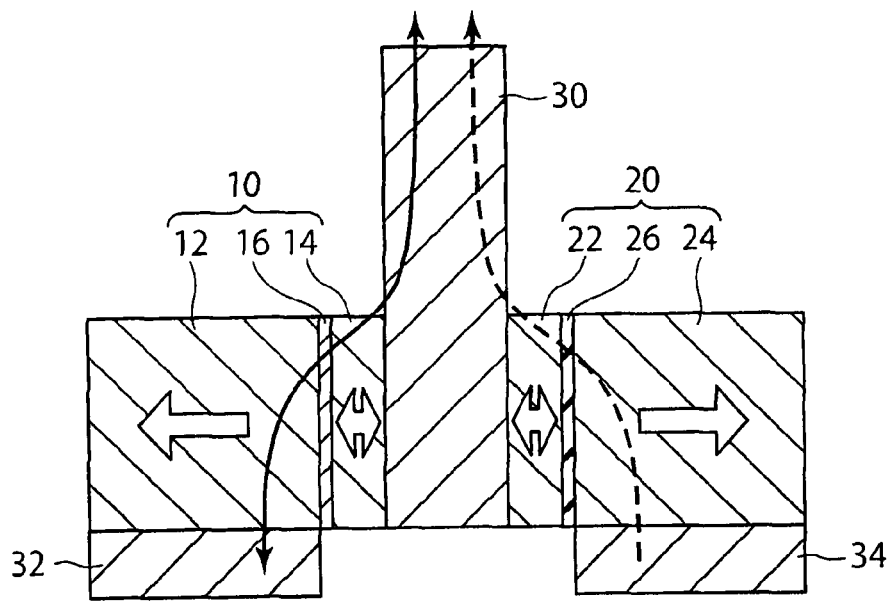
FIG. 14 is a cross-sectional view of a magnetoresistive device of Example 8.

FIG. 14 shows a magnetoresistive device according to Example 8. The magnetoresistive device of Example 8 is the same as the magnetoresistive device of Example 1 illustrated in FIG. 7, except that the interconnect layer 32 having one end connected to a side portion (the lower face in FIG. 14) of the fixed layer 12 of the GMR device 10 and having the other end connected to the second select transistor 44 (not shown) is provided, and that the interconnect layer 34 (not shown, but see FIG. 1) connected to a side portion (the lower face in FIG. 14) of the fixed layer 24 of the TMR device 20 is provided. In FIG. 14, the solid line indicates the write current, the dashed line indicates the read current, and the arrows indicate the magnetization directions. Alternatively, the read current can be flowed in the opposite direction from the direction indicated by the dashed line.

Example 9

Figure 15:
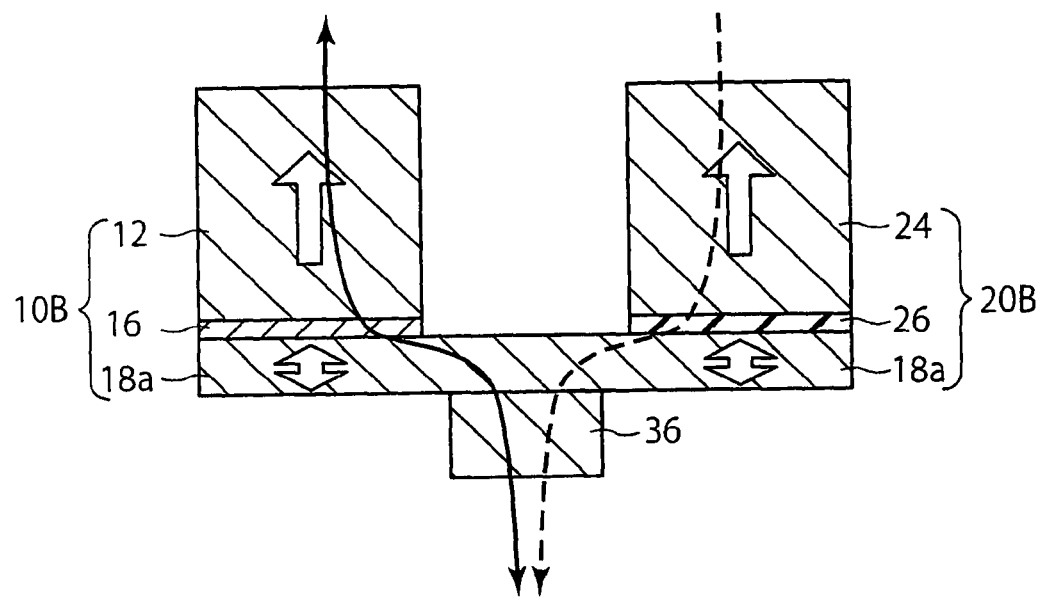
FIG. 15 is a cross-sectional view of a magnetoresistive device of Example 9.

FIG. 15 shows a magnetoresistive device according to Example 9. The magnetoresistive device of Example 9 is the same as the magnetoresistive device according to the modification of the first embodiment, except that the free layer of a GMR device 10B and the recording layer of a TMR device 20B are formed with a common magnetic layer (a recording layer) 18a. The GMR device 10B includes the fixed layer 12, the nonmagnetic layer 16, and the recording layer 18a. The TMR device 20B includes the recording layer 18a, the tunnel barrier layer 26, and the fixed layer 24. The GMR device 10B and the TMR device 20B are formed on the same surface side of the recording layer 18a, and the interconnect layer 36 is formed on the surface of the recording layer 18a on the opposite side from the side on which the GMR device 10B and the TMR device 20B are provided. That is, the area of the film plane of the recording layer 18a is larger than the sum of the area of the film plane of the fixed layer 14 of the GMR device 10B and the area of the film plane of the fixed layer 24 of the TMR device 20B.

In Example 9, when the magnetization of the recording layer 18a of the GMR device 10B is changed by spin transfer torque writing, the changed magnetic domain spreads into the region where the TMR device 20B is provided, and the magnetization of the recording layer 18a of the TMR device 20B is changed. In FIG. 15, the solid line indicates the write current, the dashed line indicates the read current, and the arrows indicate the magnetization directions. Alternatively, the read current can be flowed in the opposite direction from the direction indicated by the dashed line.

Example 10

Figure 16:
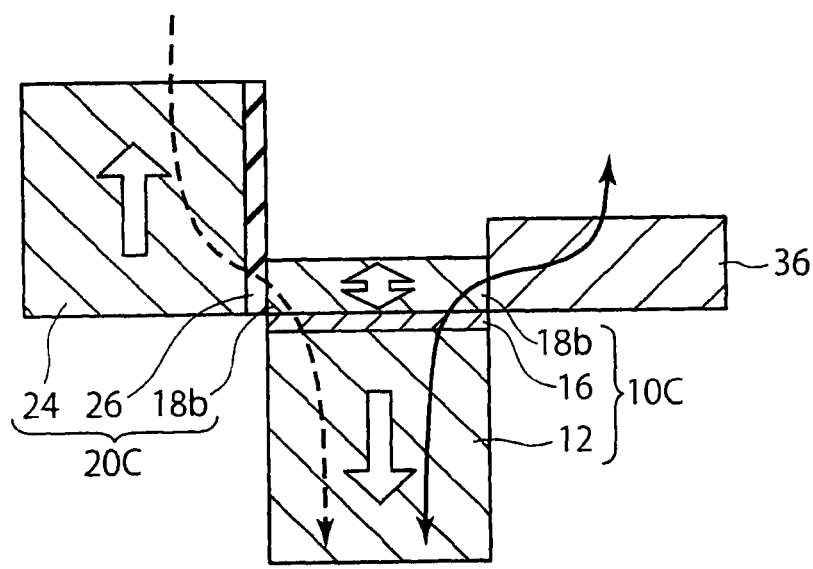
FIG. 16 is a cross-sectional view of a magnetoresistive device of Example 10.

FIG. 16 shows a magnetoresistive device according to Example 10. The magnetoresistive device of Example 10 is the same as the magnetoresistive device according to the modification of the first embodiment, except that the free layer of a GMR device 10C and the recording layer of a TMR device 20C are formed with a common magnetic layer (a recording layer) 18b. The GMR device 10C includes the fixed layer 12, the nonmagnetic layer 16, and the recording layer 18b. The TMR device 20C includes the recording layer 18b, the tunnel barrier layer 26, and the fixed layer 24. The tunnel barrier layer 26 of the TMR device 20C is provided along one of the side faces of the recording layer 18b of the GMR device 10C, and the interconnect layer 36 is formed on the other side face of the recording layer 18b of the GMR device 10C. That is, the TMR device 20C and the interconnect layer 36 are provided on the opposite sides from each other, with the recording layer 18b being interposed in between. In FIG. 16, the solid line indicates the write current, the dashed line indicates the read current, and the arrows indicate the magnetization directions. Alternatively, the read current can be flowed in the opposite direction from the direction indicated by the dashed line.

Example 11

Figure 17:
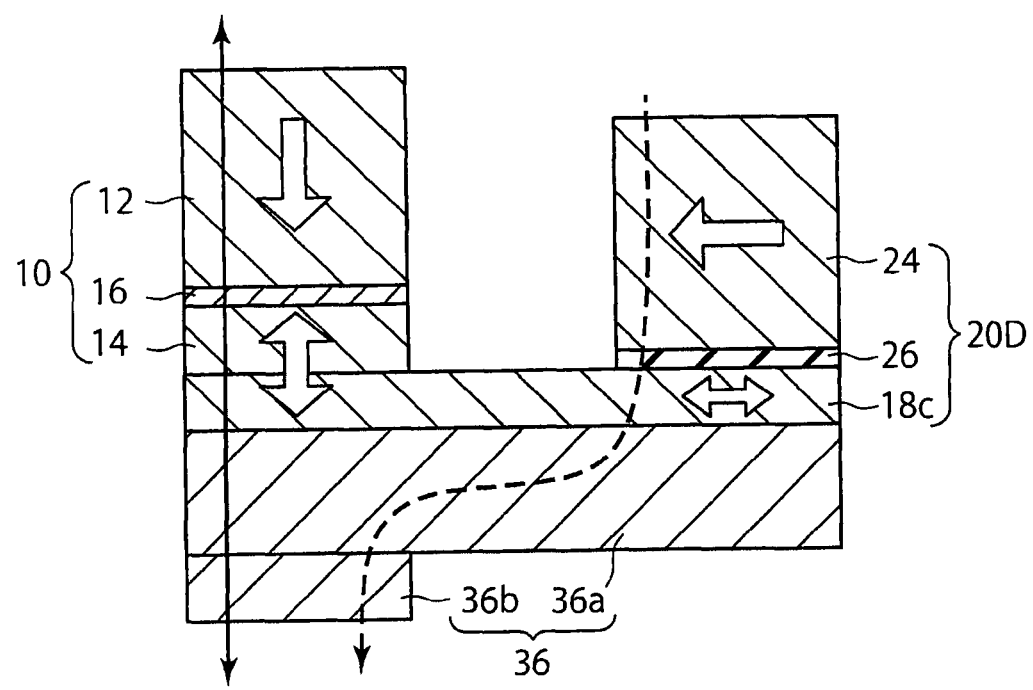
FIG. 17 is a cross-sectional view of a magnetoresistive device of Example 11.

FIG. 17 shows a magnetoresistive device according to Example 11. The magnetoresistive device of Example 11 is the same as the magnetoresistive device according to the modification of the first embodiment, except that the free layer of the GMR device 10 and the recording layer of a TMR device 20D are formed with a common magnetic layer (a recording layer) 18c. The GMR device 10 includes the fixed layer 12, the nonmagnetic layer 16, and the free layer 14. The TMR device 20D includes the recording layer 18c, the tunnel barrier layer 26, and the fixed layer 24. The free layer 14 of the GMR device 10 is provided on and in contact with the recording layer 18c of the TMR device 20D, and the recording layer 18c and the free layer 14 are magnetically coupled to each other. The magnetization directions of the magnetic layers 12 and 14 of the GMR device 10 are perpendicular to the film plane, and the magnetization directions of the magnetic layers 18c and 24 of the TMR device 20D are parallel to the film plane. Accordingly, the magnetization of the portion of the magnetic layer 18c located immediately below the GMR device 10 is in the same direction as the magnetization direction of the free layer 14, or is perpendicular to the film plane.

The interconnect layer 36 is formed on the surface of the recording layer 18c on the opposite side from the side on which the GMR device 10 is provided. The interconnect layer 36 includes an interconnect layer 36a in contact with the recording layer 18c, and an interconnect layer 36b formed on the surface of the interconnect layer 36a on the opposite side from the recording layer 18c. The area of the film plane of the interconnect layer 36b is equal to or smaller than the area of the film plane of the interconnect layer 36a.

In Example 11, when the magnetization of the free layer 14 of the GMR device 10 is changed by spin transfer torque writing, the magnetization of the portion of the recording layer 18c located immediately below the free layer 14 is also changed. The changed magnetic domain spreads into the TMR device 20D, and the magnetization of the recording layer 18c of the TMR device 20D is changed. In FIG. 17, the solid line indicates the write current, the dashed line indicates the read current, and the arrows indicate the magnetization directions. Alternatively, the read current can be flowed in the opposite direction from the direction indicated by the dashed line.

Example 12

Figure 18:
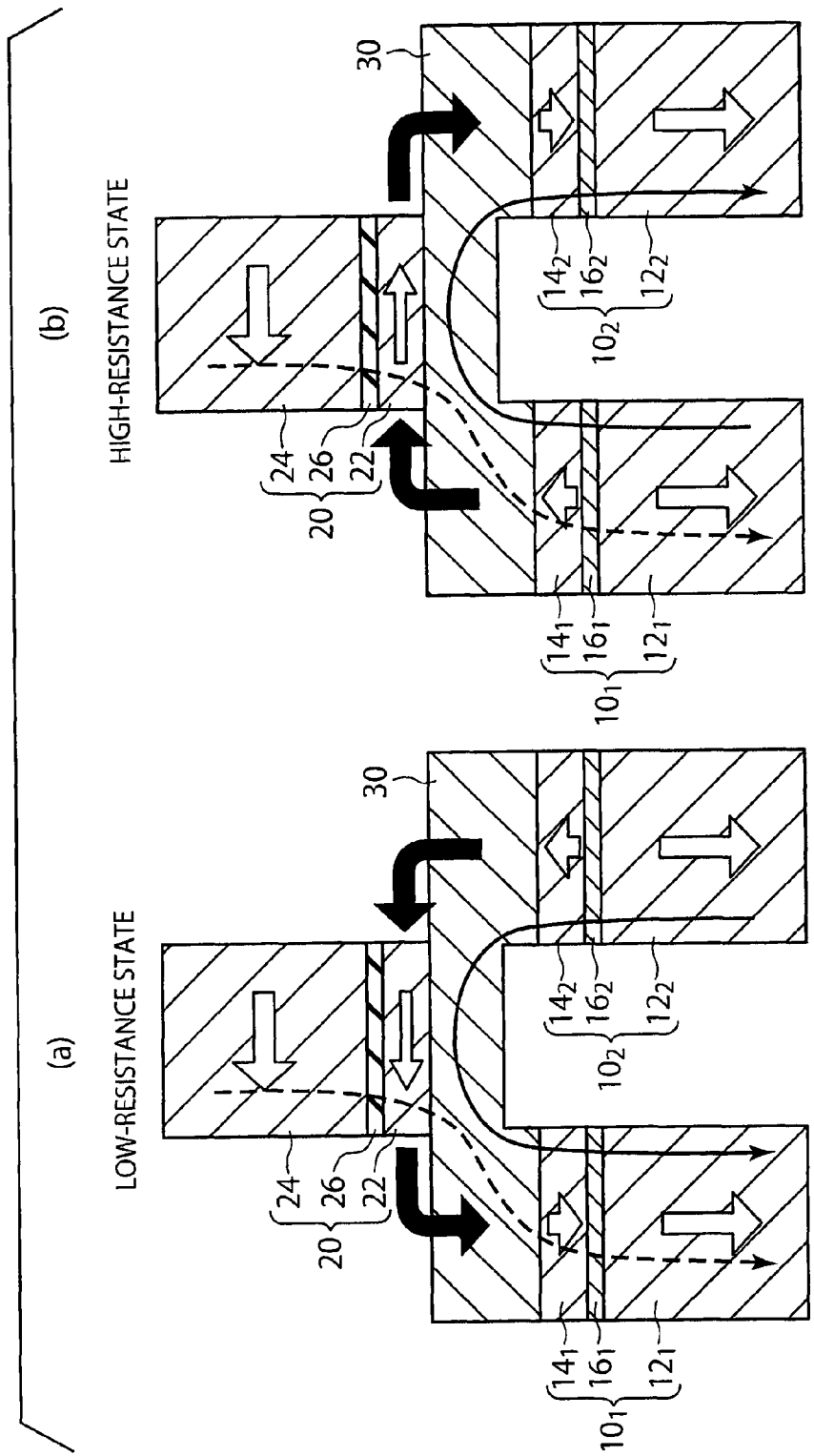
FIGS. 18($a$) and 18($b$) are cross-sectional views of a magnetoresistive device of Example 12.

Referring now to FIGS. 18(a) and 18(b), a magnetoresistive device according to Example 12 is described. This magnetoresistive device of Example 12 is the magnetoresistive device 1B of the third embodiment illustrated in FIG. 3. FIGS. 18(a) and 18(b) are diagrams showing the magnetization direction, write current, and read current in each magnetic layer in cases where the magnetoresistive device of Example 12 is in a low-resistance state and a high-resistance state, respectively. The solid lines indicate the write current, the dashed lines indicate the read current, and the arrows indicate the magnetization directions. In a case where the magnetoresistive device is in a high-resistance state, the magnetization directions of the recording layer 22 and the fixed layer 24 of the TMR device 20 are in an antiparallel state. In a case where the magnetoresistive device is in a low-resistance state, the magnetization directions of the recording layer 22 and the fixed layer 24 of the TMR device 20 are in a parallel state. It should be noted that, in FIGS. 18(a) and 18(b), the first and second select transistors 40 and 44 shown in FIG. 3 are not shown.

In Example 12, the GMR devices $10_1$ and $10_2$ are provided at a distance from each other on one of the surfaces of the interconnect layer 30, and the TMR device 20 is provided on the other surface of the interconnect layer 30. It should be noted that the TMR device 20 is preferably located in the region on the opposite side of the interconnect layer 30 from the region between the two GMR devices $10_1$ and $10_2$. The region between the two GMR devices $10_1$ and $10_2$ is concaved, as shown in FIGS. 18(a) and 18(b). That is, the film thickness of the interconnect layer 30 in the regions where the GMR devices $10_1$ and $10_2$ are provided is greater than the film thickness of the interconnect layer 30 in the region located between the GMR devices $10_1$ and $10_2$.

In Example 12, the magnetization direction of each magnetic layer of the GMR devices $10_1$ and $10_2$ is perpendicular to the film plane, and the magnetization directions of the magnetic layers 22 and 24 of the TMR device 20 are in the in-plane direction or are parallel to the film plane.

In Example 12, writing is performed by flowing current in the directions indicated by the arrows of the solid lines so that the current flows in the two GMR devices $10_1$ and $10_2$. The magnetizations of the free layers $14_1$ and $14_2$ are changed by the spin torques applied to the free layers $14_1$ and $14_2$ of the respective GMR devices $10_1$ and $10_2$. The magnetization of the recording layer 22 of the TMR device 20 is changed by the magnetic field leakage from the changed free layers $14_1$ and $14_2$. To put the TMR device 20 into a low-resistance state, a write current is flowed to the GMR device $10_1$ from the GMR device $10_2$ via the interconnect layer 30, as shown in FIG. 18(a). To put the TMR device 20 into a high-resistance state, a write current is flowed to the GMR device $10_2$ from the GMR device $10_1$ via the interconnect layer 30, as shown in FIG. 18(b).

In either case, in writing, the magnetization directions of the free layers $14_1$ and $14_2$ of the two GMR devices $10_1$ and $10_2$ are made antiparallel to each other, and the magnetization of the recording layer 22 of the TMR device 20 is changed so as to be parallel to the fixed layer 24 of the TMR device 20 by the magnetic field leakage from the free layers $14_1$ and $14_2$ made antiparallel to each other. Where the magnetization directions of the fixed layers $12_1$ and $12_2$ of the two GMR devices $10_1$ and $10_2$ are made parallel to each other, the spin torques applied to the free layers $14_1$ and $14_2$ are in the left and right directions opposite from each other. Accordingly, the magnetization directions of the free layers $14_1$ and $14_2$ of the two GMR devices $10_1$ and $10_2$ can be made antiparallel to each other. It should be noted that the magnetic field leakage directions are indicated by black arrows.

In Example 12, a closure magnetic field is formed by the GMR devices $10_1$ and $10_2$, the TMR device 20, and the magnetic field leakage, and the magnetization of the recording layer 22 is changed. To facilitate the magnetization reversal in the recording layer 22 of the TMR device 20, the magnetic fields leaking from the free layers $14_1$ and $14_2$ of the GMR devices $10_1$ and $10_2$ are preferably gathered into the recording layer 22 of the TMR device 20 with high efficiency. For example, a stacked structure formed by stacking a magnetic film having a relative permeability of 10 to 1000 and a nonmagnetic film (see FIG. 33(b) described below) is used as the interconnect layer 30. The nonmagnetic film is provided on the side of the free layers $14_1$ and $14_2$ of the GMR devices $10_1$ and $10_2$, and the magnetic film is provided on the side of the recording layer 22 of the TMR device 20. With this arrangement, the magnetic fields can be efficiently gathered. If the value of the relative permeability is too small, the magnetic field absorption rate becomes lower. If the value of the relative permeability is too large, the speed of response to magnetization becomes lower, and high-speed operations cannot be performed. For example, it is preferable to use a material such as NiFe, CoFeNi, or FeAlSi as the interconnect layer 30 with a magnetization.

The planar shape of the recording layer 22 is a shape such that the long axis and the short axis are the same. For example, the recording layer 22 is formed into a circular shape. With this arrangement, the shape anisotropy of the recording layer 22 is eliminated, and magnetization reversals can be facilitated. As magnetization reversals in the recording layer 22 are made easier, the magnetization switching magnetic field for reversing the magnetization of the recording layer 22 can be made smaller, and the magnetic fields leaking from the free layers $14_1$ and $14_2$ can be reduced. By reducing the magnetic fields leaking from the free layers $14_1$ and $14_2$, the product (Ms×t) of the saturation magnetization Ms and the film thickness t of each of the free layers $14_1$ and $14_2$ can be reduced. As a result, the write current can be reduced.

Reading from the magnetoresistive device of Example 12 is performed by flowing current between one of the GMR devices $10_1$ and $10_2$ and the TMR device 20, as indicated by the dashed lines in FIGS. 18(a) and 18(b). Alternatively, reading can be performed by flowing current between the TMR device 20 and the interconnect layer 30.

FIGS. 19(a) and 19(b) show a magnetoresistive device according to a modification of Example 12. FIGS. 19(a) and 19(b) are diagrams showing the magnetization direction, write current, and read current in each magnetic layer in cases where the magnetoresistive device of this modification is in a low-resistance state and a high-resistance state, respectively. The solid lines indicate the write current, the dashed lines indicate the read current, and the arrows indicate the magnetization directions. The magnetoresistive device of this modification is the same as the magnetoresistive device of Example 12, except that one of the two GMR devices $10_1$ and $10_2$, for example, the GMR device $10_2$, is replaced with a conductive layer 13. The conductive layer 13 is made of W (tungsten), for example. By changing the two GMR devices to one GMR device as in this modification, the write current required for changing the magnetized states of the free layer $12_1$ and the fixed layer $14_1$ from an antiparallel state to a parallel state by spin transfer torque writing can be reduced. The reasons for this will be described below.

Normally, when spin transfer torque writing is performed, the write current required for changing the magnetized states of a free layer and a fixed layer from a parallel state to an antiparallel state is larger than the write current required for changing the magnetized states from an antiparallel state to a parallel state. In Example 12, writing is performed by changing the magnetized state of one of the two GMR devices $10_1$ and $10_2$ from an antiparallel state to a parallel state, and changing the magnetized state of the other GMR device from a parallel state to an antiparallel state. Therefore, the write current is adjusted to the GMR device, of the two GMR devices, having its magnetized state from a parallel state to an antiparallel state. In Example 12, the two GMR devices have the same sizes, and are made of the same materials. Therefore, the write current does not vary with the magnetized state of the recording layer 22 of the TMR device 20, and has a constant value.

In the modification of Example 12, on the other hand, there is only one GMR device. Therefore, the write current required for changing the magnetized state from an antiparallel state to a parallel state can be made smaller than that in Example 12.

Figure 19:
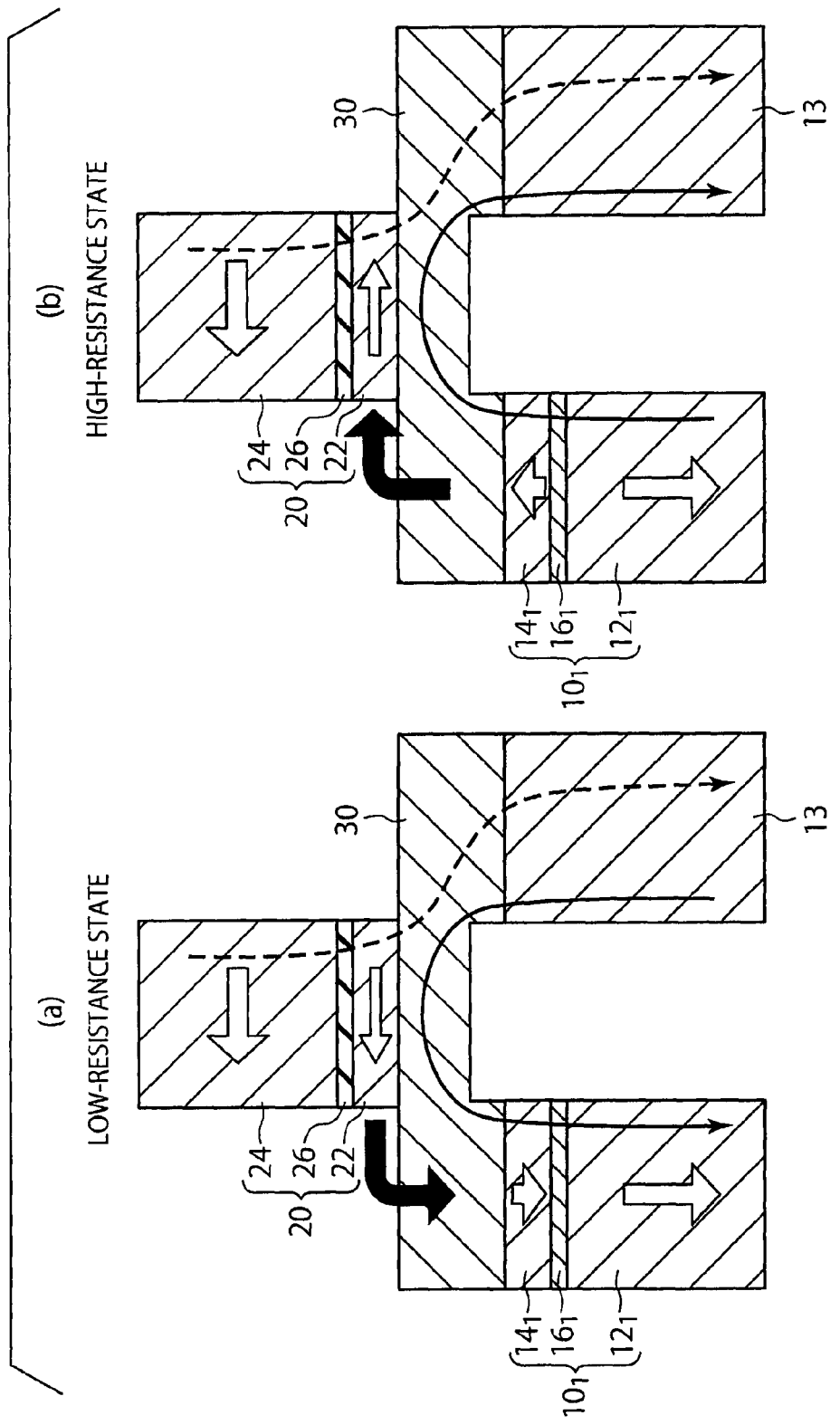
FIGS. 19($a$) and 19($b$) are cross-sectional views of a magnetoresistive device of Example 12.

In this modification, reading is preferably performed by flowing current to the conductive layer 13 from the TMR device 20, as shown in FIG. 19. This modification also differs from Example 12 in this aspect. In this manner, influence of disturbances at the time of reading can be reduced.

Example 13

Figure 20:
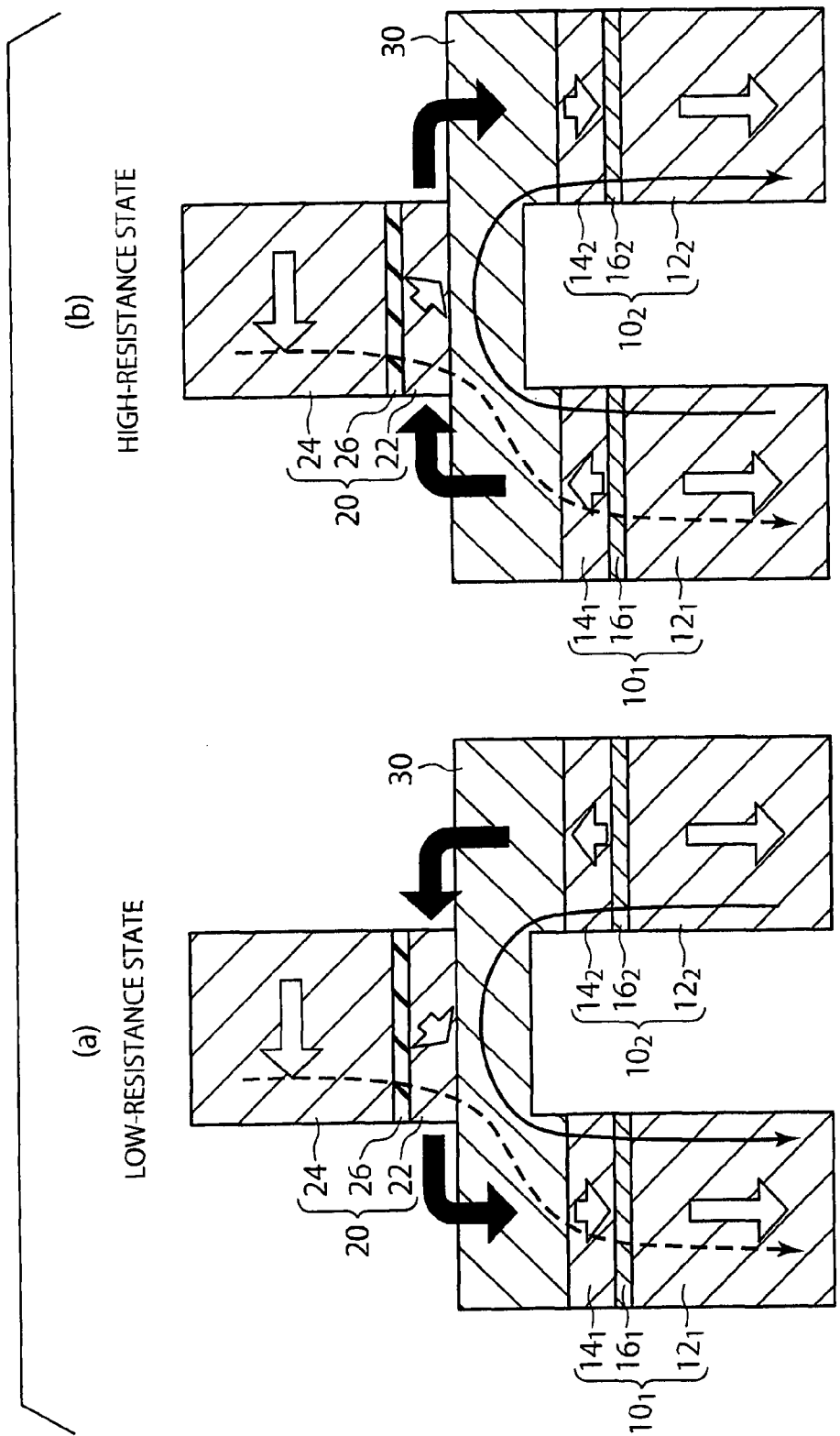
FIGS. 20($a$) and 20($b$) are cross-sectional views of a magnetoresistive device of Example 13.

Referring now to FIGS. 20(a) and 20(b), a magnetoresistive device according to Example 13 is described. FIGS. 20(a) and 20(b) are diagrams showing the magnetization direction, write current, and read current in each magnetic layer in cases where the magnetoresistive device of Example 13 is in a low-resistance state and a high-resistance state, respectively. The solid lines indicate the write current, the dashed lines indicate the read current, and the arrows indicate the magnetization directions. It should be noted that, in FIGS. 20(a) and 20(b), the first and second select transistors 40 and 44 shown in FIG. 3 are not shown.

In Example 12 illustrated in FIGS. 18(a) and 18(b), the magnetization of the recording layer 22 of the TMR device 20 is parallel to the film plane. The magnetoresistive device of Example 13 differs from the magnetoresistive device of Example 12 in that the recording layer 22 of the TMR device 20 has perpendicular magnetic anisotropy. However, the perpendicular magnetic anisotropy of the recording layer 22 of the TMR device 20 is weak, and is designed to satisfy the relationship, $2\pi Ms^2 > Ms \times Hk/2$. Here, Ms represents the saturation magnetization of the recording layer 22, and Hk represents the perpendicular magnetic anisotropy field. As in Example 12, the fixed layer 24 of the TMR device 20 has in-plane anisotropy.

When writing is performed to form the low-resistance state illustrated in FIG. 20(a), current is flowed to the GMR device $10_1$ from the GMR device $10_2$ via the interconnect layer 30. By doing so, the magnetization of the free layer $14_2$ of the GMR device $10_2$ is directed upward due to the influence of a spin-injection torque, and the magnetization of the free layer $14_1$ of the GMR device $10_1$ is directed downward due to the influence of a spin-accumulation torque. That is, the magnetizations of the free layers $14_1$ and $14_2$ of the GMR devices $10_1$ and $10_2$ are in the opposite directions from each other. Accordingly, the magnetic field formed by the two free layers $14_1$ and $14_2$ and indicated by the black arrows is applied to the recording layer 22 of the TMR device 20, and the magnetization of the recording layer 22 having perpendicular magnetic anisotropy is obliquely directed to the left.

On the other hand, when writing is performed to form the high-resistance state illustrated in FIG. 20(b), the write current indicated by the solid line is flowed in the opposite direction from the direction in the case illustrated in FIG. 20(a), so that the magnetizations of the free layers $14_1$ and $14_2$ of the GMR devices $10_1$ and $10_2$ rotate in the opposite directions from each other. Accordingly, the magnetic field formed by the two free layers $14_1$ and $14_2$ and indicated by the black arrows is formed in the opposite direction from the direction shown in FIG. 20(a), and the magnetization of the recording layer 22 of the TMR device 20 is obliquely directed to the right. The variation of the angle between the magnetization of the recording layer 22 obliquely directed to the left or right and the magnetization of the fixed layer 24 is read as the resistance difference by using the TMR effect. In this manner, reading is performed. It should be noted that the read current is indicated by the dashed lines. In FIGS. 20(a) and 20(b), the read current is flowed to one of the two GMR devices, or the GMR device $10_1$, for example, from the TMR device 20 via the interconnect layer 30. However, the read current can be flowed in the opposite direction, or can be flowed to the TMR device 20 from the GMR device $10_1$ via the interconnect layer 30.

Example 14

Figure 21A:
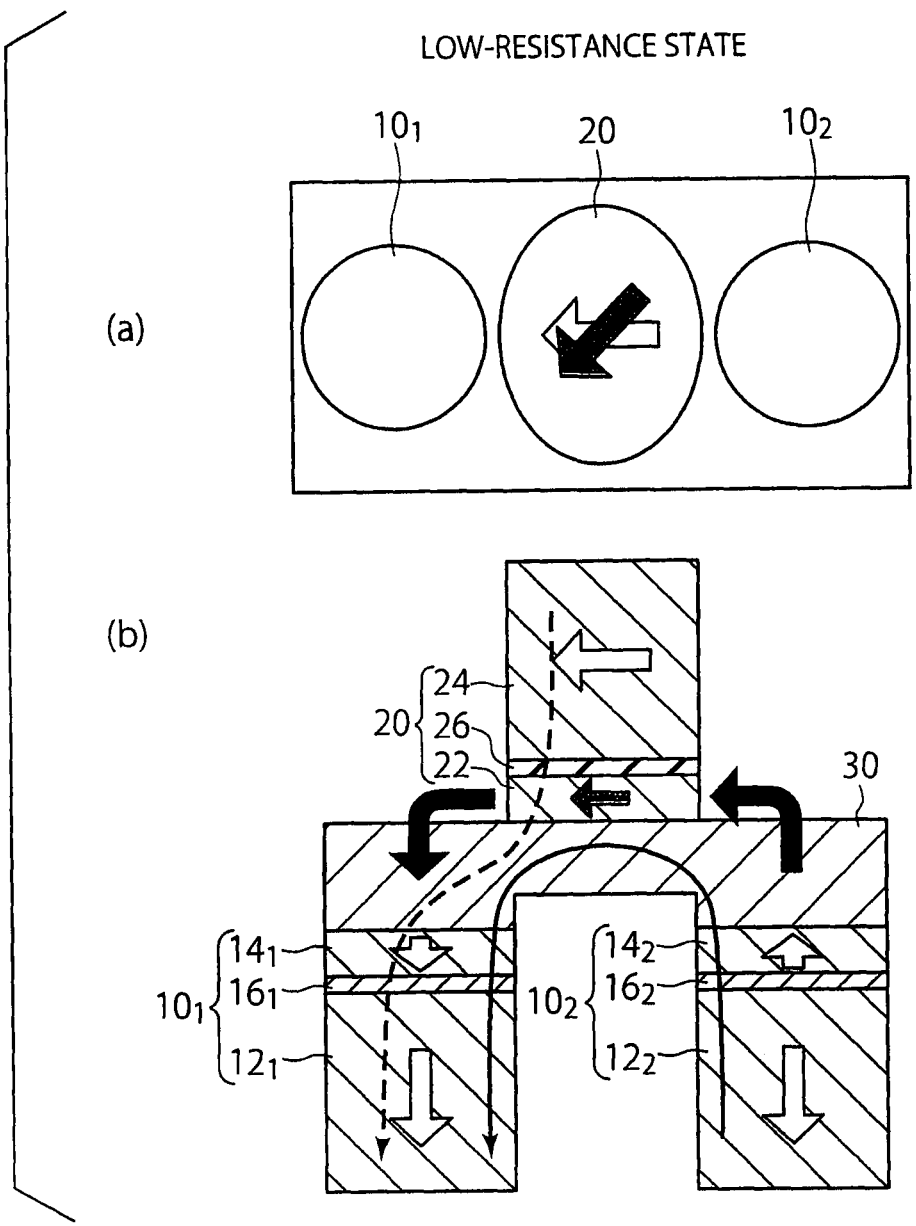
FIGS. 21A($a$) and 21A($b$) are a plan view and a cross-sectional view of a magnetoresistive device of Example 14, respectively.
Figure 21B:
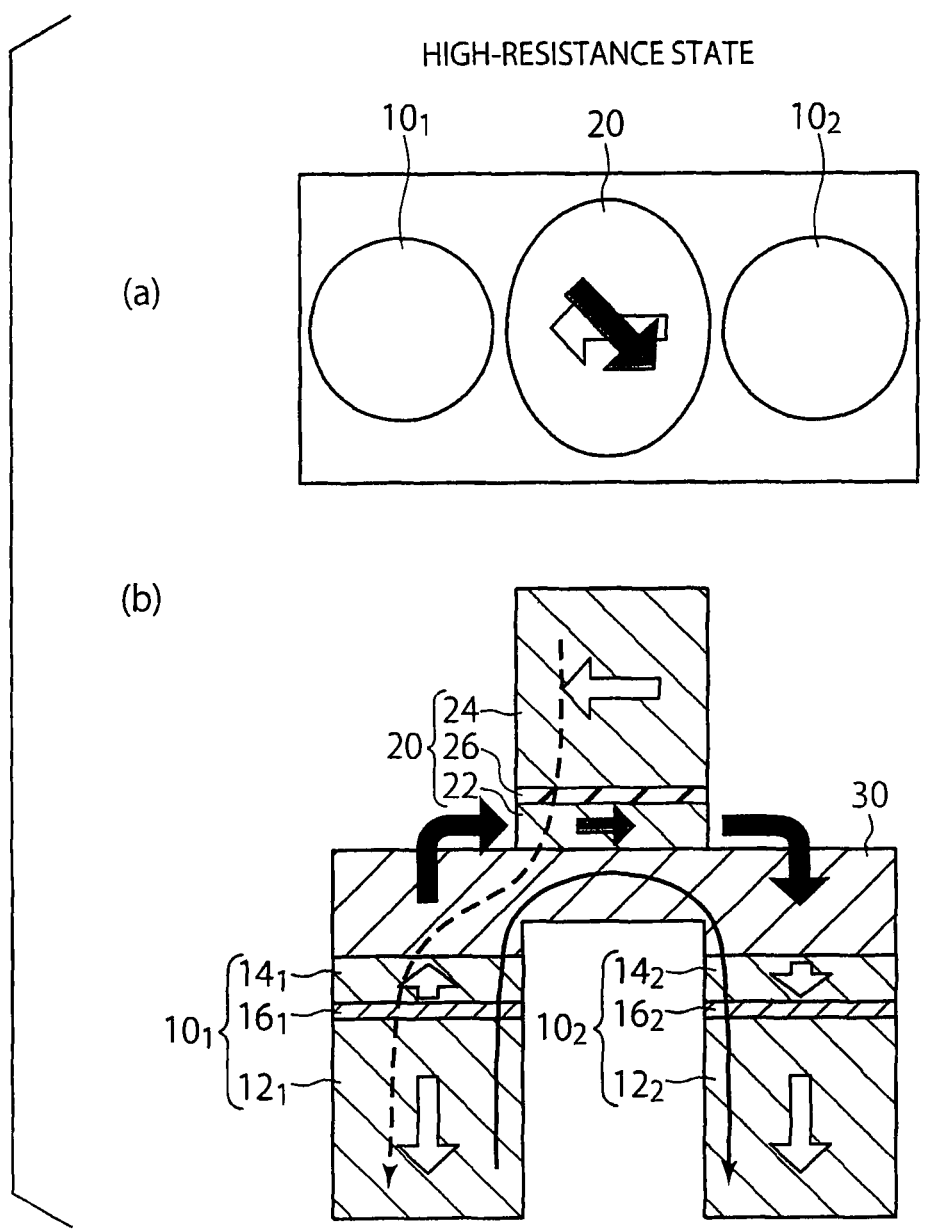
FIGS. 21B($a$) and 21B($b$) are a plan view and a cross-sectional view of a magnetoresistive device of Example 14, respectively.

Referring now to FIGS. 21A(a) through 21B(b), a magnetoresistive device according to Example 14 is described. FIGS. 21A(a) and 21A(b) show a plan view and a cross-sectional view of the magnetoresistive device of Example 14 in a low-resistance state. FIGS. 21B(a) and 21B(b) show a plan view and a cross-sectional view of the magnetoresistive device of Example 14 in a high-resistance state. In FIGS. 21A(a) through 21B(b), the solid lines indicate the write current, the dashed lines indicate the read current, and the arrows indicate the magnetization directions in the respective magnetic layers.

The magnetoresistive device of Example 14 differs from the magnetoresistive device of Example 12 illustrated in FIGS. 18(a) and 18(b) in the magnetization direction of the recording layer 22 of the TMR device 20. In Example 14, the magnetization of the recording layer 22 and the magnetization of the fixed layer 24 of the TMR device 20 are in in-plane directions, and the magnetization of the recording layer 22 is perpendicular to the magnetization of the fixed layer 24. The magnetization of the fixed layer 24 is parallel to the direction connecting the two GMR devices $10_1$ and $10_2$ (FIGS. 21A(a) and 21B(a)), and the easy axis of magnetization of the recording layer 22 is perpendicular to the magnetization of the fixed layer 24.

The TMR device 20 in which the easy axes of magnetization of the recording layer 22 and the fixed layer 24 are perpendicular to each other is formed in the following manner. The fixed layer 24 is formed on the tunnel barrier layer 26 made of MgO, and is formed with IrMn(15)/CoFe(3)/Ru (0.8)/CoFeB(2.5). Here, "/" indicates the stacking sequence, and means that each left-side layer is formed on the layer shown on its right side. The numerical values in the brackets indicate film thicknesses in nanometers. The fixed layer 24 pins the magnetization direction of the film stack formed with CoFe(3)/Ru(0.8)/CoFeB(2.5), using the antiferromagnetic coupling caused by the IrMn(15). The magnetizations of the CoFe(3) and CoFeB(2.5) of the film stack form synthetic antiferromagnetic coupling via the Ru(0.8), so that the magnetic field leaking from the fixed layer 24 to the recording layer 22 can be reduced. The pinning of the magnetization of the fixed layer 24 using IrMn is performed during the film forming process in a magnetic field or during the heat treatment in a magnetic field after the film formation.

Meanwhile, the easy axis of the recording layer 22 uses shape magnetic anisotropy. The recording layer 22 is formed below the MgO tunnel barrier layer 26, and is formed with CoFeB(3). An ellipsoidal structure having a length L of 50 nm in the direction perpendicular to the direction connecting the two GMR devices $10_1$ and $10_2$, and has a width W of 30 nm in the direction parallel to the GMR device connecting direction is formed in the film-plane direction. The magnetization of the recording layer 22 has an easy axis of magnetization in the longitudinal direction due to the difference between the demagnetizing factors in the longitudinal direction and the width direction. The magnetization direction of the recording layer 22 is in a direction such that the sum of the shape magnetic anisotropy energy given by the shape magnetic anisotropy and the Zeeman energy given by the magnetic field formed by the two GMR devices $10_1$ and $10_2$ becomes smallest. The magnetization direction of the recording layer 22 is indicated by the gray arrows. It should be noted that the magnetization directions of the fixed layer 24 of the TMR device 20 and the respective magnetic layers of the GMR devices $10_1$ and $10_2$ are indicated by the white arrows.

The magnetization of the recording layer 22 is oriented in an oblique direction by the shape anisotropy and the external magnetic field formed by the free layers $14_1$ and $14_2$ of the two GMR devices $10_1$ and $10_2$. Where $H_d$ represents the magnetic field formed by the free layers $14_1$ and $14_2$ of the two GMR devices $10_1$ and $10_2$, $H_L$ represents the demagnetizing factor in the longitudinal direction of the recording layer 22, and $H_W$ represents demagnetizing factor in the width direction of the recording layer 22, the magnetization of the recording layer 22 can be formed in an oblique direction if $H_d Ms > (H_W - H_L) \times 2\pi Ms^2$ is satisfied.

Writing is performed in the following manner. First, in a case where writing is performed to achieve the low-resistance state illustrated in FIG. 21A(b), current is flowed to the GMR device $10_1$ from the GMR device $10_2$ via the interconnect layer 30. As a result, the magnetization of the free layer $14_2$ of the GMR device $10_2$ is directed upward due to the influence of the spin-injection torque. The magnetization of the free layer $14_1$ of the GMR device $10_1$ is directed downward due to the influence of the spin-accumulation torque. The magnetizations of the free layers $14_1$ and $14_2$ of the GMR devices $10_1$ and $10_2$ are oriented in the opposite directions from each other. Therefore, the magnetic field formed by the two free layers $14_1$ and $14_2$ and indicated by the black arrows is applied to the recording layer 22 of the TMR device 20, and the magnetization of the recording layer 22 of the TMR device 20 is obliquely directed to the left.

In a case where writing is performed to achieve the high-resistance state illustrated in FIG. 21B(b), write current indicated by the solid lines is flowed in the opposite direction from that in the case illustrated in FIG. 21A(b). As a result, the magnetizations of the free layers $14_1$ and $14_2$ of the GMR devices $10_1$ and $10_2$ rotate in the opposite directions from each other, and the magnetic field formed by the two free layers $14_1$ and $14_2$ and indicated by the black arrows is in the opposite direction from that in the case illustrated in FIG. 21A(a). Therefore, the magnetization of the recording layer 22 of the TMR device 20 is obliquely directed.

The variation of the angle between the magnetization of the recording layer 22 obliquely directed to the left or right and the magnetization of the fixed layer 24 is read as the resistance difference by using the TMR effect. In this manner, reading is performed. Since the magnetization direction of the recording layer 22 of the TMR device 20 is determined by the magnetic field formed by the free layers $14_1$ and $14_2$ of the two GMR devices $10_1$ and $10_2$, the information recording portions are the free layers $14_1$ and $14_2$ of the two GMR devices $10_1$ and $10_2$. The recording layer 22 of the TMR device 20 can also be called a free layer that reads the information recorded in the free layers $14_1$ and $14_2$ of the two GMR devices $10_1$ and $10_2$. The rotation of the magnetization of the recording layer 22 of the TMR device 20 that reads high-resistance information and low-resistance information is made smaller, so that a small external magnetic field can be read out. Accordingly, the saturation magnetizations Ms of the free layers $14_1$ and $14_2$ of the GMR devices $10_1$ and $10_2$ can be made smaller. A decrease in the saturation magnetizations Ms of the free layers $14_1$ and $14_2$ of the GMR devices $10_1$ and $10_2$ contributes to an increase in the writing speed.

Example 15

Figure 22:
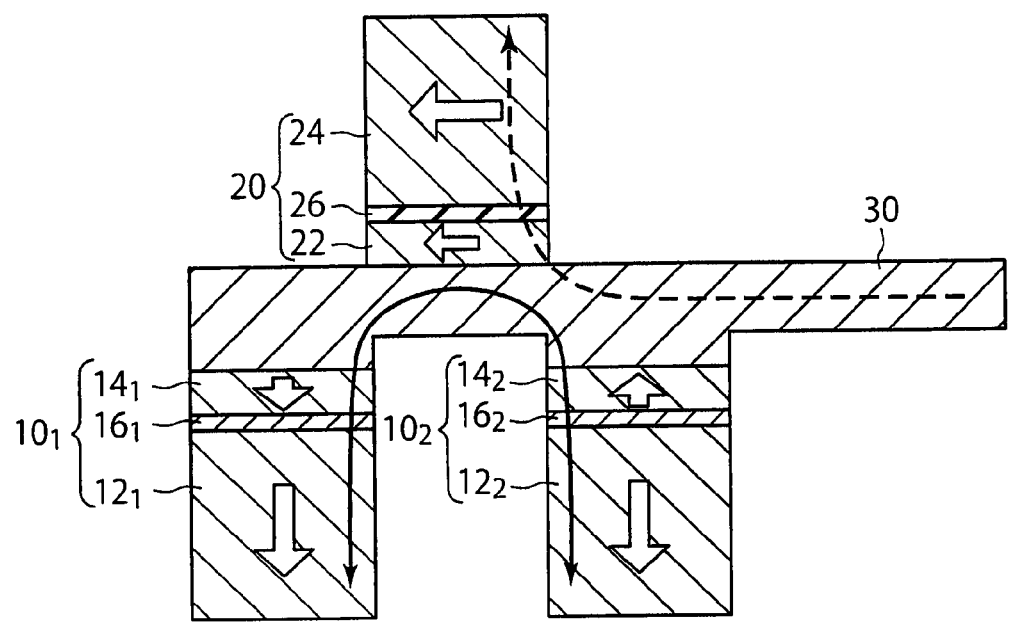
FIG. 22 is a cross-sectional view of a magnetoresistive device of Example 15.

FIG. 22 shows a magnetoresistive device according to Example 15. The magnetoresistive device of Example 15 is the same as the magnetoresistive device of Example 12 illustrated in FIGS. 18(a) and 18(b), except that the interconnect layer 30 is longer, and another terminal is provided on the interconnect layer 30 to obtain an electric connection to the outside. In Example 12, two terminals are electrically connected to the fixed layers $12_1$ and $12_2$ of the GMR devices $10_1$ and $10_2$, and a terminal is electrically connected to the fixed layer 24 of the TMR device 20. In total, three terminals are provided. In Example 15, a terminal is provided on the interconnect layer 30, and there are four terminals in total.

In Example 12 illustrated in FIGS. 18(a) and 18(b), the read current flows in one of the two GMR devices, or in the GMR device $10_1$, for example. Therefore, a spin torque is applied to the free layer $14_1$ of the GMR device $10_1$. As a result, the magnetization of the free layer 14₁ is disturbed by the read current. As the magnetization of the free layer 14₁ is changed due to the read current, the leak magnetic field formed by the two GMR devices 10₁ and 10₂ is changed, and the magnetic field to be applied to the recording layer 22 of the TMR device 20 is changed. As a result of this, the magnetization of the recording layer 22 is disturbed, and the record retention energy is degraded.

Therefore, in Example 15, four terminals are provided as the measure against degradation of the record retention energy of the recording layer 22 due to the read current. Where the read current does not pass through the GMR device 10₁ and flows only in the TMR device 20 as in Example 15, magnetization reversals in the free layer 14₁ of the GMR device 10₁ are prevented, and a magnetoresistive device having a tolerance to read disturbances can be formed.

Example 16

Figure 23:
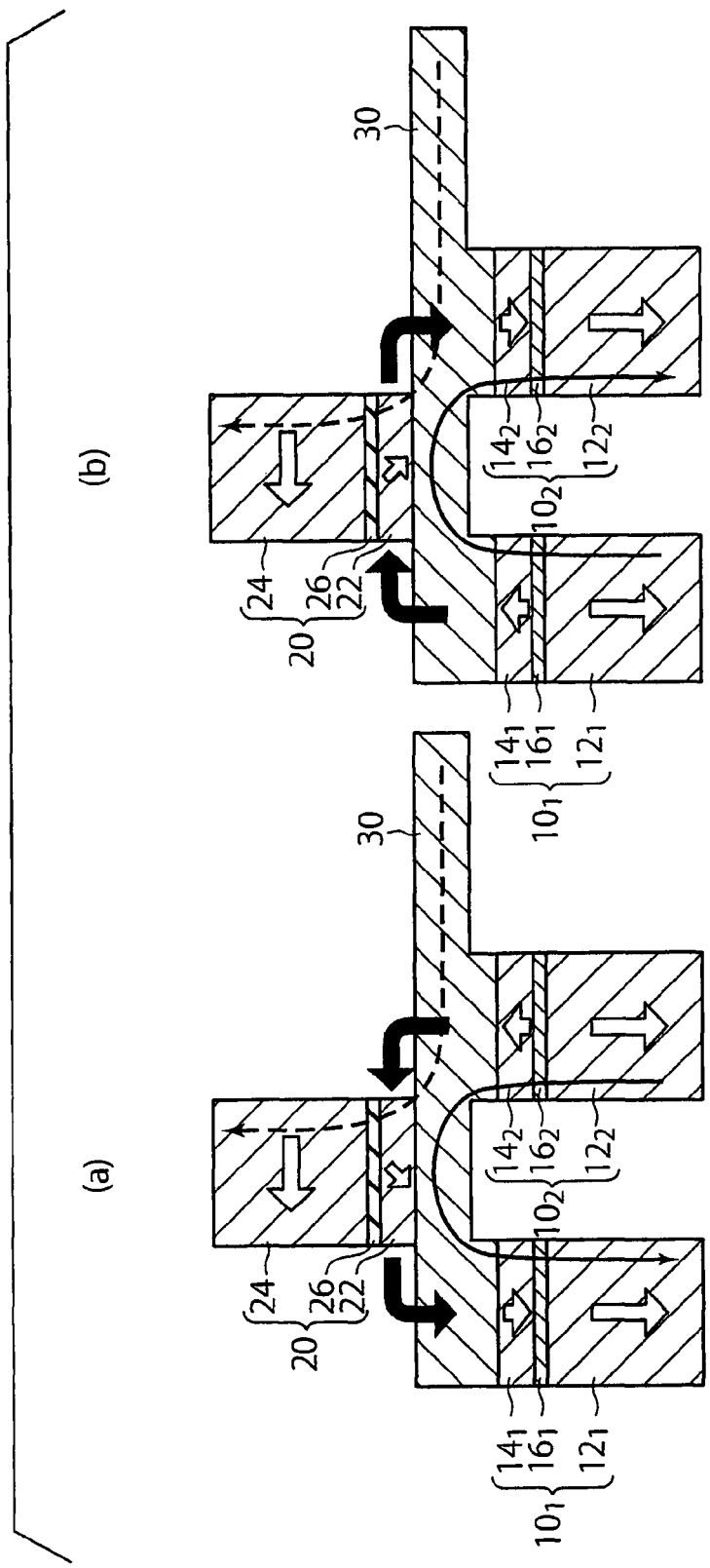
FIGS. 23($a$) and 23($b$) are a plan view and a cross-sectional view of a magnetoresistive device of Example 16, respectively.

Referring now to FIGS. 23(a) and 23(b), a magnetoresistive device according to Example 16 is described. The magnetoresistive device of Example 16 differs from the magnetoresistive device of Example 15 illustrated in FIG. 22 in that the recording layer 22 of the TMR device 20 has perpendicular anisotropy. However, the perpendicular magnetic anisotropy of the recording layer 22 of the TMR device 20 is weak, and is designed to satisfy the relationship, $2\pi Ms^2 > Ms \times Hk/2$. Here, Ms represents the saturation magnetization of the recording layer 22, and Hk represents the perpendicular magnetic anisotropy field. As in Example 15, the fixed layer 24 of the TMR device 20 has in-plane anisotropy.

When writing is performed to form the state illustrated in FIG. 23(a), current is flowed to the GMR device 10₁ from the GMR device 10₂ via the interconnect layer 30 (see the arrow of the solid line). By doing so, the magnetization of the free layer 14₂ of the GMR device 10₂ is directed upward due to the influence of a spin-injection torque, and the magnetization of the free layer 14₁ of the GMR device 10₁ is directed downward due to the influence of a spin-accumulation torque. The magnetizations of the free layers 14₁ and 14₂ of the GMR devices 10₁ and 10₂ are in the opposite directions from each other. Accordingly, the magnetic field formed by the two free layers 14₁ and 14₂ and indicated by the black arrows is applied to the recording layer 22 of the TMR device 20, and the magnetization of the recording layer 22 of the TMR device 20 having perpendicular magnetic anisotropy is obliquely directed to the left.

On the other hand, when writing is performed to form the state illustrated in FIG. 23(b), current is flowed to the GMR device 10₂ from the GMR device 10₁ via the interconnect layer 30 (see the arrow of the solid line). As a result of this, the magnetizations of the free layers 14₁ and 14₂ of the GMR devices 10₁ and 10₂ rotate in the opposite directions from each other, and the magnetic field formed by the two free layers 14₁ and 14₂ and indicated by the black arrows is formed in the opposite direction from the direction shown in FIG. 23(a). The magnetization of the recording layer 22 of the TMR device 20 is obliquely directed to the right. The variation of the angle between the magnetization of the recording layer 22 obliquely directed to the left or right and the magnetization of the fixed layer 24 is read as the resistance difference by using the TMR effect. In this manner, reading is performed.

Example 17

Figure 24A:
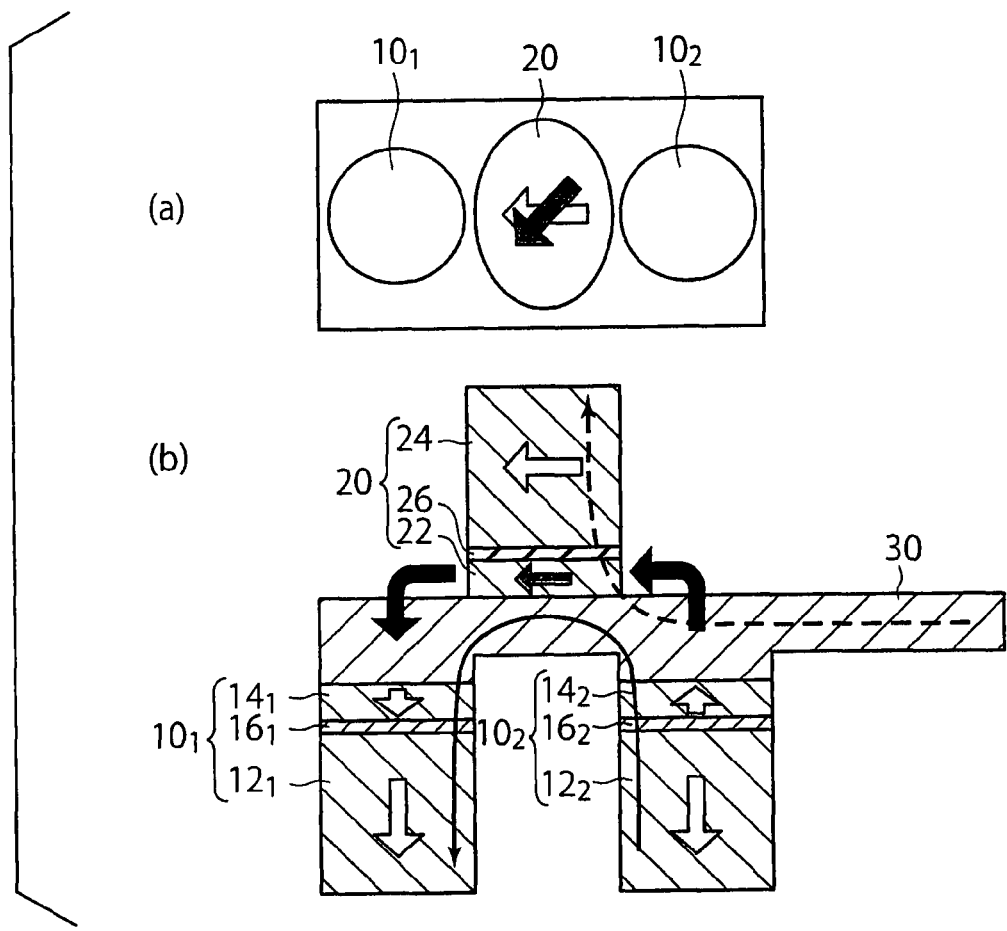
FIGS. 24A($a$) and 24A($b$) are a plan view and a cross-sectional view of a magnetoresistive device of Example 17, respectively.
Figure 24B:
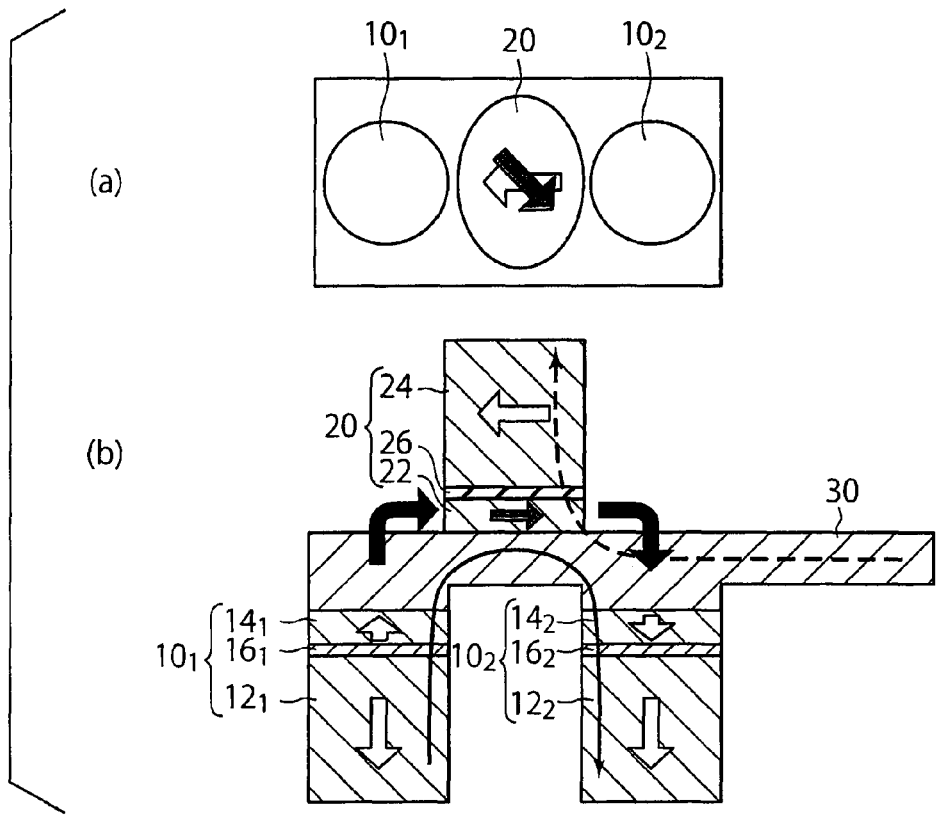
FIGS. 24B(a) and 24B(b) are a plan view and a cross-sectional view of a magnetoresistive device of Example 17, respectively.

Referring now to FIGS. 24A(a) through 24B(b), a magnetoresistive device according to Example 17 is described. The magnetoresistive device of Example 17 is the same as the magnetoresistive device of Example 14, except that the interconnect layer 30 is longer and four terminals are provided as in Example 15. The operating principles are the same as those of the magnetoresistive device of Example 14 illustrated in FIGS. 21A(a) through 21B(b).

It should be noted that the same effects as above can be achieved by replacing the GMR device with a TMR device in any of the magnetoresistive devices of Example 3, Example 4, Example 5, and Examples 7 through 17. In that case, the electric resistance $R_1$ of the TMR device for performing writing and the electric resistance $R_2$ of the TMR device for performing reading are made to satisfy the relationship, $R_1 < R_2$. With this arrangement, the amount of current at the time of writing can be increased, and high-speed writing can be performed.

In Examples 1 through 4, Example 8, and Examples 12 through 17, the magnetization of the GMR device is changed by a spin torque, and the magnetization of the TMR device is changed by the magnetostatic coupling between the GMR device and the TMR device due to the leaking magnetic field. In spin transfer torque writing, the film thickness of the free layer is preferably thin, to restrain spin torque decreases due to spin relaxation. In magnetic-field writing, the film thickness of the free layer is preferably great, since the Zeeman energy can be expressed as a multiplication of the saturation magnetization and the magnetic field. Where $t_1$ represents the film thickness of the free layer of the GMR device and $t_2$ represents the film thickness of the recording layer of the TMR device, the relationship, $t_1 < t_2$, is preferably satisfied.

Figure 25:
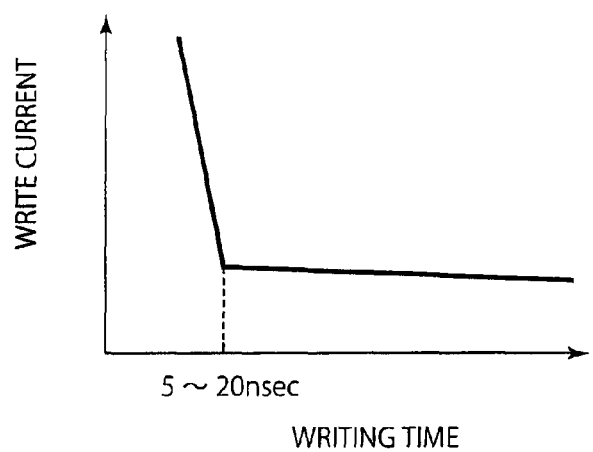
FIG. 25 is a graph showing the relationship between the writing time and the write current.

FIG. 25 shows the relationship between the writing time and the write current. If the writing time is 5 to 20 nanoseconds or shorter, the writing speed normally becomes higher than that of the magnetization precession, and exceeds the magnetization switching speed. Writing can be effectively performed at a higher speed than the magnetization switching speed by increasing the write current and the spin torque as shown in FIG. 25. In a case where writing is to be performed in 3 nanoseconds on a free layer having a magnetization switching speed (a natural resonance speed) of 10 nanoseconds, for example, a write current approximately twice as high as 10 nanoseconds is flowed to achieve a magnetization reversal.

If the write current is increased in the TMR device, on the other hand, the electric field to be applied to the tunnel barrier layer increases. When the electric field exceeds a certain voltage, insulation breakdown occurs. For example, in a MgO tunnel barrier layer that can achieve a high MR, the areal resistance RA is approximately 10 $\Omega m^2$. Therefore, when a voltage higher than 1 V is applied to the tunnel barrier layer, insulation breakdown occurs. Also, an increase in the write voltage causes an increase in power consumption, resulting in an electric field concentration due to high integration. This presents serious problems in achieving a reduction in the power consumption and realization of a large-capacity RAM.

Since the resistance of the GMR device is lower than that of the TMR device by several digits, the above problems can be solved by performing writing with the GMR device. However, the variation in the resistance of the GMR device is smaller than that of the TMR device by several digits. Therefore, it is preferable to use the TMR device to achieve a higher read output.

As described above, if a magnetoresistive device that includes a GMR device and a TMR device, and has a three-terminal or four-terminal structure as in each embodiment is used, high-speed writing can be performed, and at the same time, a low power consumption can be achieved.

Also, as the above GMR device, a GMR device having the nonmagnetic layer 16 replaced with a spin filter can be used. By using a GMR device having a spin filter, the write current can be reduced. To reduce the write current, the spin polarizability of the conduction electrons at the time of conduction in the magnetic layers of the GMR device is preferably high. This is based not on the spin polarizability of a conventional density of states (DOS), but on the fact that the spin polarizability of injected conduction electrons is high when the spin polarizability of the conduction electrons actually flowing in the GMR device is high.

The material of the spin filter of the GMR device for realizing such a situation is preferably an iron oxide having a spinel structure or a NaCl crystalline structure. Particularly, an iron oxide having a NaCl crystalline structure is more preferable.

In view of the DOS, there are materials known to have high spin polarizabilities among the iron oxides having spinel structures. However, a high spin polarizability in the conduction electrons can be realized with a NaCl type iron oxide that is not known to have a high spin polarizability in the conventional sense to realize a high spin polarizability in the conduction electrons.

Since such a material is in the form of a very thin layer, the magnetization direction of an entire magnetic layer formed with a film stack of layers can be a film in-plane magnetization direction or a magnetization direction perpendicular to the film plane, depending on the magnetization direction of the other magnetic layer formed by stacking films.

Referring now to FIGS. 26(a) through 29(b), a method of manufacturing the magnetoresistive device of Example 5 illustrated in FIG. 11 is described. FIGS. 26(a) through 29(b) are cross-sectional views showing a specific example of the method of manufacturing the magnetoresistive device of Example 5.

First, a 10-nm thick CoPt layer is stacked as the perpendicular magnetization film to be the fixed layer 12, and a 5-nm thick Ag layer is stacked as the nonmagnetic layer 16 on a substrate (not shown) having select transistors and a lower interconnect formed thereon (FIG. 26(a)). By using photolithography and Ar ion etching, patterning is performed on the Ag layer 16 and the CoPt layer 12. After that, a 1-nm thick MgO layer 70 and a 20-nm thick $SiO_2$ film 72 are stacked to cover the Ag layer 16 and the CoPt layer 12 (FIG. 26(b)).

By using CMP (Chemical Mechanical Polishing), the $SiO_2$ film 72 is then flattened so as to expose the surface of the Ag layer 16 (FIG. 27(a)). After that, a film stack of CoFeB(1)/CoPd(1) to be the recording layer 18 is formed. Here, the layer on the left side of the symbol "/" is the upper layer, and the layer on the right side is the lower layer. The numerical values shown in the brackets indicate film thicknesses (nm). A 1-nm thick MgO layer is then formed as the tunnel barrier layer 26, and a film stack of CoPt(10)/CoFeB(1) is formed as the fixed layer 24. Ta (10) is then formed as a cap layer 74 (FIG. 27(b)).

By using photolithography and Ar ion etching, patterning is then performed on the cap layer 74 and the fixed layer 24, and the remaining cap layer 74 and the remaining fixed layer 24 are positioned on the fixed layer 12 and the nonmagnetic layer 16 (FIG. 28(a)). To erase the magnetization of a portion 18a of the recording layer 18 in the region 76 from which the fixed layer 24 has been removed, an additive material is implanted into the portion 18a of the recording layer 18 in the region 76. The additive material can be nitrogen, oxygen, phosphorus, arsenic, antimony, or the like. After that, a heat treatment is performed at 350° C. In this manner, the additive material is diffused in the portion 18a of the recording layer 18 in the region 76, and the magnetization of the region 76 is erased (FIG. 28(b)). The region 18a in which magnetization has been erased is used as the interconnect layer 36 shown in FIG. 11. It should be noted that, through the heat treatment performed in the process of FIG. 28(b), the magnetization of the fixed layer 12 of the GMR device 10 is made antiparallel to the magnetization of each adjacent fixed layer so that the entire leak magnetic field can be reduced.

A 10-nm thick SiN film 78 and a 50-nm thick $SiO_2$ film 80 are then stacked (FIG. 29(a)). By using photolithography, RIE (Reactive Ion Etching) with a fluorine gas, and Ar ion etching, etching is performed on the $SiO_2$ film 80, the SiN film 78, and the tunnel barrier layer 26 and the demagnetized recording layer in the region 76. After a 100-nm thick $SiO_2$ film 82 is deposited, flattening is performed on the $SiO_2$ film 82 by a CMP process (FIG. 29(b)). The perpendicular magnetization film 12 and the nonmagnetic layer 16 formed in the right-side half of FIG. 29(b) are used as an interconnect layer. Select transistors are connected to lower portions of the left and right fixed layers 12 and nonmagnetic layers 16, and an interconnect is connected to an upper portion of the TMR device. The perpendicular magnetization film 12 and the nonmagnetic layer 16 on the right side can be replaced with a nonmagnetic interconnect made of W, Mo, or the like. At last, a magnetic field is applied so that the magnetizations of the upper and lower fixed layers 12 and 24 having the recording layer 18 interposed in between become antiparallel to each other, and the leak magnetic field to be applied to the recording layer 18 from the fixed layers 12 and 24 is reduced. If the magnetic field leaking from the fixed layers 12 and 24 cannot be reduced, a perpendicular magnetization film having a magnetization in the opposite direction from the magnetization direction of the corresponding fixed layer can be provided on the fixed layer 24 of the TMR device or below the fixed layer of the GMR device 12, to reduce the leak magnetic field to be applied to the recording layer 18.

Referring now to FIGS. 30(a) through 33(b), a method of manufacturing the magnetoresistive device of Example 12 illustrated in FIGS. 18(a) and 18(b) is described. FIGS. 30(a) through 33(b) are cross-sectional views showing a specific example of the method of manufacturing the magnetoresistive device of Example 12.

First, a 10-nm thick CoPt layer as the perpendicular magnetization film to be the fixed layer 12, a 5-nm thick Ag layer as the nonmagnetic layer 16, a 1.5-nm thick CoPd layer as the perpendicular magnetization film to be the free layer 14, and a W or Mo film to be the first interconnect film 30a to be the lower film of the interconnect layer 30 are stacked on a substrate (not shown) having select transistors and a lower interconnect formed thereon (FIG. 30(a)). By using photolithography and Ar ion etching, patterning is performed on the first interconnect film 30a, the CoPd layer 14, the Ag layer 16, and the CoPt layer 12, to form the two GMR devices. After that, a 1-nm thick MgO layer 70 and a 20-nm thick $SiO_2$ film 72 are stacked to cover the first interconnect film 30a, the CoPd layer 14, the Ag layer 16, and the CoPt layer 12 (FIG. 30(b)).

By using CMP (Chemical Mechanical Polishing), the $SiO_2$ film 72 is then flattened so as to expose the surface of the first interconnect film 30a (FIG. 31(a)). After that, a W, Mo, NiFe, CoFeNi, or FeAlSi film, for example, is formed as the second interconnect film 30b to be the upper film of the interconnect layer 30. A film stack of CoFeB(1)/CoPt(1) to be the recording layer 22 is then formed. After that, a 1-nm thick MgO layer is formed as the tunnel barrier layer 26, and a film stack of CoPt(10)/CoFeB(1) is formed as the fixed layer 24 (FIG. 31(b)).

Figure 32:
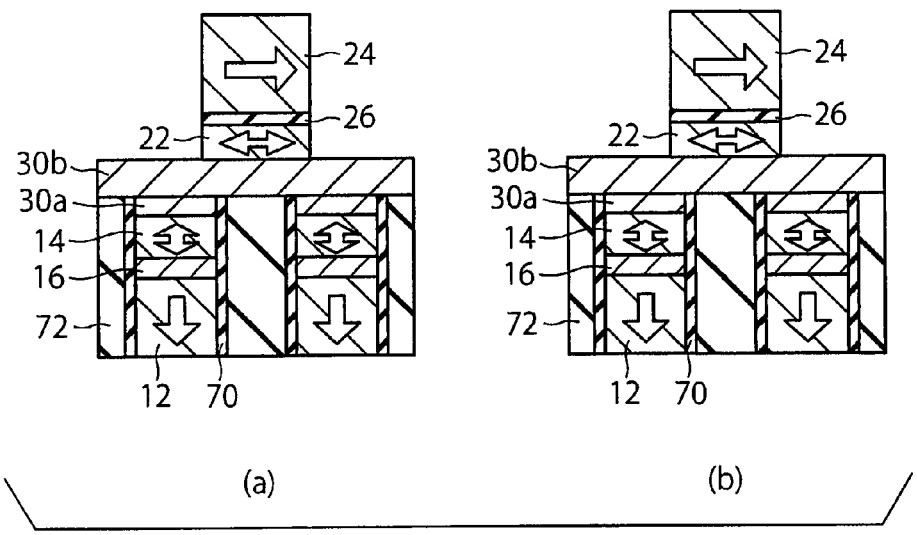
FIGS. 32(a) and 32(b) are cross-sectional views showing a specific example of a method of manufacturing the magnetoresistive device of Example 12.

By using photolithography and Ar ion etching, patterning is then performed on the fixed layer 24, the tunnel barrier layer 26, and the recording layer 22, and the stacked structure formed with the remaining fixed layer 24, the remaining tunnel barrier layer 26, and the remaining recording layer 22 is positioned between the two GMR devices (FIG. 32(*a*)). A heat treatment is then performed, to pin the magnetization of the fixed layer 24 of the TMR device (FIG. 32(*b*)).

Figure 33:
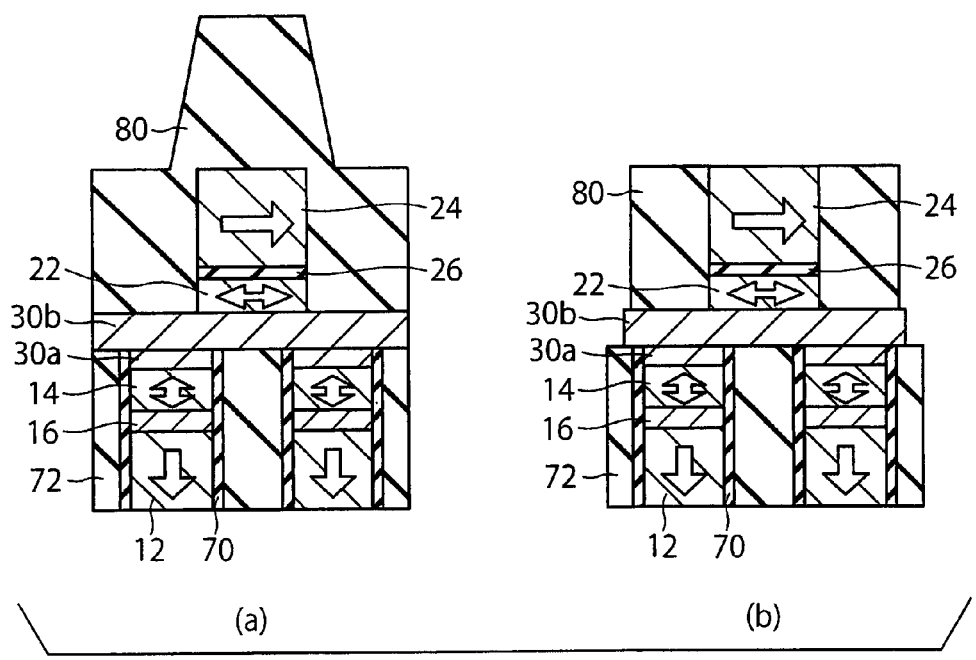
FIGS. 33(a) and 33(b) are cross-sectional views showing a specific example of a method of manufacturing the magnetoresistive device of Example 12.

A 50-nm thick SiO$_2$ film 80 is then deposited (FIG. 33(*a*)). After that, flattening is performed on the SiO$_2$ film 80 by a CMP process. By using photolithography, RIE (Reactive Ion Etching) with a fluorine gas, and Ar ion etching, patterning is performed on the SiO$_2$ film 80 and the second interconnect film 30*b*, to complete the magnetoresistive device (FIG. 33(*b*)).

Figure 26:
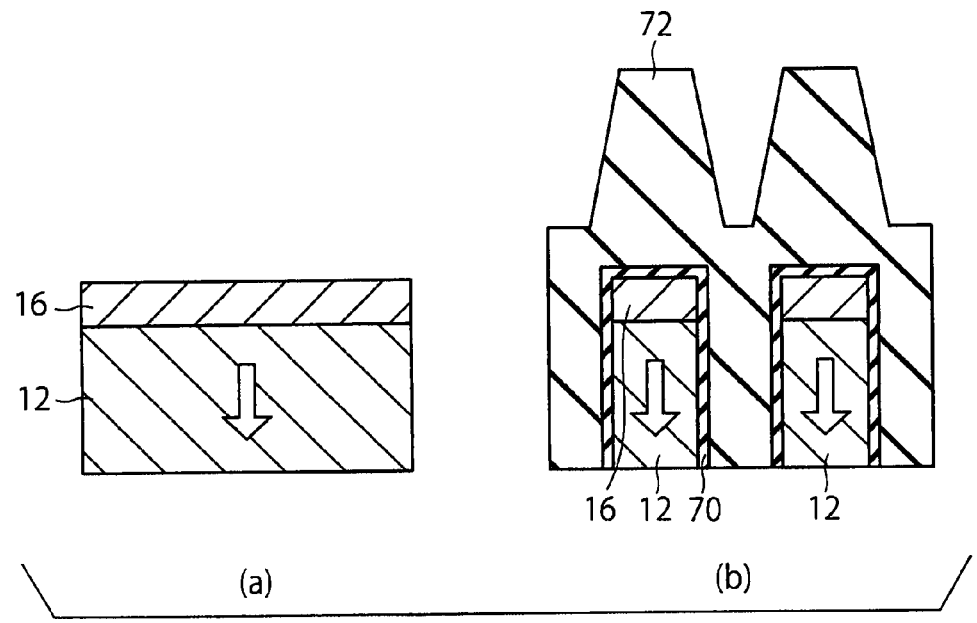
FIGS. 26(a) and 26(b) are cross-sectional views showing a specific example of a method of manufacturing the magnetoresistive device of Example 5.
Figure 27:
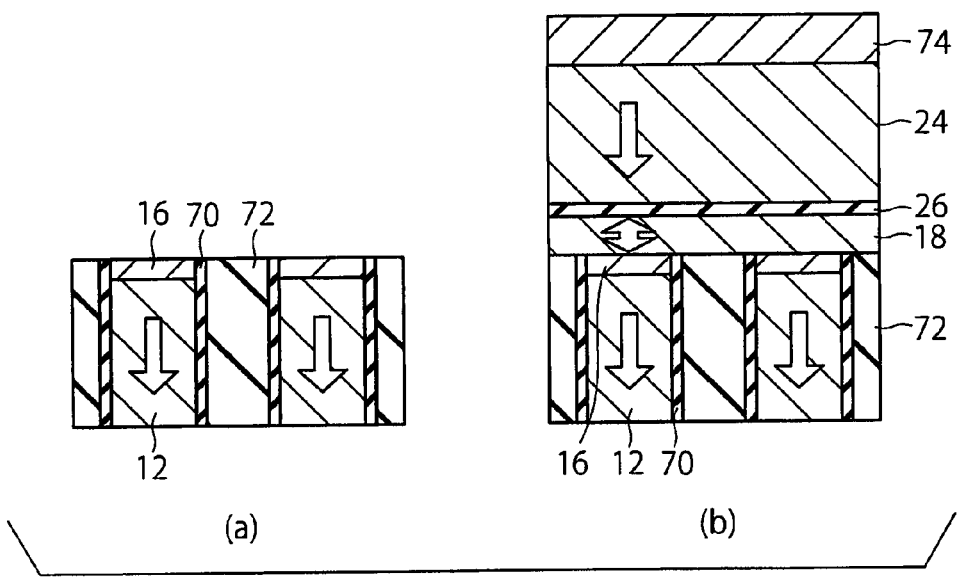
FIGS. 27(a) and 27(b) are cross-sectional views showing a specific example of a method of manufacturing the magnetoresistive device of Example 5.
Figure 28:
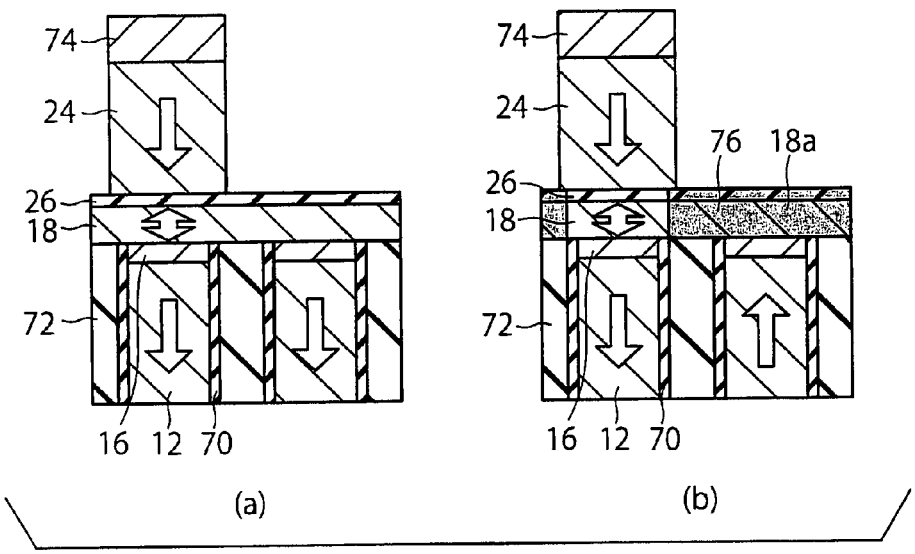
FIGS. 28(a) and 28(b) are cross-sectional views showing a specific example of a method of manufacturing the magnetoresistive device of Example 5.
Figure 29:
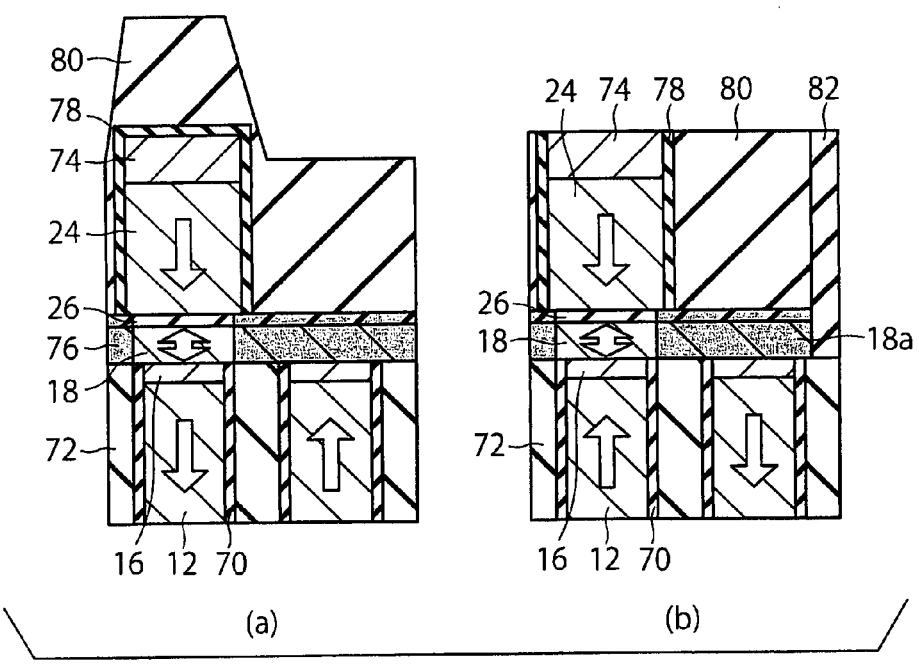
FIGS. 29(a) and 29(b) are cross-sectional views showing a specific example of a method of manufacturing the magnetoresistive device of Example 5.
Figure 30:
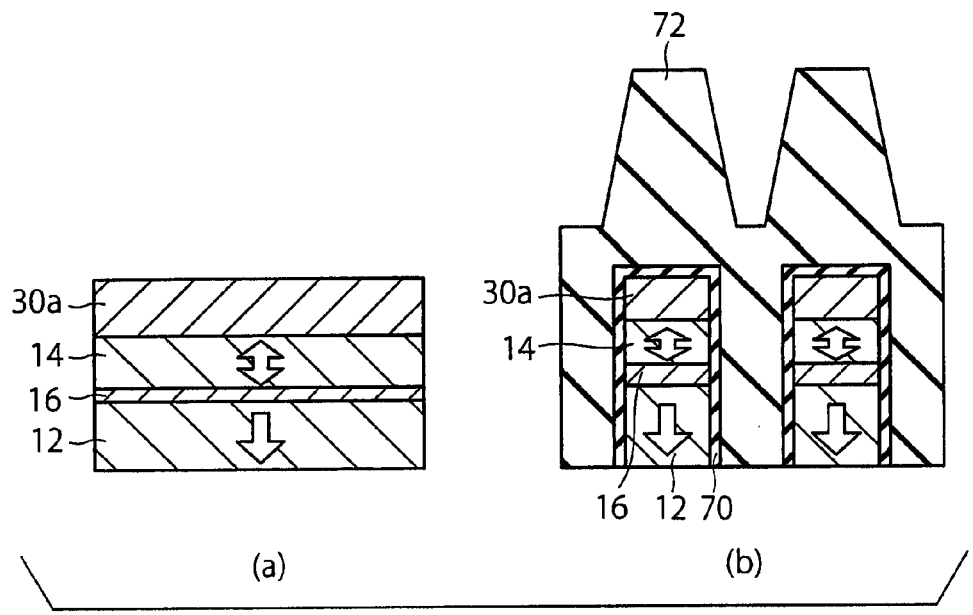
FIGS. 30(a) and 30(b) are cross-sectional views showing a specific example of a method of manufacturing the magnetoresistive device of Example 12.
Figure 31:
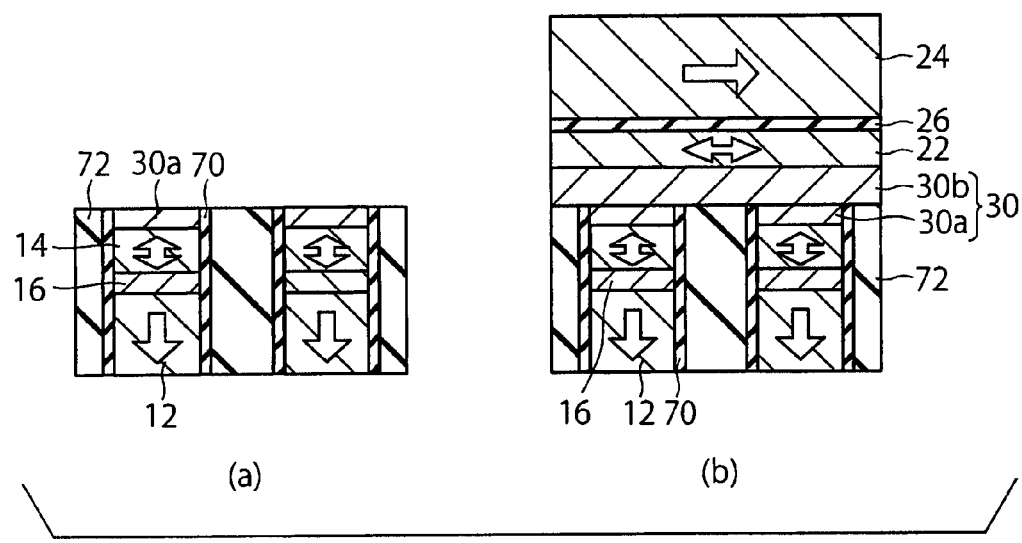
FIGS. 31(a) and 31(b) are cross-sectional views showing a specific example of a method of manufacturing the magnetoresistive device of Example 12.

This manufacturing method is similar to the manufacturing method illustrated in FIGS. 26(*a*) through 29(*b*). However, the interconnect layer 30 is formed through the two stages of forming the first interconnect film 30*a* and the second interconnect film 30*b*. Therefore, the film thickness $t_1$ of the interconnect 30 (the first interconnect film 30*a* and the second interconnect film 30*b*) formed on the GMR device and the film thickness $t_2$ of the interconnect layer 30*b* located between the two GMR devices satisfies the relationship, $t_1 > t_2$.

Figure 7:
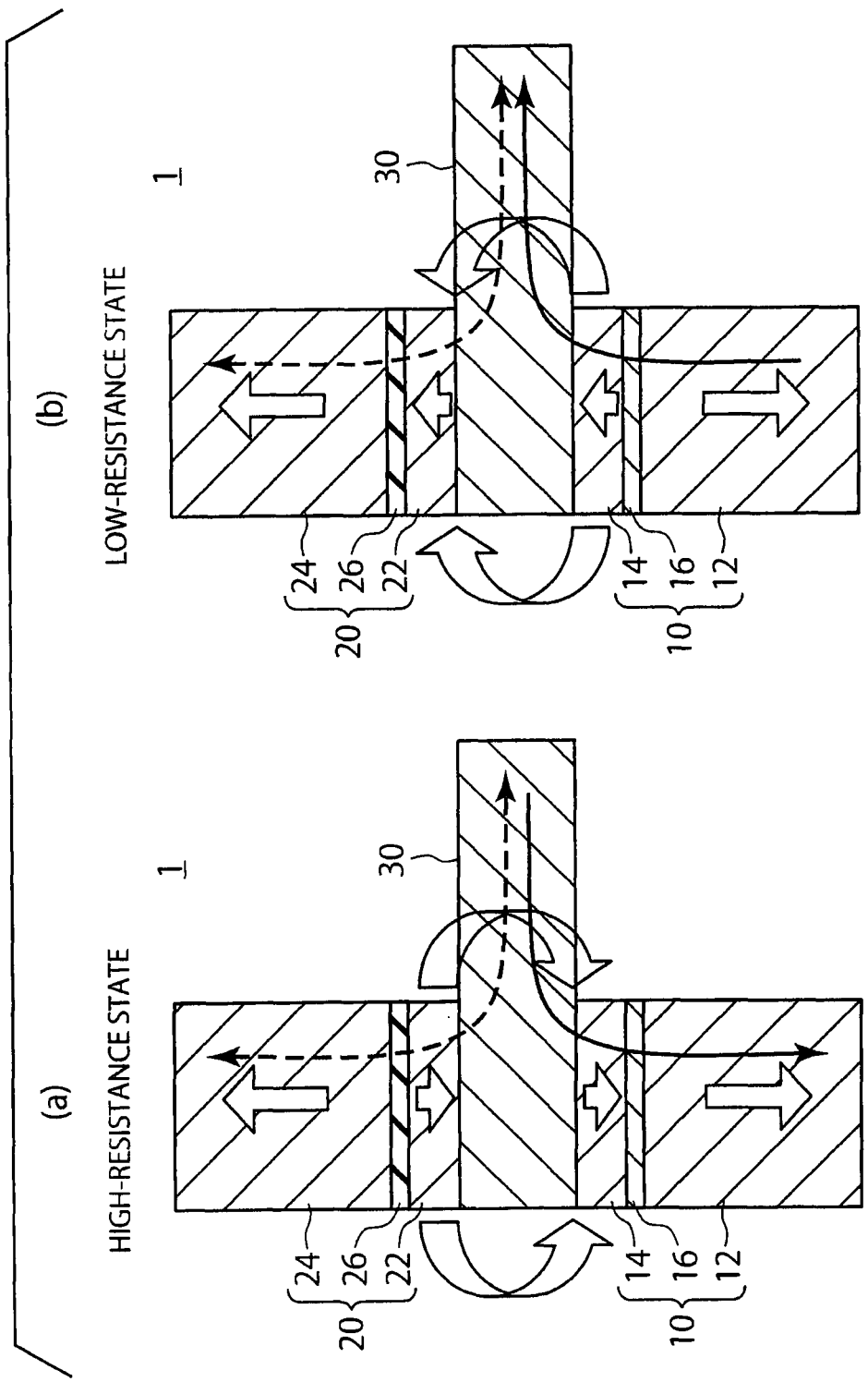
FIGS. 7($a$) and 7($b$) are diagrams showing a high-resistance state and a low-resistance state of a magnetoresistive device of Example 1.
Figure 34:
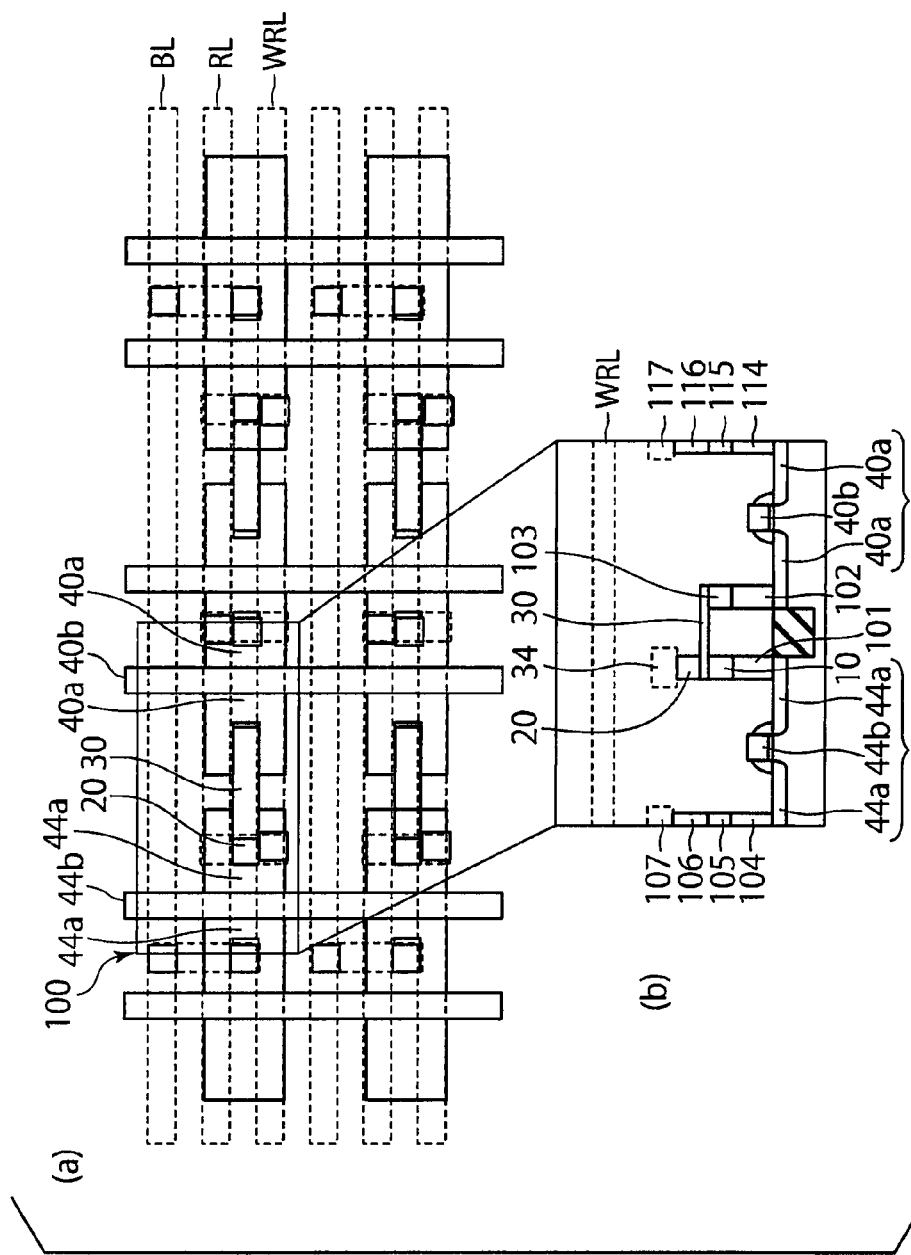
FIGS. 34(a) and 34(b) are a diagram and a cross-sectional view showing the layout of a nonvolatile memory in a case where the magnetoresistive device of Example 1 is used as the storage device of each memory cell.

FIG. 34(*a*) shows the layout of a nonvolatile memory in which the magnetoresistive device of Example 1 illustrated in FIG. 7 is used as the storage device of each memory cell. FIG. 34(*b*) is a cross-sectional view of one memory cell in the nonvolatile memory. This memory cell 100 includes the first and second select transistors 40 and 44, and those select transistors 40 and 44 are formed on a semiconductor substrate. One of the source/drain regions 44*a* of the select transistor 44 is connected to the interconnect layer 30 via a contact 101 and the GMR device 10, and the TMR device 20 is provided on the interconnect layer 30. The interconnect layer 34 is connected to the TMR device 20. One of the source/drain regions 40*a* of the select transistor 40 is connected to the interconnect layer 30 via contacts 103 and 102. Reference numerals 40*b* and 44*b* denote the gate electrodes of the select transistors 40 and 44, respectively. The other one of the source/drain regions 44*a* of the select transistor 44 is connected to an interconnect 107 via a contact 104 and vias 105 and 106. The other one of the source/drain regions 40*a* of the select transistor 40 is connected to an interconnect 117 via a contact 114 and vias 115 and 116. It should be noted that the interconnect layer 34 is connected to a read line RL, the interconnect 107 is connected to a bit line BL, and the interconnect 117 is connected to a write line WRL. The gate electrode 44*b* of the select transistor 44 is connected to the word line WL, and the gate electrode 40*b* of the select transistor 40 is connected to a select line SL. The word line WL and the select line SL will be shown later in FIGS. 35(*a*) and 35(*b*).

As can be seen from FIG. 34(*a*), the memory cell 100 having the above described structure is 6 F in depth and 12 F in width, where F represents the minimum interconnect width. Accordingly, the cell area is 72 F$^2$. On the other hand, a typical SRAM has a cell area of 130 to 140 F$^2$, since six select transistors are used in a typical SRAM. That is, the cell area of the memory cell 100 shown in FIG. 34(*a*) is half the cell area of a SRAM using six select transistors, and a MRAM having the same high-speed performance as that of a SRAM having a large capacity and a low power consumption can be manufactured. In FIG. 34(*a*), the gate width W relative to the gate length L of each select transistor is 3 (=W/L). Accordingly, the current that can flow in the select transistors increases. As a result, the write current can be increased, and high-speed operations can be performed. If W/L is 3 or greater, the current that can flow in the select transistors can be increased, and a MRAM having the same high-speed performance as that of a SRAM can be manufactured. Although the case of Example 1 is described above, the cell area can be made smaller in the same manner as above in each of Examples 2 through 11.

Figure 35:
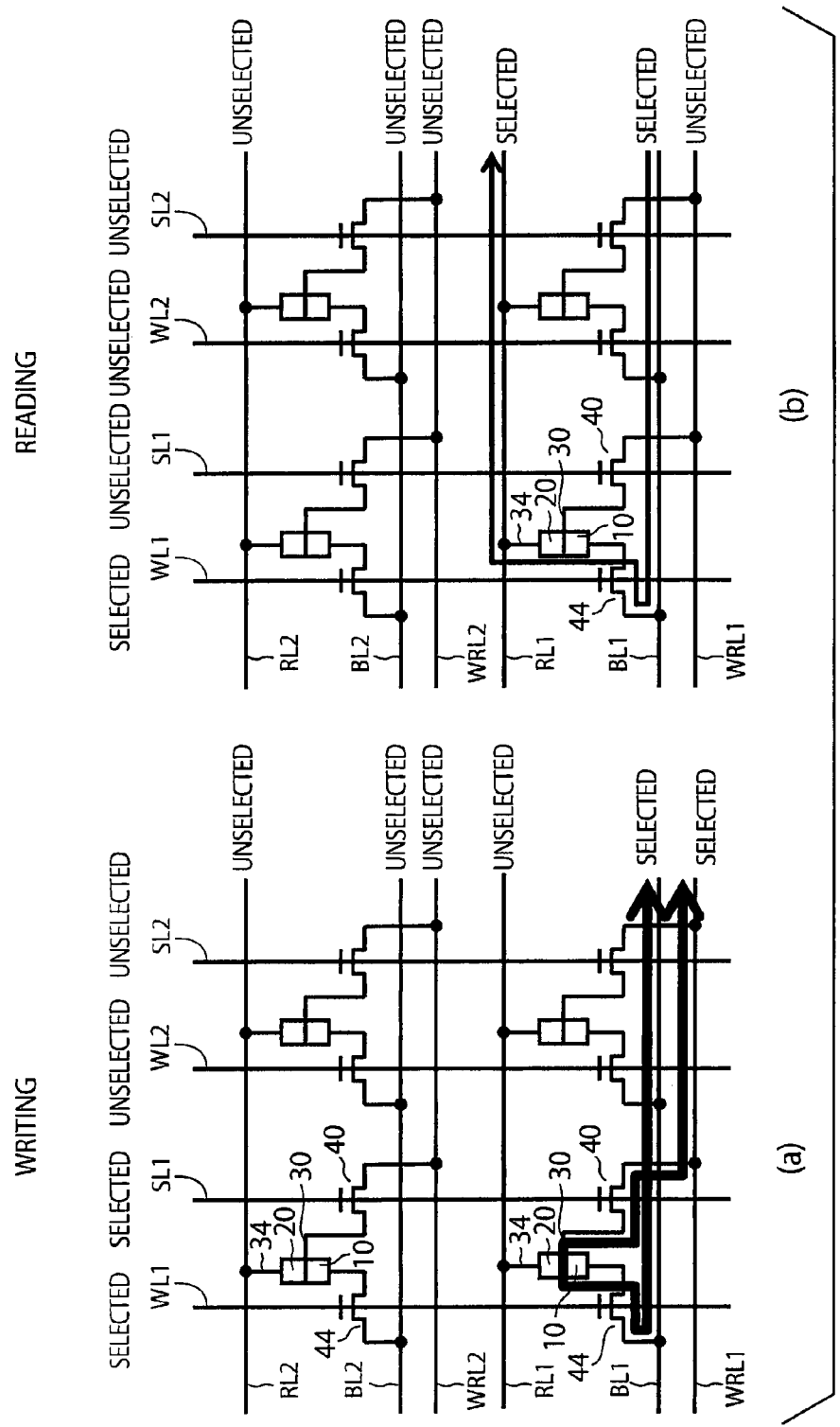
FIGS. 35(a) and 35(b) are diagrams for explaining a writing operation and a reading operation of the magnetoresistive device shown in FIG. 34(a)

Referring now to FIGS. 35(*a*) and 35(*b*), a writing operation and a reading operation of the nonvolatile memory illustrated in FIGS. 34(*a*) and 34(*b*) are described.

As shown in FIG. 35(*a*), in a writing operation, the word line WL1 and the select line SL1 corresponding to the memory cell on which writing is to be performed are activated, so that the select transistors 40 and 44 are put into an ON state. At this point, the other word line WL2 and the other select line SL2 are in an unselected state. After that, a read line RL1 is put into an unselected state (an inactivated state), and writing is performed by applying the write current between a write line WRL1 and a bit line BL1, as indicated by the arrows in FIG. 35(*a*). At this point, the read line RL2, the write line WRL2, and the bit line BL2 that correspond to the other memory cells are in an unselected state.

As shown in FIG. 35(*b*), in a reading operation, the word line WL1 corresponding to the memory cell from which reading is to be performed is activated, so that the select transistor 44 is put into an ON state. At the same time, the select line SL1 is put into an unselected state, so that the select transistor 40 is put into an OFF state. At this point, the other word line WL2 and the other select line SL2 are in an unselected state. After that, reading is performed by flowing current between the read line RL1 and the bit line BL1, as indicated by the arrow in FIG. 35(*b*).

Figure 36:
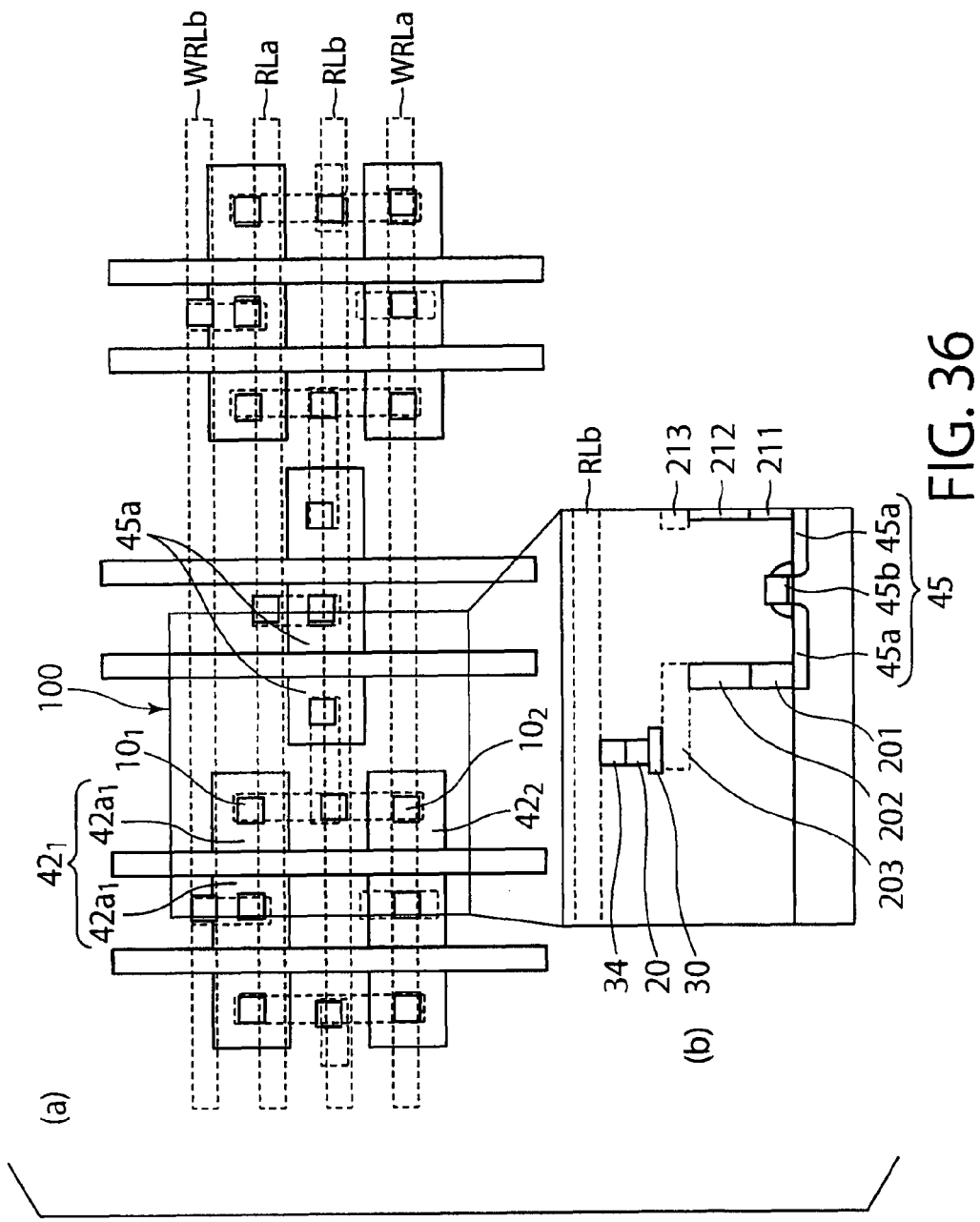
FIGS. 36(a) and 36(b) are a diagram and a cross-sectional view showing the layout of a nonvolatile memory in a case where the magnetoresistive device of Example 15 is used as the storage device of each memory cell.

FIG. 36(*a*) shows the layout of a nonvolatile memory in which the magnetoresistive device of Example 15 illustrated in FIG. 22 is used as the storage device of each memory cell. FIG. 36(*b*) is a cross-sectional view of one memory cell in the nonvolatile memory. This memory cell 100 includes the first and second select transistors $42_1$ and $42_2$ and a third select transistor 45. Those select transistors $42_1$, $42_2$, and 45 are formed on a semiconductor substrate. One of the source/drain regions 45*a* of the select transistor 45 is connected to the interconnect layer 30 via contacts 201 and 202 and an extension interconnect 203, and the TMR device 20 is provided on the interconnect layer 30. The interconnect layer 34 is connected to the TMR device 20. The interconnect layer 34 is also connected to a read line RLb. The other one of the source/drain regions 45*a* of the select transistor 45 is connected to an interconnect 213 via contacts 211 and 212, and the interconnect 213 is connected to a read line RLa (see FIGS. 37(*a*) and 37(*b*) described later).

One of the source/drain regions $42a_1$ of the select transistor $42_1$ is connected to the fixed layer of the GMR device $10_1$ via a contact (not shown), and the free layer of the GMR device $10_1$ is connected to the interconnect layer 30. The other one of the source/drain regions $42a_1$ of the select transistor $42_1$ is connected to a write line WRLb via a contact (not shown).

One of the source/drain regions $42a_2$ of the select transistor $42_2$ is connected to the fixed layer of the GMR device $10_2$ via a contact (not shown), and the free layer of the GMR device $10_2$ is connected to the interconnect layer 30. The other one of the source/drain regions $42a_2$ of the select transistor $42_2$ is connected to a write line WRLa via a contact (not shown).

Figure 37:
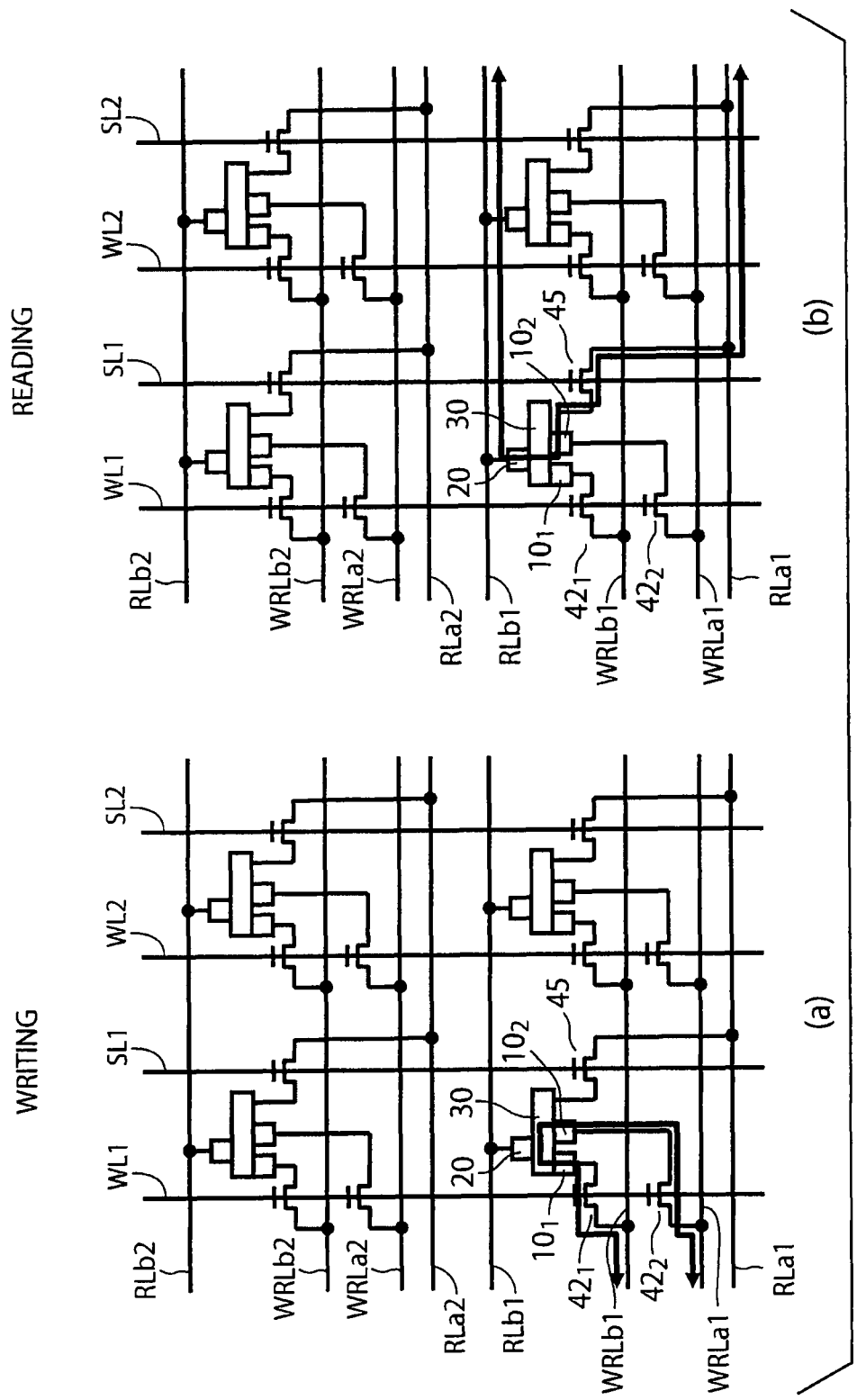
FIGS. 37(a) and 37(b) are diagrams for explaining a writing operation and a reading operation of the magnetoresistive device shown in FIG. 34(a)

The gate electrodes of the select transistors $42_1$ and $42_2$ are connected to a word line WL, and the gate electrode of the select transistor 45 is connected to a select line SL (see FIGS. 37(*a*) and 37(*b*) described later).

The cell area of the memory cell 100 that has the above described structure and is shown in FIG. 36(a) is larger than the area of the memory cell shown in FIG. 34(a). However, the memory cell 100 shown in FIG. 36(a) has the advantage that disturbances caused by the read current in the free layer can be restrained.

Referring now to FIGS. 37(a) and 37(b), a writing operation and a reading operation of the nonvolatile memory illustrated in FIGS. 36(a) and 36(b) are described.

As shown in FIG. 37(a), in a writing operation, the word line WL1 corresponding to the memory cell on which writing is to be performed is activated, so that the select transistors $42_1$ and $42_2$ are put into an ON state. At this point, the select line SL1 corresponding to the above memory cell, and another word line WL2 and another select line SL2 are in an unselected state. After that, read lines RLa1 and RLb1 are put into an unselected state (an inactivated state), and writing is performed by applying the write current between write lines WRLa1 and WRLb1, as indicated by the arrows in FIG. 37(a).

As shown in FIG. 37(b), in a reading operation, the select line SL1 corresponding to the memory cell from which reading is to be performed is activated, so that the select transistor 45 is put into an ON state. At the same time, the word line WL1 is put into an unselected state, so that the select transistors $42_1$ and $42_2$ are put into an OFF state. At this point, the other word line WL2 and the other select line SL2 are in an unselected state. After that, reading is performed by flowing current between the read lines RLa1 and RLb1, as indicated by the arrow in FIG. 37(b).

Figure 38:
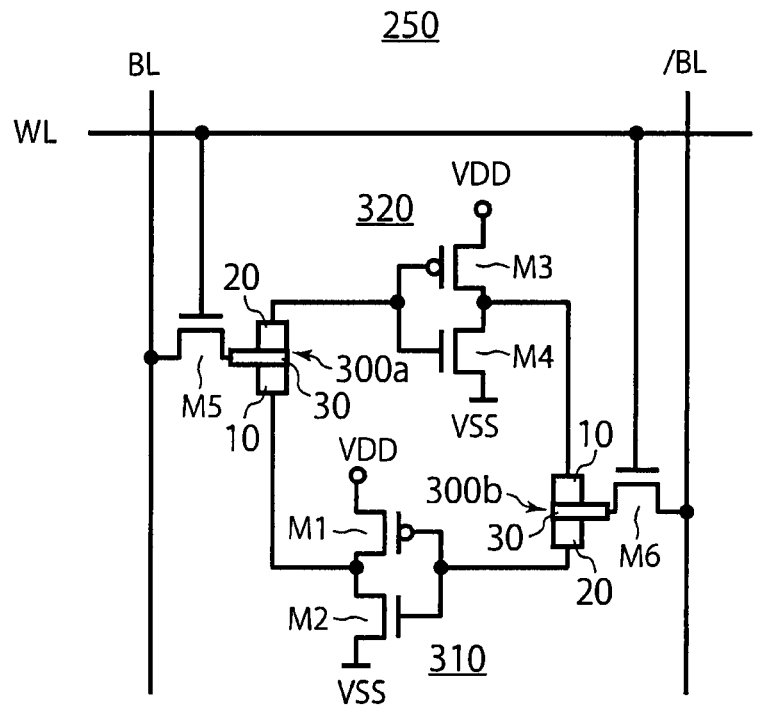
FIG. 38 is a circuit diagram showing a cell structure in a nonvolatile memory using magnetoresistive devices each having a three-terminal structure.

FIG. 38 shows a specific example of a nonvolatile SRAM cell formed by using two magnetoresistive devices each having a three-terminal structure as in Examples 1 through 11 and six transistors. The nonvolatile memory of this specific example includes at least one memory cell 250. This memory cell 250 includes magnetoresistive devices 300a and 300b, p-channel MOS transistors M1 and M3, and n-channel MOS transistors M2, M4, M5, and M6. The magnetoresistive devices 300a and 300b are magnetoresistive devices each having a three-terminal structure as in any of Examples 1 through 14.

The transistors M1 and M2 form a CMOS inverter 310, and the transistors M3 and M4 form a CMOS inverter 320. The sources of the transistors M1 and M3 are connected to a source voltage VDD, and the sources of the transistors M2 and M4 are connected to a ground source VSS. The CMOS inverter 310 has an input terminal connected to a first terminal (a terminal electrically connected to the fixed layer of the TMR device) of the magnetoresistive device 300b, and has an output terminal connected to a second terminal (a terminal electrically connected to the fixed layer of the GMR device) of the magnetoresistive device 300a. The CMOS inverter 320 has an input terminal connected to a first terminal (a terminal electrically connected to the fixed layer of the TMR device) of the magnetoresistive device 300a, and has an output terminal connected to a second terminal (a terminal electrically connected to the fixed layer of the GMR device) of the magnetoresistive device 300b. That is, the CMOS inverters 310 and 320 are cross-coupled via the magnetoresistive devices 300a and 300b, to form a latch circuit. A third terminal (the interconnect layer 30 provided between the TMR device and the GMR device) of the magnetoresistive device 300a is connected to one of the source/drain regions of the transfer transistor M5, and a third terminal (the interconnect layer 30 provided between the TMR device and the GMR device) of the magnetoresistive device 300b is connected to one of the source/drain regions of the transfer transistor M6. The other one of the source/drain regions of the transfer transistor M5 is connected to a first bit line BL, and the other one of the source/drain regions of the transfer transistor M6 is connected to a second bit line /BL. The gates of the transfer transistors M5 and M6 are connected to a word line WL.

Figure 39:
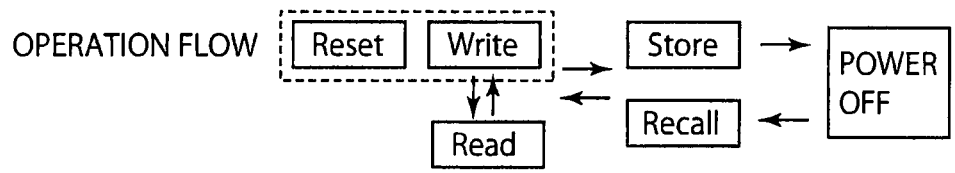
FIG. 39 is a diagram showing operation flows of the nonvolatile memory shown in FIG. 38.
Figure 40:
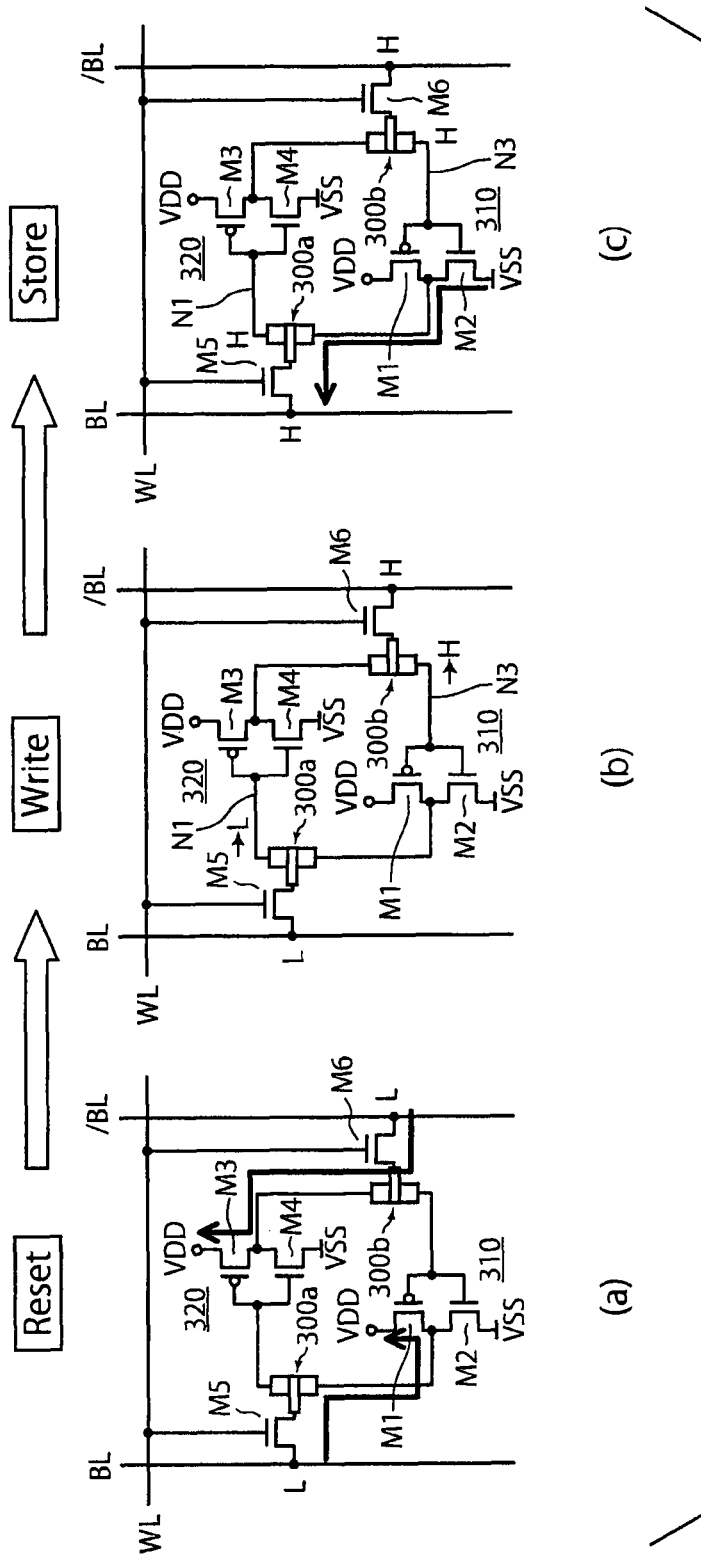
FIGS. 40(a), 40(b), and 40(c) are diagrams for explaining a resetting operation, a writing operation, and a retaining operation.
Figure 41:
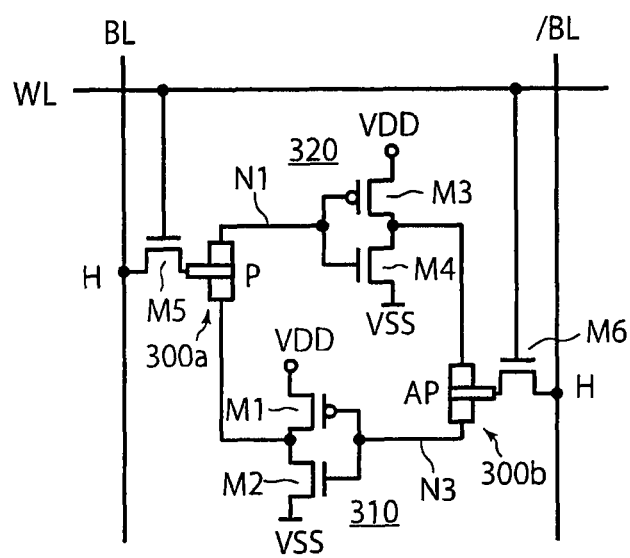
FIG. 41 is a diagram for explaining a recalling operation.

Like a conventional SRAM cell, the memory cell having the above described structure can perform reading and writing operations on the latch circuit. Further, the data stored in the latch circuit is written into the magnetoresistive devices having three-terminal structures, so that the data can be stored as nonvolatile data. Referring now to FIGS. 39 through 41, operations of the memory cell are described. FIG. 39 is a diagram showing operation flows of this memory cell. Operations of the memory cell 250 include a resetting operation, a writing operation, a retaining operation, a recalling operation, and a reading operation. FIGS. 40(a), 40(b), and 40(c) are circuit diagrams for explaining the resetting operation, the writing operation, and the retaining operation. FIG. 41 is a circuit diagram for explaining the recalling operation.

The resetting operation is an operation to make the magnetization directions of the free layer and the fixed layer of the GMR device in each of the two magnetoresistive devices 300a and 300b antiparallel to each other, and is performed prior to the writing operation. As shown in FIG. 40(a), in the resetting operation, the word line WL is activated, so that the transfer transistors M5 and M6 are put into an ON state. After that, current is flowed to the bit lines BL and /BL from the source voltage VDD via the transfer transistors M5 and M6, to perform the resetting operation. At this point, the bit lines BL and /BL are at "L" level. The arrows shown in FIG. 40(a) indicate the flows of electrons.

The writing operation is the same as the writing operation of a conventional SRAM cell, and is an operation to write data into the latch circuit formed with the CMOS inverters 310 and 320 and the magnetoresistive devices 300a and 300b. As shown in FIG. 40(b), in the writing operation, the word line WL is activated, so that the transfer transistors M5 and M6 are put into an ON state. After that, one of the bit lines BL and /BL, or the bit line BL, for example, is set to a low potential, and the other bit line /BL is set to a high potential, to perform the writing operation. As a result, the potential of a cross-coupled node N1 is set at the "L" level, and the potential of a cross-coupled node N3 is set at "H" level, as shown in FIG. 40(b).

The retaining operation is an operation to be performed to store data as nonvolatile data after the data is written. As shown in FIG. 40(c), the retaining operation is performed by setting the bit lines BL and /BL at the "H" level at the same time. As this operation is performed, current is flowed to the magnetoresistive device put to a low potential in the writing operation. Accordingly, the magnetization directions of the free layer and fixed layer of the GMR device of the magnetoresistive device 300a become parallel to each other. The arrow shown in FIG. 40(c) indicates the flow of electrons. According to this operating method, there is no need to carry out the step of reading the data from the latch circuit prior to writing the data into a magnetoresistive device. Accordingly, the speed of the retaining operation can be made higher.

The recalling operation is an operation to be performed to switch on the power of the memory cell again after the power of the memory cell is switched off, and return nonvolatile data recorded in a magnetoresistive device into the latch circuit. After the recalling operation is performed, data stored in the latch circuit can be read out as in a reading operation of a conventional SRAM. In the recalling operation, the cell power supply is switched on, as shown in FIG. 41. Before the power supply is switched on, the magnetization directions of the free layer and fixed layer of the GMR device are in a parallel state in the magnetoresistive device 300a, and the magnetization directions of the free layer and fixed layer of the GMR device are in an antiparallel state in the magnetoresistive device 300b. When the cell power supply is switched on, charging the latch circuit is started, and the difference in resistance value between the magnetoresistive devices 300a and 300b becomes a delay difference as it is, and appears as the potential difference between the cross-coupled nodes N1 and N3. The reading operation is performed by activating the word line WL to put the transfer transistors M5 and M6 into an ON state, and reading the potential difference appearing between the bit lines BL and /BL with the use of a sense amplifier (not shown).

Figure 42:
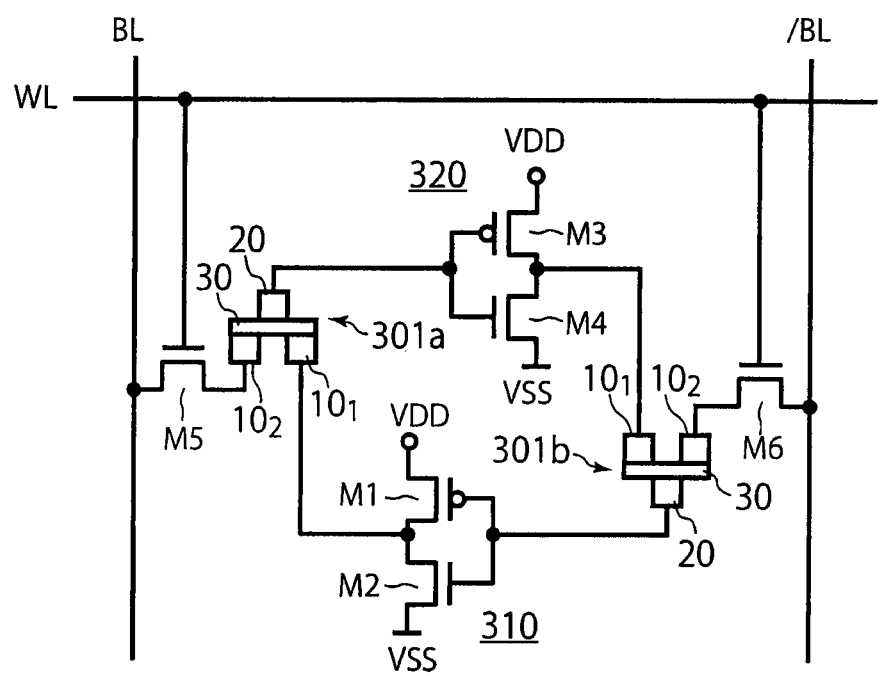
FIG. 42 is a circuit diagram showing another cell structure in a nonvolatile memory using magnetoresistive devices each having a three-terminal structure.

In the nonvolatile SRAM memory cell using two magnetoresistive devices each having a three-terminal structure, the resetting and retaining operations are characteristically performed on the GMR device of each of the magnetoresistive devices, and the recalling operation is characteristically performed by using the difference in resistance value between the TMR devices of the respective magnetoresistive devices. Therefore, a nonvolatile SRAM according to another embodiment illustrated in FIG. 42 can be formed. The nonvolatile SRAM illustrated in FIG. 42 is the same as the SRAM illustrated in FIG. 38, except that the magnetoresistive devices 300a and 300b are replaced with magnetoresistive devices 301a and 301b. The magnetoresistive devices 301a and 301b can be any of the magnetoresistive devices of Example 12 through 14, for example. The output terminal of the inverter 310 is connected to the GMR device $10_1$ of the magnetoresistive device 301a, one of the source/drain regions of the transfer transistor M5 is connected to the GMR device $10_2$ of the magnetoresistive device 301a, and the input terminal of the inverter 320 is connected to the TMR device 20 of the magnetoresistive device 301a. Also, the input terminal of the inverter 310 is connected to the TMR device 20 of the magnetoresistive device 301b, one of the source/drain regions of the transfer transistor M6 is connected to the GMR device $10_2$ of the magnetoresistive device 301b, and the output terminal of the inverter 320 is connected to the GMR device $10_1$ of the magnetoresistive device 301b. That is, the GMR devices of each magnetoresistive device having a three-terminal structure are connected in series to the current path extending from a transfer transistor in resetting and retaining operations to the NMOS transistor of a CMOS inverter, and the TMR devices are connected in series to the current path between the output terminal of an CMOS inverter and the input terminal of the other CMOS inverter in a recalling operation.

The memory cell illustrated in FIG. 42 has a structure in which magnetoresistive devices are connected in series in a data storing node of a conventional SRAM cell. However, the TMR devices having relatively high resistance values are not connected between the transfer transistors and the NMOS transistors of the CMOS inverters. Therefore, the static noise margin is not significantly degraded.

The memories illustrated in FIGS. 38 and 42 can perform the same high-speed operations as those of conventional SRAMs, and can improve the reading and writing speeds accordingly.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetoresistive device comprising:
an interconnect layer having a first face and a second face opposed to the first face;
first and second devices each including a first magnetic layer having a magnetization that can be changed by spin transfer torque writing and is perpendicular to a film plane, a second magnetic layer having a fixed magnetization perpendicular to a film plane, and a nonmagnetic layer interposed between the first magnetic layer and the second magnetic layer, the first and second devices being disposed in parallel on the first face of the interconnect layer, and a face of the first magnetic layer of each of the first and second devices remoter from the nonmagnetic layer facing the first face of the interconnect layer; and
a tunneling magneto resistive (TMR) device including a third magnetic layer having perpendicular magnetic anisotropy and having a changeable magnetization, a fourth magnetic layer having a fixed magnetization parallel to a film plane, and a tunnel barrier layer interposed between the third magnetic layer and the fourth magnetic layer, the TMR device being disposed on the second face of the interconnect layer, a face of the third magnetic layer remoter from the tunnel barrier layer facing the second face of the interconnect layer, and the third magnetic layer being magnetostatically coupled to the first magnetic layers of the first and second devices,
wherein at least one of the following conditions (a), (b) or (c) is satisfied:
(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located;
(b) first and second select transistors are electrically connected to the second magnetic layers of the first and second devices, respectively; or
(c) a third select transistor is electrically connected to the terminal for reading.

2. The device according to claim 1, wherein the magnetization of the third magnetic layer is tilted with respect to the magnetization of the fourth magnetic layer.

3. The device according to claim 1, wherein
the interconnect layer has a stacked structure including a nonmagnetic film and a magnetic film,
the nonmagnetic film of the interconnect layer is connected to the first magnetic layers of the first and second devices,
the magnetic film of the interconnect layer is connected to the third magnetic layer of the TMR device, and
the magnetic film has a relative permeability of 10 to 1000.

4. The device according to claim 1, wherein
(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located.

5. The device according to claim 1, wherein a terminal for reading is electrically connected to the interconnect layer.

6. The device according to claim 1, wherein
(b) first and second select transistors are electrically connected to the second magnetic layers of the first and second devices, respectively.

7. The device according to claim 5, wherein
(c) a third select transistor is electrically connected to the terminal for reading.

8. The device according to claim 1, wherein the first and second devices are giant magneto resistive (GMR) devices, or the first and second devices are TMR devices.

9. A magnetoresistive device comprising:
an interconnect layer having a first face and a second face opposed to the first face;
first and second devices each including a first magnetic layer having a magnetization that can be changed by spin transfer torque writing and is perpendicular to a film plane, a second magnetic layer having a fixed magnetization perpendicular to a film plane, and a nonmagnetic layer interposed between the first magnetic layer and the second magnetic layer, the first and second devices being disposed in parallel on the first face of the interconnect layer, and a face of the first magnetic layer of each of the first and second devices remoter from the nonmagnetic layer facing the first face of the interconnect layer; and
a tunneling magneto resistive (TMR) device including a third magnetic layer having a changeable magnetization, a fourth magnetic layer having a fixed magnetization parallel to a film plane, and a tunnel barrier layer interposed between the third magnetic layer and the fourth magnetic layer, an easy axis of the magnetization of the third magnetic layer being perpendicular to the magnetization of the fourth magnetic layer, the TMR device being disposed on the second face of the interconnect layer, a face of the third magnetic layer remoter from the tunnel barrier layer facing the second face of the interconnect layer, and the third magnetic layer being magnetostatically coupled to the first magnetic layers of the first and second devices,
wherein at least one of the following conditions (a), (b) or (c) is satisfied:
(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located;
(b) first and second select transistors are electrically connected to the second magnetic layers of the first and second devices, respectively; or
(c) a third select transistor is electrically connected to the terminal for reading.

10. The device according to claim 9, wherein the magnetization of the third magnetic layer is parallel to a film plane, and is tilted with respect to the magnetization of the fourth magnetic layer.

11. The device according to claim 9, wherein
the interconnect layer has a stacked structure including a nonmagnetic film and a magnetic film,
the nonmagnetic film of the interconnect layer is connected to the first magnetic layers of the first and second devices,
the magnetic film of the interconnect layer is connected to the third magnetic layer of the TMR device, and
the magnetic film has a relative permeability of 10 to 1000.

12. The device according to claim 9, wherein
(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located.

13. The device according to claim 9, wherein a terminal for reading is electrically connected to the interconnect layer.

14. The device according to claim 9, wherein
(b) first and second select transistors are electrically connected to the second magnetic layers of the first and second devices, respectively.

15. The device according to claim 13, wherein
(c) a third select transistor is electrically connected to the terminal for reading.

16. The device according to claim 9, wherein the first and second devices are giant magneto resistive (GMR) devices, or the first and second devices are TMR devices.

17. A magnetic memory comprising
a memory cell including a magnetoresistive device as a storage device, the magnetoresistive device comprising:
an interconnect layer having a first face and a second face opposed to the first face;
first and second devices each including a first magnetic layer having a magnetization that can be changed by spin transfer torque writing and is perpendicular to a film plane, a second magnetic layer having a fixed magnetization perpendicular to a film plane, and a nonmagnetic layer interposed between the first magnetic layer and the second magnetic layer, the first and second devices being disposed in parallel on the first face of the interconnect layer, and a face of the first magnetic layer of each of the first and second devices remoter from the nonmagnetic layer facing the first face of the interconnect layer; and
a tunneling magneto resistive (TMR) device including a third magnetic layer having perpendicular magnetic anisotropy and having a changeable magnetization, a fourth magnetic layer having a fixed magnetization parallel to a film plane, and a tunnel barrier layer interposed between the third magnetic layer and the fourth magnetic layer, the TMR device being disposed on the second face of the interconnect layer, a face of the third magnetic layer remoter from the tunnel barrier layer facing the second face of the interconnect layer, and the third magnetic layer being magnetostatically coupled to the first magnetic layers of the first and second devices,
wherein at least one of the following conditions (a), (b) or (c) is satisfied:
(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located;
(b) first and second select transistors are electrically connected to the second magnetic layers of the first and second devices, respectively; or
(c) a third select transistor is electrically connected to the terminal for reading.

18. A magnetic memory comprising
a memory cell including a magnetoresistive device as a storage device, the magnetoresistive device comprising:

an interconnect layer having a first face and a second face opposed to the first face;

first and second devices each including a first magnetic layer having a magnetization that can be changed by spin transfer torque writing and is perpendicular to a film plane, a second magnetic layer having a fixed magnetization perpendicular to a film plane, and a nonmagnetic layer interposed between the first magnetic layer and the second magnetic layer, the first and second devices being disposed in parallel on the first face of the interconnect layer, and a face of the first magnetic layer of each of the first and second devices remoter from the nonmagnetic layer facing the first face of the interconnect layer; and a tunneling magneto resistive (TMR) device including a third magnetic layer having a changeable magnetization, a fourth magnetic layer having a fixed magnetization parallel to a film plane, and a tunnel barrier layer interposed between the third magnetic layer and the fourth magnetic layer, an easy axis of the magnetization of the third magnetic layer being perpendicular to the magnetization of the fourth magnetic layer, the TMR device being disposed on the second face of the interconnect layer, a face of the third magnetic layer remoter from the tunnel barrier layer facing the second face of the interconnect layer, and the third magnetic layer being magnetostatically coupled to the first magnetic layers of the first and second devices, wherein at least one of the following conditions (a), (b) or (c) is satisfied:

(a) the interconnect layer is a nonmagnetic layer,
the TMR device is positioned between the first device and the second device, and
a film thickness of the interconnect layer in a region where the first and second devices are located is greater than a film thickness of the interconnect layer in a region where the TMR device is located;

(b) first and second select transistors are electrically connected to the second magnetic layers of the first and second devices, respectively; or (c) a third select transistor is electrically connected to the terminal for reading.

19. A magnetic memory comprising:

a first magnetoresistive device including:

a first interconnect layer having a first face and a second face opposed to the first face;

first and second devices each including a first magnetic layer having a magnetization that can be changed by spin transfer torque writing and is perpendicular to a film plane, a second magnetic layer having a fixed magnetization perpendicular to a film plane, and a first nonmagnetic layer interposed between the first magnetic layer and the second magnetic layer, the first and second devices being disposed in parallel on the first face of the first interconnect layer, and a face of the first magnetic layer of each of the first and second devices remoter from the first nonmagnetic layer facing the first face of the first interconnect layer; and a first tunneling magneto resistive (TMR) device including a third magnetic layer having perpendicular magnetic anisotropy and having a changeable magnetization, a fourth magnetic layer having a fixed magnetization parallel to a film plane, and a first tunnel barrier layer interposed between the third magnetic layer and the fourth magnetic layer, the first TMR device being disposed on the second face of the first interconnect layer, a face of the third magnetic layer remoter from the first tunnel barrier layer facing the second face of the first interconnect layer, and the third magnetic layer being magnetostatically coupled to the first magnetic layers of the first and second devices; and a second magnetoresistive device including:

a second interconnect layer having a third face and a fourth face opposed to the third face;

third and fourth devices each including a fifth magnetic layer having a magnetization that can be changed by spin transfer torque writing, a sixth magnetic layer having a fixed magnetization perpendicular to a film plane, and a second nonmagnetic layer interposed between the fifth magnetic layer and the sixth magnetic layer, the third and fourth devices being disposed in parallel on the third face of the second interconnect layer, and a face of the fifth magnetic layer of each of the third and fourth devices remoter from the second nonmagnetic layer facing the third face of the second interconnect layer; and a second TMR device including a seventh magnetic layer having perpendicular magnetic anisotropy and having a changeable magnetization, an eighth magnetic layer having a fixed magnetization parallel to a film plane, and a second tunnel barrier layer interposed between the seventh magnetic layer and the eighth magnetic layer, the second TMR device being disposed on the fourth face of the second interconnect layer, a face of the seventh magnetic layer remoter from the second tunnel barrier layer facing the fourth face of the second interconnect layer, and the seventh magnetic layer being magnetostatically coupled to the fifth magnetic layers of the third and fourth devices; and first and second inverters; and first and second transfer transistors, an input terminal of the first inverter being electrically connected to the eighth magnetic layer of the second magnetoresistive device, an output terminal of the first inverter being electrically connected to the second magnetic layer of the first device of the first magnetoresistive device, an input terminal of the second inverter being electrically connected to the fourth magnetic layer of the first magnetoresistive device, an output terminal of the second inverter being electrically connected to the sixth magnetic layer of the third device of the second magnetoresistive device, one of source/drain regions of the first transfer transistor being electrically connected to the second magnetic layer of the second device of the first magnetoresistive device, the other one of the source/drain regions being electrically connected to a first bit line, a gate of the first transfer transistor being electrically connected to a word line, one of source/drain regions of the second transfer transistor being electrically connected to the sixth magnetic layer of the fourth device of the second magnetoresistive device, the other one of the source/drain regions being electrically connected to a second bit line, a gate of the second transfer transistor being electrically connected to the word line.

20. A magnetic memory comprising:

a first magnetoresistive device including:

a first interconnect layer having a first face and a second face opposed to the first face;

first and second devices each including a first magnetic layer having a magnetization that can be changed by spin transfer torque writing and is perpendicular to a film plane, a second magnetic layer having a fixed magnetization perpendicular to a film plane, and a first nonmagnetic layer interposed between the first magnetic layer and the second magnetic layer, the first and second devices being disposed in parallel on the first face of the first interconnect layer, and a face of the first magnetic layer of each of the first and second devices remoter from the first nonmagnetic layer facing the first face of the first interconnect layer; and a first tunneling magneto resistive (TMR) device including a third magnetic layer having a changeable magnetization, a fourth magnetic layer having a fixed magnetization parallel to a film plane, and a first tunnel barrier layer interposed between the third magnetic layer and the fourth magnetic layer, an easy axis of the magnetization of the third magnetic layer being perpendicular to the magnetization of the fourth magnetic layer, the first TMR device being disposed on the second face of the first interconnect layer, a face of the third magnetic layer remoter from the first tunnel barrier layer facing the second face of the first interconnect layer, and the third magnetic layer being magnetostatically coupled to the first magnetic layers of the first and second devices; and a second magnetoresistive device including:

a second interconnect layer having a third face and a fourth face opposed to the third face;

third and fourth devices each including a fifth magnetic layer having a magnetization that can be changed by spin transfer torque writing, a sixth magnetic layer having a fixed magnetization perpendicular to a film plane, and a second nonmagnetic layer interposed between the fifth magnetic layer and the sixth magnetic layer, the third and fourth devices being disposed in parallel on the third face of the second interconnect layer, and a face of the fifth magnetic layer of each of the third and fourth devices remoter from the second nonmagnetic layer facing the third face of the second interconnect layer; and a second TMR device including a seventh magnetic layer having a changeable magnetization, an eighth magnetic layer having a fixed magnetization parallel to a film plane, and a second tunnel barrier layer interposed between the seventh magnetic layer and the eighth magnetic layer, an easy axis of the magnetization of the seventh magnetic layer being perpendicular to the magnetization of the eighth magnetic layer, the second TMR device being disposed on the fourth face of the second interconnect layer, a face of the seventh magnetic layer remoter from the second tunnel barrier layer facing the fourth face of the second interconnect layer, and the seventh magnetic layer being magnetostatically coupled to the fifth magnetic layers of the third and fourth devices; and first and second inverters; and first and second transfer transistors, an input terminal of the first inverter being electrically connected to the eighth magnetic layer of the second magnetoresistive device, an output terminal of the first inverter being electrically connected to the second magnetic layer of the first device of the first magnetoresistive device, an input terminal of the second inverter being electrically connected to the fourth magnetic layer of the first magnetoresistive device, an output terminal of the second inverter being electrically connected to the sixth magnetic layer of the third device of the second magnetoresistive device, one of source/drain regions of the first transfer transistor being electrically connected to the second magnetic layer of the second device of the first magnetoresistive device, the other one of the source/drain regions being electrically connected to a first bit line, a gate of the first transfer transistor being electrically connected to a word line, one of source/drain regions of the second transfer transistor being electrically connected to the sixth magnetic layer of the fourth device of the second magnetoresistive device, the other one of the source/drain regions being electrically connected to a second bit line, a gate of the second transfer transistor being electrically connected to the word line.

21. The device according to claim 6, wherein the magnetization of the third magnetic layer is tilted with respect to the magnetization of the fourth magnetic layer.

22. The device according to claim 6, wherein a terminal for reading is electrically connected to the interconnect layer.

* * * * *